United States Patent
Pant et al.

(10) Patent No.: US 11,308,416 B2
(45) Date of Patent: Apr. 19, 2022

(54) ADAPTIVE BASIS SELECTION FOR ENCODED FUSION MEASUREMENTS

(71) Applicant: PsiQuantum, Corp., Palo Alto, CA (US)

(72) Inventors: Mihir Pant, Mountain View, CA (US); Naomi Nickerson, Palo Alto, CA (US); Hector Bombin Palomo, Kyoto (JP)

(73) Assignee: PsiQuantum, Corp., Palo Alto, CA (US)

( * ) Notice: Subject to any disclaimer, the term of this patent is extended or adjusted under 35 U.S.C. 154(b) by 0 days.

(21) Appl. No.: 17/216,450

(22) Filed: Mar. 29, 2021

(65) Prior Publication Data

US 2021/0304053 A1  Sep. 30, 2021

Related U.S. Application Data

(60) Provisional application No. 63/119,395, filed on Nov. 30, 2020, provisional application No. 63/118,319, (Continued)

(51) Int. Cl.
*G06N 10/00* (2019.01)
*G06N 3/08* (2006.01)
(Continued)

(52) U.S. Cl.
CPC ......... *G06N 10/00* (2019.01); *G06F 11/1004* (2013.01); *G06N 3/08* (2013.01);
(Continued)

(58) Field of Classification Search
CPC ........ G06N 10/00; G06N 3/08; H04L 9/0852; H01L 49/006; G06F 17/10
See application file for complete search history.

(56) References Cited

U.S. PATENT DOCUMENTS

| 7,219,017 B2 | 5/2007 | Vitaliano et al. |
| 7,778,951 B2 | 8/2010 | Gilbert et al. |

(Continued)

FOREIGN PATENT DOCUMENTS

| WO | WO-2020056324 A1 * | 3/2020 | ......... G02B 6/12019 |
| WO | WO-2020072819 A1 * | 4/2020 | ............. G06N 10/00 |
| WO | WO-2020257772 A1 * | 12/2020 | ............. H01L 39/22 |

OTHER PUBLICATIONS

Lyshevski et al.; "Estimates and measures of data communication and processing in nanoscaled classical and quantum physical systems"; 14th IEEE International Conference on Nanotechnology; Conference Paper | Publisher: IEEE (Year: 2014).*

(Continued)

*Primary Examiner* — Helen Rossoshek
(74) *Attorney, Agent, or Firm* — Kowert, Hood, Munyon, Rankin & Goetzel, P.C.

(57) ABSTRACT

A quantum computing system and methods for performing fusion based quantum computing on encoded qubits. A fusion controller sequentially performs a series of fusion measurements on respective physical qubits of first and second encoded qubits to obtain a respective series of classical measurement results. For respective fusion measurements of the series of fusion measurements, a basis for performing the respective fusion measurement is selected based on classical measurement results of previous fusion measurements. An encoded fusion measurement result is determined based on the classical measurement results, and the encoded fusion measurement result is stored in a memory medium.

20 Claims, 40 Drawing Sheets

Related U.S. Application Data filed on Nov. 25, 2020, provisional application No. 63/081,691, filed on Sep. 22, 2020, provisional application No. 63/009,920, filed on Apr. 14, 2020, provisional application No. 63/001,745, filed on Mar. 30, 2020.

(51) Int. Cl.
  *G06F 11/10* (2006.01)
  *H01L 49/00* (2006.01)
  *G06F 3/06* (2006.01)

(52) U.S. Cl.
  CPC .......... *G06F 3/0604* (2013.01); *G06F 3/0659* (2013.01); *G06F 3/0679* (2013.01); *H01L 49/006* (2013.01)

(56) References Cited

U.S. PATENT DOCUMENTS

| | | | |
|---|---|---|---|
| 8,209,279 B2* | 6/2012 | Freedman | G06F 17/16 706/62 |
| 9,256,834 B2* | 2/2016 | Bonderson | G06N 10/00 |
| 10,038,554 B2* | 7/2018 | Fu | G06N 10/00 |
| 10,379,420 B1 | 8/2019 | Wang | |
| 10,622,998 B1* | 4/2020 | Najafi-Yazdi | H01L 27/18 |
| 10,637,142 B1* | 4/2020 | Tran | H01Q 19/09 |
| 2003/0169041 A1* | 9/2003 | Coury | B82Y 10/00 324/307 |
| 2008/0035911 A1 | 2/2008 | Gilbert et al. | |
| 2012/0075682 A1 | 3/2012 | Amoroso | |
| 2013/0322873 A1* | 12/2013 | Stevenson | H04B 10/70 398/25 |
| 2014/0221059 A1 | 8/2014 | Freedman et al. | |
| 2015/0154147 A1* | 6/2015 | Alboszta | G06N 10/00 702/179 |
| 2016/0328253 A1* | 11/2016 | Majumdar | G06F 9/45504 |
| 2017/0141287 A1 | 5/2017 | Barkeshli et al. | |
| 2017/0161632 A1* | 6/2017 | Freedman | G06F 17/18 |
| 2017/0293854 A1* | 10/2017 | Freedman | G06N 10/00 |
| 2018/0196916 A1* | 7/2018 | van Rooyen | G16B 30/10 |
| 2019/0007051 A1 | 1/2019 | Sete et al. | |
| 2019/0049495 A1* | 2/2019 | Ofek | G06F 15/16 |
| 2019/0130298 A1* | 5/2019 | Pioro-Ladriere | G06N 10/00 |
| 2019/0197426 A1* | 6/2019 | Kawano | G06N 10/00 |
| 2019/0325336 A1* | 10/2019 | Reilly | G06F 11/1044 |
| 2019/0378025 A1* | 12/2019 | Corcoles-Gonzalez | G06N 10/00 |
| 2020/0118025 A1* | 4/2020 | Romero | G06N 10/00 |
| 2020/0118026 A1* | 4/2020 | Ashrafi | G06N 10/00 |
| 2020/0119748 A1 | 4/2020 | Lucarelli | |
| 2020/0287631 A1* | 9/2020 | Gimeno-Segovia | G06N 10/00 |
| 2020/0334107 A1* | 10/2020 | Katabarwa | H03M 13/47 |
| 2020/0358187 A1* | 11/2020 | Tran | H01Q 1/04 |
| 2020/0364598 A1 | 11/2020 | Ashikhmin | |
| 2020/0401927 A1* | 12/2020 | Nickerson | H03M 13/29 |
| 2020/0412369 A1 | 12/2020 | Jiang et al. | |
| 2021/0011771 A1* | 1/2021 | Bonderson | G06N 5/003 |
| 2021/0027188 A1* | 1/2021 | Nickerson | B82Y 10/00 |
| 2021/0058163 A1 | 2/2021 | Reilly | |
| 2021/0176055 A1 | 6/2021 | Rahman et al. | |
| 2021/0304052 A1* | 9/2021 | Pant | G06F 11/1004 |

OTHER PUBLICATIONS

Jon Inouye; "Analysis of Classical and Quantum Resources for the Quantum Linear Systems Algorithm"; 2013 10th International Conference on Information Technology: New Generations; Conference Paper | Publisher: IEEE (Year: 2013).*

Zeng et al.; "Transversality Versus Universality for Additive Quantum Codes"; IEEE Transactions on Information Theory vol. 57, Issue: 9 | Journal Article | Publisher: IEEE; Cited by: Papers (45) (Year: 2011).*

International Search Report and Written Opinion for International Application No. PCT/US2021/024700 dated Aug. 2, 2021, 13 pgs.

Keisuke Fujii et al: "Cluster-based architecture for fault-tolerant quantum computation", arxiv.org, Cornell University Library, 201 Olin Library Cornell University Ithaca, NY 14853, Dec. 28, 2009 (Dec. 28, 2009), 16 pgs.

Naomi Nickerson et al: "Measurement based fault tolerance beyond foliation", arxiv.org, Cornell University Library, 201 Olin Library Cornell University Ithaca, NY 14853, Oct. 23, 2018 (Oct. 23, 2018), 16 pgs.

Warit Asavanant et al: "Time-Domain Multiplexed 2-Dimensional Cluster State: Universal Quantum Computing Platform", arxiv.org, Cornell University Library, 201 Olin Library Cornell University Ithaca, NY 14853, Mar. 10, 2019 (Mar. 10, 2019), 23 pgs.

Hector Bombin: "Transversal gates and error propagation in 3D topological codes", arxiv.org, Cornell University Library, 201 Olin Library Cornell University Ithaca, NY 14853, Oct. 22, 2018 (Oct. 22, 2018), 22 pgs.

International Search Report and Written Opinion for International Application No. PCT/US2021/024706 dated Jul. 29, 2021, 13 pgs.

Daniel E Browne et al: "Resource-efficient linear optical quantum computation", arxiv.org, Cornell University Library, 201 Olin Library Cornell University Ithaca, NY 14853, May 26, 2004 (May 26, 2004), 5 pgs.

Sergei Slussarenko et al: "Photonic quantum information processing: a concise review", arxiv.org, Cornell University Library, 201 Olin Library Cornell University Ithaca, NY 14853, Jul. 15, 2019 (Jul. 15, 2019), 21 pgs.

Pieter Kok et al: "Review article: Linear optical quantum computing", arxiv.org, Cornell University Library, 201 Olin Library Cornell University Ithaca, NY 14853, Dec. 9, 2005 (Dec. 9, 2005), 41 pgs.

Debbie W Leung: "Quantum computation by measurements", arxiv.org, Cornell University Library, 201 Olin Library Cornell University Ithaca, NY 14853, Feb. 27, 2004 (Feb. 27, 2004), 10 pgs.

Sara Bartolucci et al: "Fusion-based quantum computation", arxiv.org, Cornell University Library, 201 Olin Library Cornell University Ithaca, NY 14853, Jan. 22, 2021 (Jan. 22, 2021), 25 pgs.

Notice of Allowance for U.S. Appl. No. 17/216,428 dated Feb. 23, 2022, 23 pgs.

* cited by examiner

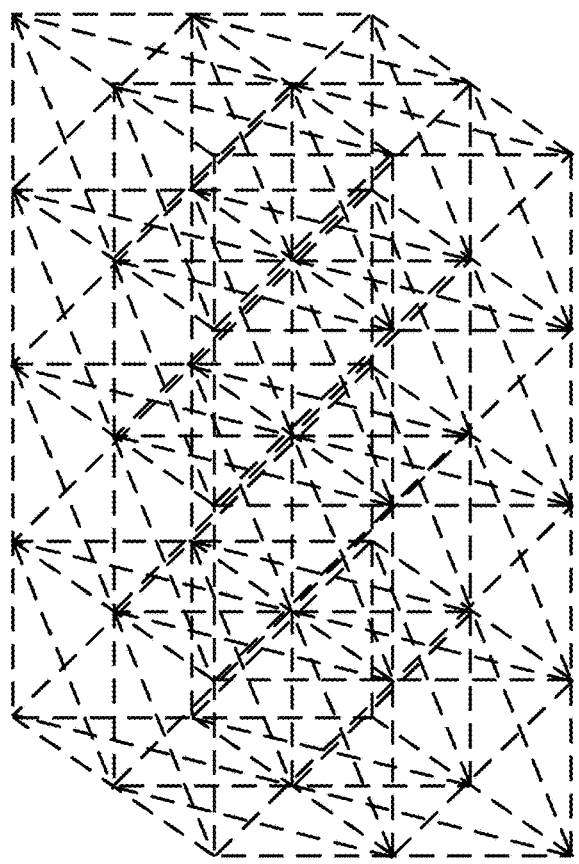
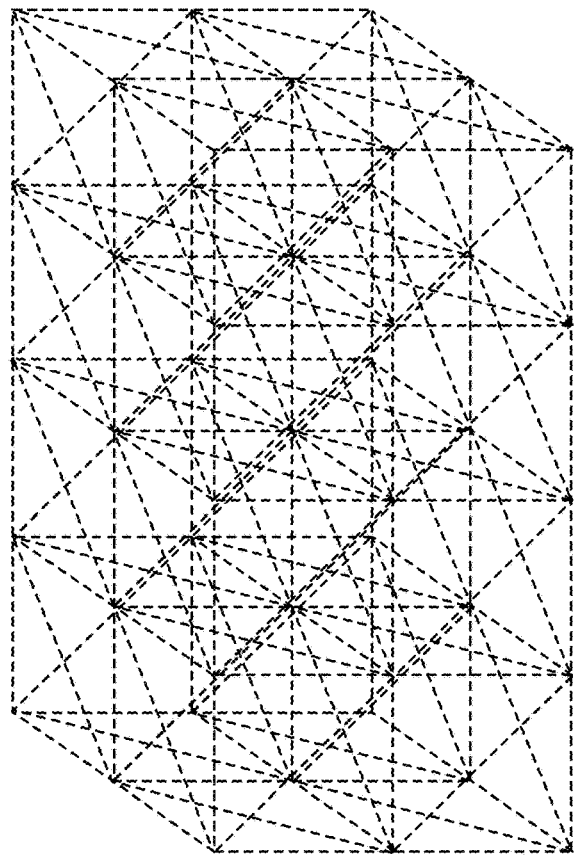
FIG. 16E

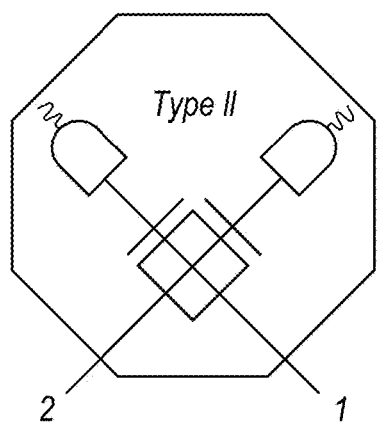
FIG. 30
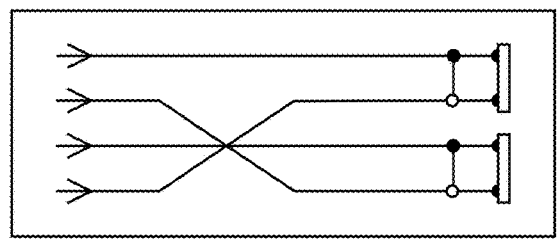
FIG. 31
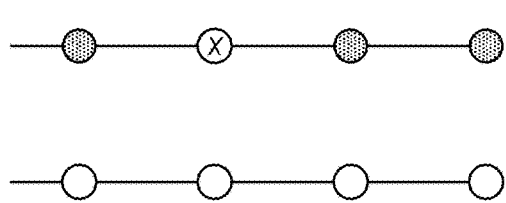
FIG. 32A
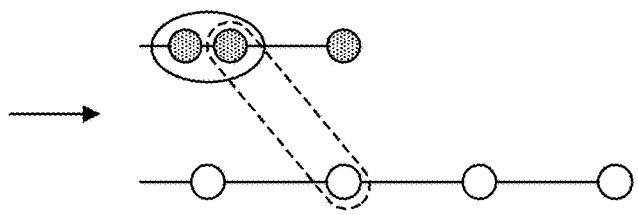
FIG. 32B
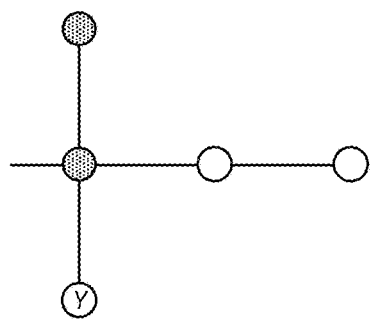
FIG. 32C
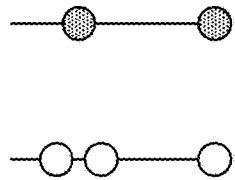
FIG. 32D

| Gate | Success | | Failure | |
|---|---|---|---|---|
| | Effective Projection | Outcome | Effective Projection | Outcome |
| (graph with nodes 1-8) | $\frac{\|++\rangle + \|--\rangle}{\sqrt{2}}_{2,6}$ | $\frac{\|0++0++\rangle + \|1--1--\rangle}{\sqrt{2}}$ | $\|+-\rangle_{2,6}$ or $\|+--\rangle_{2,6}$ | $\|0++0++\rangle$ |
| | $\frac{\|00\rangle + \|11\rangle}{\sqrt{2}}_{2,6}$ | $\frac{\|0++0++\rangle + \|1--1--\rangle}{\sqrt{2}}$ | $\|01\rangle_{2,6}$ or $\|10\rangle_{2,6}$ | $(\|0++\rangle + \|1--\rangle) \times (\|0++\rangle + \|1--\rangle)$ |
| | $\frac{\|+0\rangle + \|1-\rangle}{\sqrt{2}}_{2,6}$ | $\|0++\rangle\frac{\|0++0++\rangle + \|1--1--\rangle}{2} + \|1--\rangle\frac{\|0++0++\rangle - \|1--1--\rangle}{2}$ | $\|+1\rangle_{2,6}$ or $\|-0\rangle_{2,6}$ | $\|0++\rangle \times (\|0++\rangle + \|1--\rangle)$ |
| $= \frac{X-Y}{\sqrt{2}}$ | $\frac{\|0(+i)\rangle + \|1-(-i)\rangle}{\sqrt{2}}_{2,6}$ | $\|0++\rangle\frac{\|0++0++\rangle + \|1--1--\rangle}{2} + i\|0--\rangle\frac{\|0++0++\rangle - \|1--1--\rangle}{2}$ | $\|0(-i)\rangle_{2,6}$ or $\|1(+i)\rangle_{2,6}$ | $(\|0++\rangle + \|1--\rangle) \times (\|0++\rangle + i\|1--\rangle)$ |

FIG. 34

ADAPTIVE BASIS SELECTION FOR ENCODED FUSION MEASUREMENTS

PRIORITY INFORMATION

This application claims priority to U.S. provisional patent application Ser. No. 63/001,745, entitled "Adaptive Fusion," and filed Mar. 30, 2020; U.S. provisional patent application Ser. No. 63/009,920, entitled "Fusion Based Quantum Computing with Kagome Lattice," and filed Apr. 14, 2020; U.S. provisional patent application Ser. No. 63/081,691, entitled "Adaptive Basis Selection for Fusion Measurements," and filed Sep. 22, 2020; U.S. provisional patent application Ser. No. 63/118,319, entitled "Encoded Fusion Measurements with Local Adaptivity," and filed Nov. 25, 2020; and U.S. provisional patent application Ser. No. 63/119,395, entitled "Adaptive Basis Selection for Fusion Measurements," and filed Nov. 30, 2020, which are all hereby incorporated by reference in their entirety as though fully and completely set forth herein.

TECHNICAL FIELD

Embodiments herein relate generally to quantum computational devices, such as photonic devices (or hybrid electronic/photonic devices) for performing encoded fusion measurements to generate fault tolerant quantum computing devices and associated methods.

BACKGROUND

Quantum computing can be distinguished from "classical" computing by its reliance on structures referred to as "qubits." At the most general level, a qubit is a quantum system that may exist in one of two orthogonal states (denoted as $|0\rangle$ and $|1\rangle$ in the conventional bra/ket notation) or in a superposition of the two states e.g., $\frac{1}{\sqrt{2}}(|0\rangle + |1\rangle)$.

By operating on a system (or ensemble) of qubits, a quantum computer may quickly perform certain categories of computations that would require impractical amounts of time in a classical computer.

In fault tolerant quantum computing, quantum error correction is required to avoid an accumulation of qubit errors that then leads to erroneous computational outcomes. One method of achieving fault tolerance is to employ error correcting codes (e.g., topological codes) for quantum error correction. More specifically, a collection of physical qubits may be generated in an entangled state (also referred to herein as an error correcting code) that encodes for a single logical qubit that is protected from errors.

In some quantum computing systems, cluster states of multiple qubits, or, more generally, graph states may be used as the error correcting code. A graph state is a highly entangled multi-qubit state that may be represented visually as a graph with nodes representing qubits and edges representing entanglement between the qubits.

One of the main barriers to widespread use of quantum technologies, such as quantum computing, quantum communications, and the like, is the ability to reliably generate entanglement among two or more physical quantum systems, e.g., between two or more qubits. Various problems that either inhibit the generation of entangled states or destroy the entanglement once created (e.g., such as decoherence) have frustrated advancements in quantum technologies that rely on the use of highly entangled quantum states. Furthermore, in some qubit architectures, e.g., photonic architectures, the generation of entangled states of multiple qubits is an inherently probabilistic process that may have a low probability of success. For example, current methods for producing Bell states from single photons have success probabilities of around 20% (corresponding to an 80% failure rate). Accordingly, there remains a need for improved systems and methods for producing entangled states and quantum error correcting codes.

SUMMARY

Some embodiments described herein include quantum computing devices, systems and methods for performing fusion based quantum computing on encoded qubits.

In some embodiments, a photonic quantum computing system includes a non-transitory computer-readable memory medium, a plurality of encoded qubits each comprising a plurality of physical qubits, a fusion controller, and a plurality of fusion sites coupled to the fusion controller.

In some embodiments, the photonic quantum computing system is configured to sequentially performs a series of fusion measurements on respective physical qubits of first and second encoded qubits to obtain a respective series of classical measurement results.

For respective fusion measurements of the series of fusion measurements, a basis for performing the respective fusion measurement is selected based on classical measurement results of previous fusion measurements.

An encoded fusion measurement result is determined based on the classical measurement results, and the encoded fusion measurement result is stored in a memory medium.

The techniques described herein may be implemented in and/or used with a number of different types of devices, including but not limited to photonic quantum computing devices and/or systems, hybrid quantum/classical computing systems, and any of various other quantum computing systems.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

For a better understanding of the various described embodiments, reference should be made to the Detailed Description below, in conjunction with the following drawings in which like reference numerals refer to corresponding parts throughout the Figures.

FIGS. 16C-E illustrate the primal and dual syndrome graphs for an example logical qubit in accordance with one or more embodiments;

FIG. 30 shows an example of a Type II fusion circuit for a polarization encoding, according to some embodiments;

FIG. 31 shows an example of a Type II fusion circuit for a path encoding, according to some embodiments;

FIGS. 32A-D shows effects of fusion in the generation of a cluster state, according to some embodiments;

FIG. 34 shows a table with the effects of a few rotated variations of the Type II fusion gate used to fuse two small entangled states, according to some embodiments;

Figure 1:
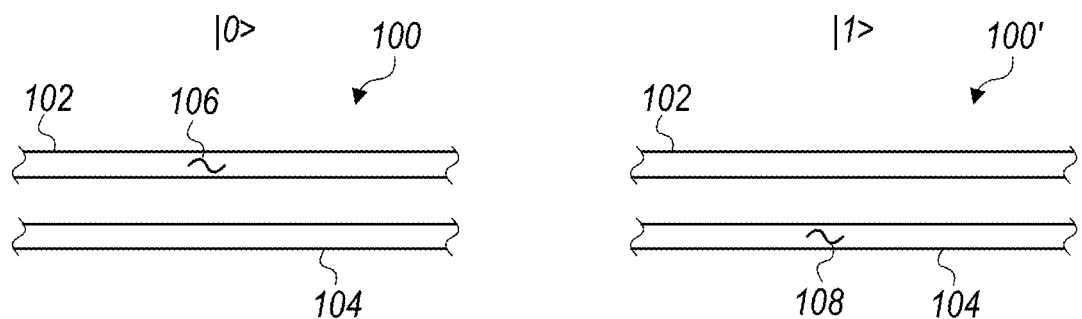
FIG. 1 shows two representations of a portion of a pair of waveguides corresponding to a dual-rail-encoded photonic qubit.

While the features described herein may be susceptible to various modifications and alternative forms, specific embodiments thereof are shown by way of example in the drawings and are herein described in detail. It should be understood, however, that the drawings and detailed description thereto are not intended to be limiting to the particular form disclosed, but on the contrary, the intention is to cover all modifications, equivalents and alternatives falling within the spirit and scope of the subject matter as defined by the appended claims.

DETAILED DESCRIPTION

Disclosed herein are examples (also referred to as "embodiments") of systems and methods for creating qubits and superposition states (including entangled states) of qubits based on various physical quantum systems, including photonic systems. Such embodiments may be used, for example, in quantum computing as well as in other contexts (e.g., quantum communication) that exploit quantum entanglement. To facilitate understanding of the disclosure, an overview of relevant concepts and terminology is provided in Section 1. With this context established, Section 2 describes systems and methods for performing adaptive basis selection while performing fusion measurements in a quantum error correcting code.

Although embodiments are described with specific detail to facilitate understanding, those skilled in the art with access to this disclosure will appreciate that the claimed invention may be practiced without these details. Reference will now be made in detail to embodiments, examples of which are illustrated in the accompanying drawings. In other instances, well-known methods, procedures, components, circuits, and networks have not been described in detail so as not to unnecessarily obscure aspects of the embodiments.

As used herein, the term "syndrome" and/or "syndrome state" refers to a set of classical information (e.g. data represented by digital values such as ones and zeros) that results when a series of measurements (e.g. stabilizer measurements) are applied to the physical qubits of the cluster state that makes up the error correcting code. As described in further detail below, these measurement outcomes may be represented by classical data and, based on the knowledge of the particular geometry of the cluster state/error correcting code, may be used to determine a classical data structure referred to herein as a "syndrome graph."

Section I. Overview of Quantum Computing

Quantum computing relies on the dynamics of quantum objects, e.g., photons, electrons, atoms, ions, molecules, nanostructures, and the like, which follow the rules of quantum theory. In quantum theory, the quantum state of a quantum object is described by a set of physical properties, the complete set of which is referred to as a mode. In some embodiments, a mode is defined by specifying the value (or distribution of values) of one or more properties of the quantum object. For example, in the case where the quantum object is a photon, modes may be defined by the frequency of the photon, the position in space of the photon (e.g., which waveguide or superposition of waveguides the photon is propagating within), the associated direction of propagation (e.g., the k-vector for a photon in free space), the polarization state of the photon (e.g., the direction (horizontal or vertical) of the photon's electric and/or magnetic fields), a time window in which the photon is propagating, the orbital angular momentum state of the photon, and the like.

For the case of photons propagating in a waveguide, it is convenient to express the state of the photon as one of a set of discrete spatio-temporal modes. For example, the spatial mode $k_i$ of the photon is determined according to which one of a finite set of discrete waveguides the photon is propagating in, and the temporal mode $t_j$ is determined by which one of a set of discrete time periods (referred to herein as "bins") the photon is present in. In some photonic implementations, the degree of temporal discretization may be provided by a pulsed laser which is responsible for generating the photons. In examples below, spatial modes will be used primarily to avoid complication of the description. However, one of ordinary skill will appreciate that the systems and methods may apply to any type of mode, e.g., temporal modes, polarization modes, and any other mode or set of modes that serves to specify the quantum state. Further, in the description that follows, embodiments will be described that employ photonic waveguides to define the spatial modes of the photon. However, persons of ordinary skill in the art with access to this disclosure will appreciate that other types of mode, e.g., temporal modes, energy states, and the like, may be used without departing from the scope of the present disclosure. In addition, persons of ordinary skill in the art will be able to implement examples using other types of quantum systems, including but not limited to other types of photonic systems.

For quantum systems of multiple indistinguishable particles, rather than describing the quantum state of each particle in the system, it is useful to describe the quantum state of the entire many-body system using the formalism of Fock states (sometimes referred to as the occupation number representation). In the Fock state description, the many-body quantum state is specified by how many particles there are in each mode of the system. For example, a multi-mode, two particle Fock state $|1001\rangle_{1,2,3,4}$ specifies a two-particle quantum state with one particle in mode 1, zero particles in mode 2, zero particles in mode 3, and one particle in mode 4. Again, as introduced above, a mode may be any property of the quantum object. For the case of a photon, any two modes of the electromagnetic field may be used, e.g., one may design the system to use modes that are related to a degree of freedom that may be manipulated passively with linear optics. For example, polarization, spatial degree of freedom, or angular momentum could be used. The four-mode system represented by the two particle Fock state $|1001\rangle_{1,2,3,4}$ may be physically implemented as four distinct waveguides with two of the four waveguides having one photon travelling within them. Other examples of a state of such a many-body quantum system include the four-particle Fock state $|1111\rangle_{1,2,3,4}$ that represents each mode occupied by one particle and the four-particle Fock state $|2200\rangle_{1,2,3,4}$ that represents modes 1 and 2 respectively occupied by two particles and modes 3 and 4 occupied by zero particles. For modes having zero particles present, the term "vacuum mode" is used. For example, for the four-particle Fock state $|2200\rangle_{1,2,3,4}$ modes 3 and 4 are referred to herein as "vacuum modes." Fock states having a single occupied mode may be represented in shorthand using a subscript to identify the occupied mode. For example, $|0010\rangle_{1,2,3,4}$ is equivalent to $|1_3\rangle$.

1.1 Qubits

As used herein, a "qubit" (or quantum bit) is a quantum system with an associated quantum state that may be used to encode information. A quantum state may be used to encode one bit of information if the quantum state space can be modeled as a (complex) two-dimensional vector space, with one dimension in the vector space being mapped to logical value 0 and the other to logical value 1. In contrast to classical bits, a qubit may have a state that is a superposition of logical values 0 and 1. More generally, a "qudit" describes any quantum system having a quantum state space that may be modeled as a (complex) n-dimensional vector space (for any integer n), which may be used to encode n bits of information. For the sake of clarity of description, the term "qubit" is used herein, although in some embodiments the system may also employ quantum information carriers that encode information in a manner that is not necessarily associated with a binary bit, such as a qudit.

Qubits (or qudits) may be implemented in a variety of quantum systems. Examples of qubits include: polarization states of photons; presence of photons in waveguides; or energy states of molecules, atoms, ions, nuclei, or photons. Other examples include other engineered quantum systems such as flux qubits, phase qubits, or charge qubits (e.g., formed from a superconducting Josephson junction); topological qubits (e.g., Majorana fermions); or spin qubits formed from vacancy centers (e.g., nitrogen vacancies in diamond).

A qubit may be "dual-rail encoded" such that the logical value of the qubit is encoded by occupation of one of two modes of the quantum system. For example, the logical 0 and 1 values may be encoded as follows:

$$|0\rangle_L = |10\rangle_{1,2} \tag{1}$$

$$|1\rangle_L = |01\rangle_{1,2} \tag{2}$$

where the subscript "L" indicates that the ket represents a logical state (e.g., a qubit value) and, as before, the notation $|ij\rangle_{1,2}$ on the right-hand side of the equations above indicates that there are i particles in a first mode and j particles in a second mode, respectively (e.g., where i and j are integers). In this notation, a two-qubit system having a logical state $|0\rangle_L |1\rangle_L$ (representing a state of two qubits, the first qubit being in a '0' logical state and the second qubit being in a '1' logical state) may be represented using occupancy across four modes by $|1001\rangle_{1,2,3,4}$ (e.g., in a photonic system, one photon in a first waveguide, zero photons in a second waveguide, zero photons in a third waveguide, and one photon in a fourth waveguide). In some instances throughout this disclosure, the various subscripts are omitted to avoid unnecessary mathematical clutter.

1.2 Entangled States

Many of the advantages of quantum computing relative to "classical" computing (e.g., conventional digital computers using binary logic) stem from the ability to create entangled states of multi-qubit systems. In mathematical terms, a state $|\psi\rangle$ of n quantum objects is a separable state if $|\psi\rangle = |\psi_1\rangle \otimes \ldots \otimes |\psi_n\rangle$, and an entangled state is a state that is not separable. One example is a Bell state, which, loosely speaking, is a type of maximally entangled state for a two-qubit system, and qubits in a Bell state may be referred to as a Bell pair. For example, for qubits encoded by single photons in pairs of modes (a dual-rail encoding), examples of Bell states include:

$$|\Phi^+\rangle = \frac{|0\rangle_L |0\rangle_L + |1\rangle_L |1\rangle_L}{\sqrt{2}} = \frac{|10\rangle|10\rangle + |01\rangle|01\rangle}{\sqrt{2}} \tag{3}$$

$$|\Phi^-\rangle = \frac{|0\rangle_L |0\rangle_L - |1\rangle_L |1\rangle_L}{\sqrt{2}} = \frac{|10\rangle|10\rangle - |01\rangle|01\rangle}{\sqrt{2}} \tag{4}$$

$$|\Psi^+\rangle = \frac{|0\rangle_L |1\rangle_L + |1\rangle_L |0\rangle_L}{\sqrt{2}} = \frac{|10\rangle|01\rangle + |01\rangle|10\rangle}{\sqrt{2}} \tag{5}$$

$$|\Psi^-\rangle = \frac{|0\rangle_L |1\rangle_L - |1\rangle_L |0\rangle_L}{\sqrt{2}} = \frac{|10\rangle|01\rangle - |01\rangle|10\rangle}{\sqrt{2}} \tag{6}$$

More generally, an n-qubit Greenberger-Horne-Zeilinger (GHZ) state (or "n-GHZ state") is an entangled quantum state of n qubits. For a given orthonormal logical basis, an n-GHZ state is a quantum superposition of all qubits being in a first basis state superposed with all qubits being in a second basis state:

$$|GHZ\rangle = \frac{|0\rangle^{\otimes M} + |1\rangle^{\otimes M}}{\sqrt{2}} \tag{7}$$

where the kets above refer to the logical basis. For example, for qubits encoded by single photons in pairs of modes (a dual-rail encoding), a 3-GHZ state may be written:

$$|GHZ\rangle = \frac{|0\rangle_L |0\rangle_L |0\rangle_L - |1\rangle_L |1\rangle_L |1\rangle_L}{\sqrt{2}} = \frac{|10\rangle|10\rangle|10\rangle + |01\rangle|01\rangle|01\rangle}{\sqrt{2}} \tag{8}$$

where the kets above refer to photon occupation number in six respective modes (with mode subscripts omitted).

1.3 Physical Implementations

Qubits (and operations on qubits) may be implemented using a variety of physical systems. In some examples described herein, qubits are provided in an integrated photonic system employing waveguides, beam splitters, photonic switches, and single photon detectors, and the modes that may be occupied by photons are spatiotemporal modes that correspond to presence of a photon in a waveguide. Modes may be coupled using mode couplers, e.g., optical beam splitters, to implement transformation operations, and measurement operations may be implemented by coupling single-photon detectors to specific waveguides. One of ordinary skill in the art with access to this disclosure will appreciate that modes defined by any appropriate set of degrees of freedom, e.g., polarization modes, temporal modes, and the like, may be used without departing from the scope of the present disclosure. For instance, for modes that only differ in polarization (e.g., horizontal (H) and vertical (V)), a mode coupler may be any optical element that coherently rotates polarization, e.g., a birefringent material such as a waveplate. For other systems such as ion trap systems or neutral atom systems, a mode coupler may be any physical mechanism that couples two modes, e.g., a pulsed electromagnetic field that is tuned to couple two internal states of the atom/ion.

In some embodiments of a photonic quantum computing system using dual-rail encoding, a qubit may be implemented using a pair of waveguides. FIG. 1 shows two representations (100, 100') of a portion of a pair of waveguides 102, 104 that may be used to provide a dual-rail-encoded photonic qubit. At 100, a photon 106 is in waveguide 102 and no photon is in waveguide 104 (also referred to as a vacuum mode); in some embodiments, this corresponds to the $|0\rangle_L$ state of a photonic qubit. At 100', a photon 108 is in waveguide 104, and no photon is in waveguide 102; in some embodiments this corresponds to the $|1\rangle_L$ state of the photonic qubit. To prepare a photonic qubit in a known logical state, a photon source (not shown) may be coupled to one end of one of the waveguides. The photon source may be operated to emit a single photon into the waveguide to which it is coupled, thereby preparing a photonic qubit in a known state. Photons travel through the waveguides, and by periodically operating the photon source, a quantum system having qubits whose logical states map to different temporal modes of the photonic system may be created in the same pair of waveguides. In addition, by providing multiple pairs of waveguides, a quantum system having qubits whose logical states correspond to different spatiotemporal modes may be created. It should be understood that the waveguides in such a system need not have any particular spatial relationship to each other. For instance, they may be but need not be arranged in parallel.

Occupied modes may be created by using a photon source to generate a photon that then propagates in the desired waveguide. A photon source may be, for instance, a resonator-based source that emits photon pairs, also referred to as a heralded single photon source. In one example of such a source, the source is driven by a pump, e.g., a light pulse, that is coupled into a system of optical resonators that, through a nonlinear optical process (e.g., spontaneous four wave mixing (SFWM), spontaneous parametric down-conversion (SPDC), second harmonic generation, or the like), may generate a pair of photons. Many different types of photon sources may be employed. Examples of photon pair sources may include a micro-ring-based spontaneous four wave mixing (SPFW) heralded photon source (HPS). However, the precise type of photon source used is not critical and any type of nonlinear source, employing any process, such as SPFW, SPDC, or any other process may be used. Other classes of sources that do not necessarily require a nonlinear material may also be employed, such as those that employ atomic and/or artificial atomic systems, e.g., quantum dot sources, color centers in crystals, and the like. In some cases, sources may or may not be coupled to photonic cavities, e.g., as may be the case for artificial atomic systems such as quantum dots coupled to cavities. Other types of photon sources also exist for SPWM and SPDC, such as optomechanical systems and the like.

In such cases, operation of the photon source may be non-deterministic (also sometimes referred to as "stochastic") such that a given pump pulse may or may not produce a photon pair. In some embodiments, coherent spatial and/or temporal multiplexing of several non-deterministic sources (referred to herein as "active" multiplexing) may be used to allow the probability of having one mode become occupied during a given cycle to approach unity. One of ordinary skill will appreciate that many different active multiplexing architectures that incorporate spatial and/or temporal multiplexing are possible. For instance, active multiplexing schemes that employ log-tree, generalized Mach-Zehnder interferometers, multimode interferometers, chained sources, chained sources with dump-the-pump schemes, asymmetric multi-crystal single photon sources, or any other type of active multiplexing architecture may be used. In some embodiments, the photon source may employ an active multiplexing scheme with quantum feedback control and the like. In some embodiments described below, use of multi-rail encoding allows the probability of a band having one mode to become occupied during a given pulse cycle to approach unity without active multiplexing.

Measurement operations may be implemented by coupling a waveguide to a single-photon detector that generates a classical signal (e.g., a digital logic signal) indicating that a photon has been detected by the detector. Any type of photodetector that has sensitivity to single photons may be used. In some embodiments, detection of a photon (e.g., at the output end of a waveguide) indicates an occupied mode while absence of a detected photon may indicate an unoccupied mode.

Some embodiments described below relate to physical implementations of unitary transform operations that couple modes of a quantum system, which may be understood as transforming the quantum state of the system. For instance, if the initial state of the quantum system (prior to mode coupling) is one in which one mode is occupied with probability 1 and another mode is unoccupied with probability 1 (e.g., a state $|10\rangle$ in the Fock notation introduced above), mode coupling may result in a state in which both modes have a nonzero probability of being occupied, e.g., a state $a_1|10\rangle+a_2|01\rangle$, where $|a_1|^2+|a_2|^2=1$. In some embodiments, operations of this kind may be implemented by using beam splitters to couple modes together and variable phase shifters to apply phase shifts to one or more modes. The amplitudes $a_1$ and $a_2$ depend on the reflectivity (or transmissivity) of the beam splitters and on any phase shifts that are introduced.

Figure 2A:
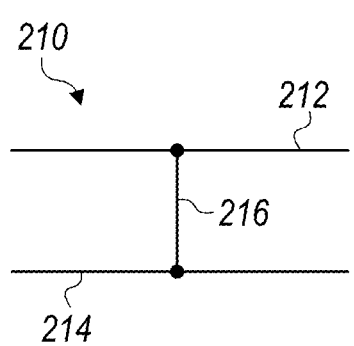
FIG. 2A shows a schematic diagram for coupling of two modes.

FIG. 2A shows a schematic diagram 210 (also referred to as a circuit diagram or circuit notation) for coupling of two modes. The modes are drawn as horizontal lines 212, 214, and the mode coupler 216 is indicated by a vertical line that is terminated with nodes (solid dots) to identify the modes being coupled. In the more specific language of linear quantum optics, the mode coupler 216 shown in FIG. 2A represents a 50/50 beam splitter that implements a transfer matrix:

$$T = \frac{1}{\sqrt{2}}\begin{pmatrix} 1 & i \\ i & 1 \end{pmatrix}, \quad (9)$$

where T defines the linear map for the photon creation operators on two modes. (In certain contexts, transfer matrix T may be understood as implementing a first-order imaginary Hadamard transform.) By convention the first column of the transfer matrix corresponds to creation operators on the top mode (referred to herein as mode 1, labeled as horizontal line 212), and the second column corresponds to creation operators on the second mode (referred to herein as mode 2, labeled as horizontal line 214), and so on if the system includes more than two modes. More explicitly, the mapping may be written as:

$$\begin{pmatrix} a_1^\dagger \\ a_2^\dagger \end{pmatrix}_{input} \mapsto \frac{1}{\sqrt{2}}\begin{pmatrix} 1 & -i \\ -i & 1 \end{pmatrix}\begin{pmatrix} a_1^\dagger \\ a_2^\dagger \end{pmatrix}_{output}, \quad (10)$$

where subscripts on the creation operators indicate the mode that is operated on, the subscripts input and output identify the form of the creation operators before and after the beam splitter, respectively and where:

$$a_i|n_i,n_j\rangle = \sqrt{n_i}|n_i-1,n_j\rangle$$

$$a_j|n_i,n_j\rangle = \sqrt{n_j}|n_i,n_j-1\rangle$$

$$a_i^\dagger|n_i,n_j\rangle = \sqrt{n_i+1}|n_i+1,n_j\rangle$$

$$a_j^\dagger|n_i,n_j\rangle = \sqrt{n_j+1}|n_i,n_j+1\rangle \quad (11)$$

For example, the application of the mode coupler shown in FIG. 2A leads to the following mappings:

$$a_{1_{input}}^\dagger \mapsto \frac{1}{\sqrt{2}}(a_{1_{output}}^\dagger - ia_{2_{output}}^\dagger) \quad (12)$$

$$a_{2_{input}}^\dagger \mapsto \frac{1}{\sqrt{2}}(-ia_{1_{output}}^\dagger + a_{2_{output}}^\dagger)$$

Thus, the action of the mode coupler described by Eq. (9) is to take the input states $|10\rangle$, $|01\rangle$, and $|11\rangle$ to $$|10\rangle \mapsto \frac{|10\rangle - i|01\rangle}{\sqrt{2}} \quad (13)$$

$$|01\rangle \mapsto \frac{-i|10\rangle + |01\rangle}{\sqrt{2}}$$

$$|11\rangle \mapsto -i/2(|20\rangle + |02\rangle)$$

Figure 2B:
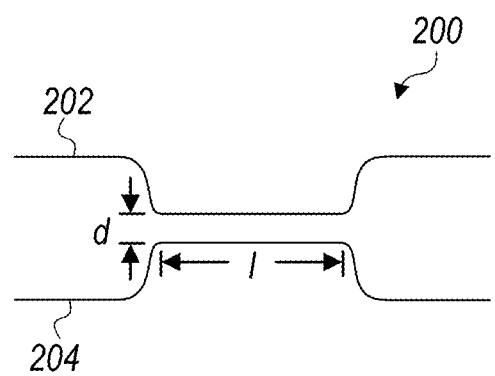
FIG. 2B shows, in schematic form, a physical implementation of mode coupling in a photonic system that may be used in some embodiments.

FIG. 2B shows a physical implementation of a mode coupling that implements the transfer matrix T of Eq. (9) for two photonic modes in accordance with some embodiments. In this example, the mode coupling is implemented using a waveguide beam splitter 200, also sometimes referred to as a directional coupler or mode coupler. A waveguide beam splitter 200 may be realized by bringing two waveguides 202, 204 into close enough proximity that the evanescent field of one waveguide may couple into the other. By adjusting the separation d between waveguides 202, 204 and/or the length l of the coupling region, different couplings between modes may be obtained. In this manner, a waveguide beam splitter 200 may be configured to have a desired transmissivity. For example, the beam splitter may be engineered to have a transmissivity equal to 0.5 (i.e., a 50/50 beam splitter for implementing the specific form of the transfer matrix T introduced above). If other transfer matrices are desired, the reflectivity (or the transmissivity) may be engineered to be greater than 0.6, greater than 0.7, greater than 0.8, or greater than 0.9 without departing from the scope of the present disclosure.

In addition to mode coupling, some unitary transforms may involve phase shifts applied to one or more modes. In some photonic implementations, variable phase-shifters may be implemented in integrated circuits, providing control over the relative phases of the state of a photon spread over multiple modes. Examples of transfer matrices that define such a phase shifts are given by (for applying a +i and −i phase shift to the second mode, respectively):

$$s = \begin{pmatrix} 1 & 0 \\ 0 & i \end{pmatrix} \quad (14)$$

$$s^\dagger = \begin{pmatrix} 1 & 0 \\ 0 & -i \end{pmatrix}$$

For silica-on-silicon materials some embodiments implement variable phase-shifters using thermo-optical switches. The thermo-optical switches use resistive elements fabricated on the surface of the chip, that via the thermo-optical effect may provide a change of the refractive index n by raising the temperature of the waveguide by an amount of the order of $10^{-5}$ K. One of skill in the art with access to the present disclosure will understand that any effect that changes the refractive index of a portion of the waveguide may be used to generate a variable, electrically tunable, phase shift. For example, some embodiments use beam splitters based on any material that supports an electro-optic effect, so-called $\chi^2$ and $\chi^3$ materials such as lithium niobite, BBO, KTP, and the like and even doped semiconductors such as silicon, germanium, and the like.

Figure 3A:
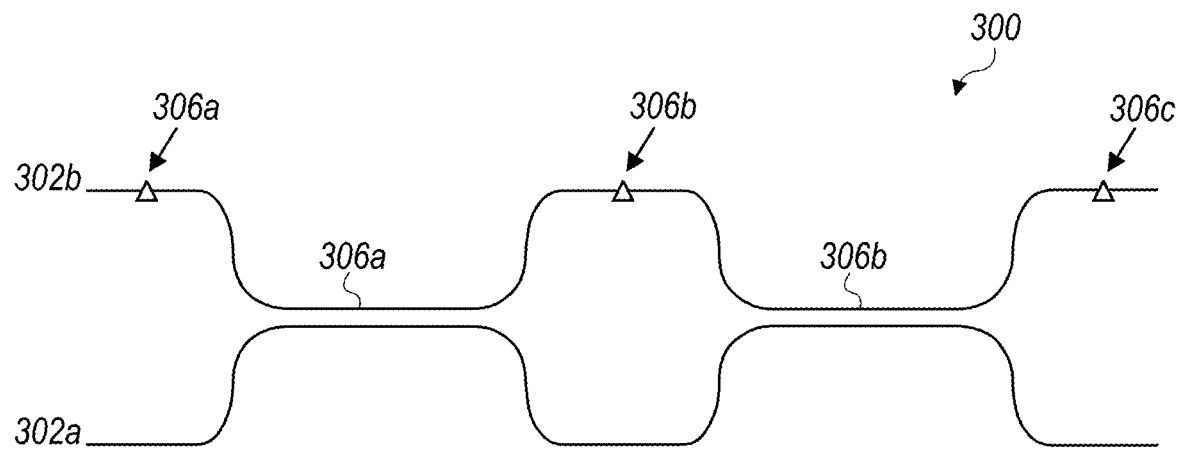
FIGS. 3A and 3B show, in schematic form, examples of physical implementations of a Mach-Zehnder Interferometer (MZI) configuration that may be used in some embodiments.
Figure 3B:
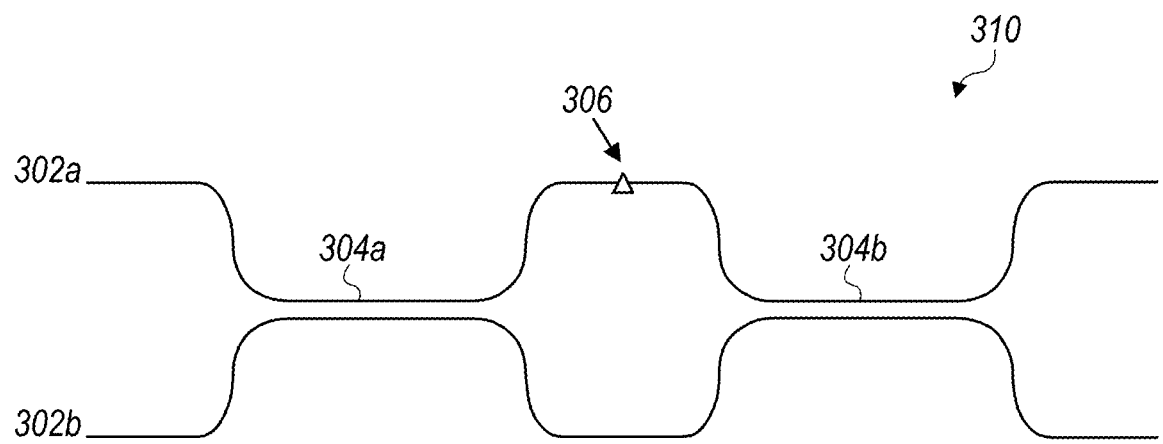

Beam-splitters with variable transmissivity and arbitrary phase relationships between output modes may also be achieved by combining directional couplers and variable phase-shifters in a Mach-Zehnder Interferometer (MZI) configuration 300, e.g., as shown in FIG. 3A. Complete control over the relative phase and amplitude of the two modes 302a, 302b in dual rail encoding may be achieved by varying the phases imparted by phase shifters 306a, 306b, and 306c and the length and proximity of coupling regions 304a and 304b. FIG. 3B shows a slightly simpler example of a MZI 310 that allows for a variable transmissivity between modes 302a, 302b by varying the phase imparted by the phase shifter 306. FIGS. 3A and 3B are examples of how one could implement a mode coupler in a physical device, but any type of mode coupler/beam splitter may be used without departing from the scope of the present disclosure.

Figure 4A:
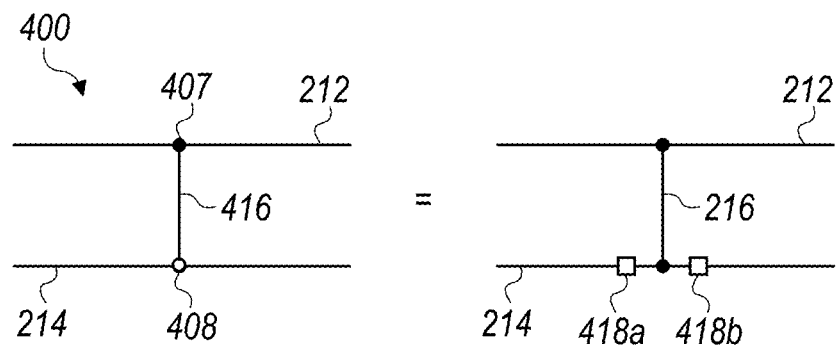
FIG. 4A shows another schematic diagram for coupling of two modes.

In some embodiments, beam splitters and phase shifters may be employed in combination to implement a variety of transfer matrices. For example, FIG. 4A shows, in a schematic form similar to that of FIG. 2A, a mode coupler 400 implementing the following transfer matrix:

$$T_r = \frac{1}{\sqrt{2}} \begin{pmatrix} 1 & 1 \\ 1 & -1 \end{pmatrix}. \quad (15)$$

Thus, mode coupler 400 applies the following mappings:

$$|10\rangle \mapsto \frac{|10\rangle + |01\rangle}{\sqrt{2}} \quad (16)$$

$$|01\rangle \mapsto \frac{|10\rangle - |01\rangle}{\sqrt{2}}$$

$$|11\rangle \mapsto 1/2(|20\rangle + |02\rangle).$$

Figure 4B:
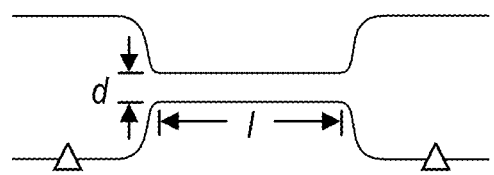
FIG. 4B shows, in schematic form, a physical implementation of the mode coupling of FIG. 4A in a photonic system that may be used in some embodiments.

The transfer matrix $T_r$ of Eq. (15) is related to the transfer matrix T of Eq. (9) by a phase shift on the second mode. This is schematically illustrated in FIG. 4A by the closed node 407 where mode coupler 416 couples to the first mode (line 212) and open node 408 where mode coupler 416 couples to the second mode (line 214). More specifically, $T_r$=sTs, and, as shown at the right-hand side of FIG. 4A, mode coupler 416 may be implemented using mode coupler 216 (as described above), with a preceding and following phase shift (denoted by open squares 418a, 418b). Thus, the transfer matrix $T_r$ may be implemented by the physical beam splitter shown in FIG. 4B, where the open triangles represent +i phase shifters.

Figure 5:
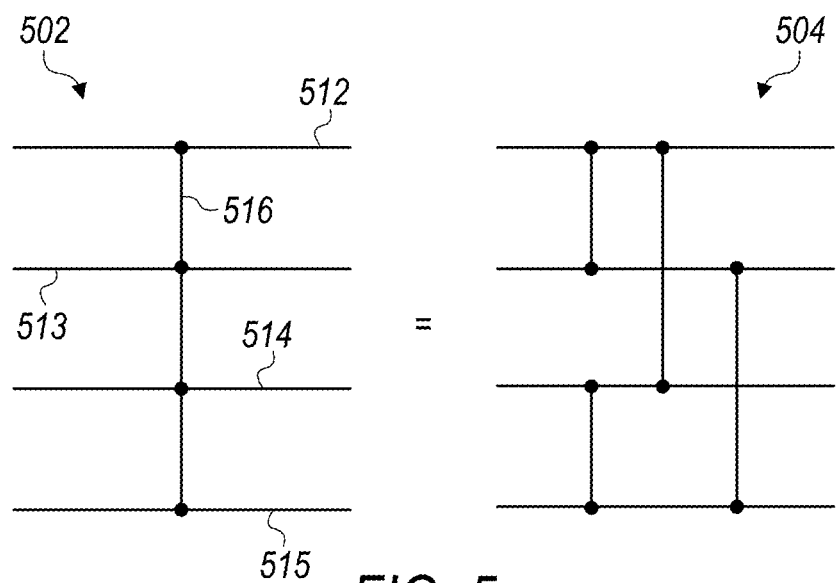
FIG. 5 shows a four-mode coupling scheme that implements a "spreader," or "mode-information erasure," transformation on four modes in accordance with some embodiments.

Similarly, networks of mode couplers and phase shifters may be used to implement couplings among more than two modes. For example, FIG. 5 shows a four-mode coupling scheme that implements a "spreader," or "mode-information erasure," transformation on four modes, i.e., it takes a photon in any one of the input modes and delocalizes the photon amongst each of the four output modes such that the photon has equal probability of being detected in any one of the four output modes. (The well-known Hadamard transformation is one example of a spreader transformation.) As in FIG. 2A, the horizontal lines 512-515 correspond to modes, and the mode coupling is indicated by a vertical line 516 with nodes (dots) to identify the modes being coupled. In this case, four modes are coupled. Circuit notation 502 is an equivalent representation to circuit diagram 504, which is a network of first-order mode couplings. More generally, where a higher-order mode coupling may be implemented as a network of first-order mode couplings, a circuit notation similar to notation 502 (with an appropriate number of modes) may be used.

Figure 6:
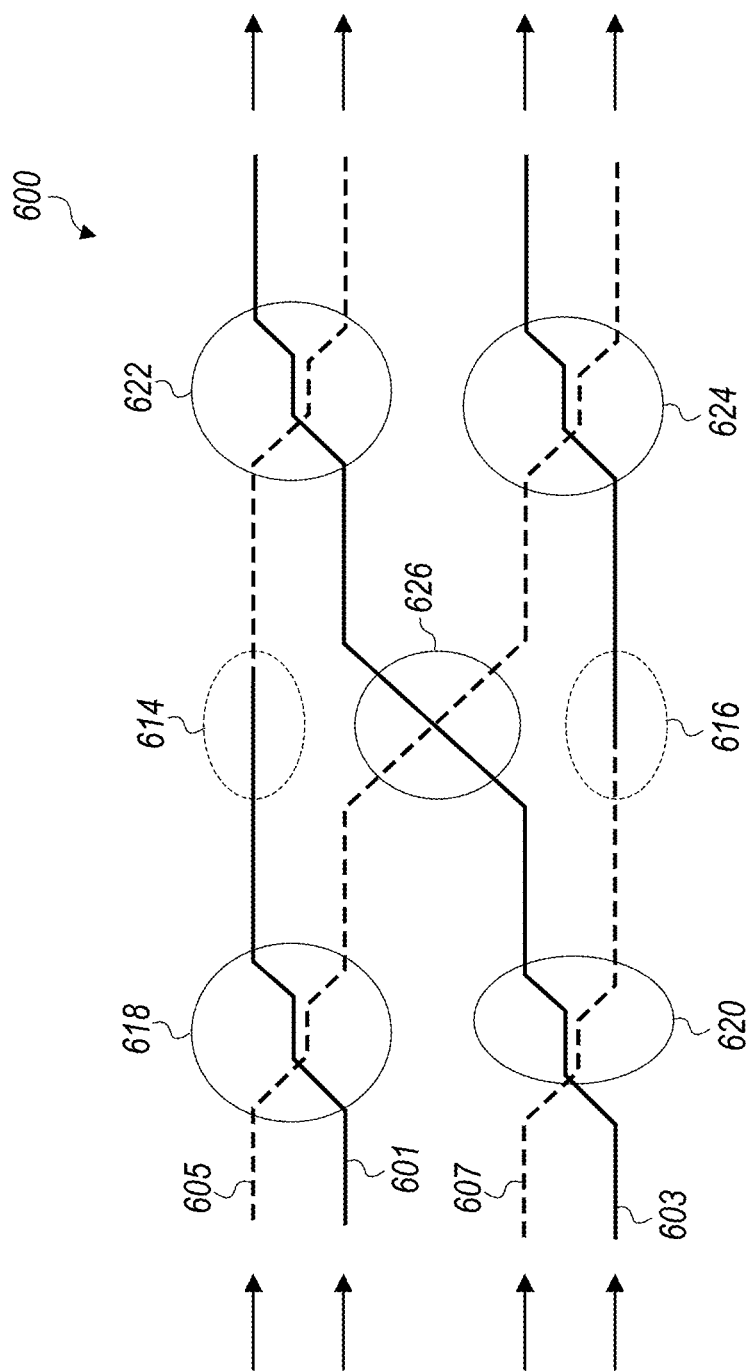
FIG. 6 illustrates an example optical device that may implement the four-mode mode-spreading transform shown schematically in FIG. 5 in accordance with some embodiments.

FIG. 6 illustrates an example optical device 600 that may implement the four-mode mode-spreading transform shown schematically in FIG. 5 in accordance with some embodiments. Optical device 600 includes a first set of optical waveguides 601, 603 formed in a first layer of material (represented by solid lines in FIG. 6) and a second set of optical waveguides 605, 607 formed in a second layer of material that is distinct and separate from the first layer of material (represented by dashed lines in FIG. 6). The second layer of material and the first layer of material are located at different heights on a substrate. One of ordinary skill will appreciate that an interferometer such as that shown in FIG. 6 could be implemented in a single layer if appropriate low loss waveguide crossing were employed.

At least one optical waveguide 601, 603 of the first set of optical waveguides is coupled with an optical waveguide 605, 607 of the second set of optical waveguides with any type of suitable optical coupler, e.g., the directional couplers described herein (e.g., the optical couplers shown in FIGS. 2B, 3A, 3B). For example, the optical device shown in FIG. 6 includes four optical couplers 618, 620, 622, and 624. Each optical coupler may have a coupling region in which two waveguides propagate in parallel. Although the two waveguides are illustrated in FIG. 6 as being offset from each other in the coupling region, the two waveguides may be positioned directly above and below each other in the coupling region without offset. In some embodiments, one or more of the optical couplers 618, 620, 622, and 624 are configured to have a coupling efficiency of approximately 50% between the two waveguides (e.g., a coupling efficiency between 49% and 51%, a coupling efficiency between 49.9% and 50.1%, a coupling efficiency between 49.99% and 50.01%, or a coupling efficiency of 50%, etc.). For example, the length of the two waveguides, the refractive indices of the two waveguides, the widths and heights of the two waveguides, the refractive index of the material located between two waveguides, and the distance between the two waveguides are selected to provide the coupling efficiency of 50% between the two waveguides. This allows the optical coupler to operate like a 50/50 beam splitter.

In addition, the optical device shown in FIG. 6 may include two inter-layer optical couplers 614 and 616. Optical coupler 614 allows transfer of light propagating in a waveguide on the first layer of material to a waveguide on the second layer of material, and optical coupler 616 allows transfer of light propagating in a waveguide on the second layer of material to a waveguide on the first layer of material. The optical couplers 614 and 616 allow optical waveguides located in at least two different layers to be used in a multi-channel optical coupler, which, in turn, enables a compact multi-channel optical coupler.

Furthermore, the optical device shown in FIG. 6 includes a non-coupling waveguide crossing region 626. In some implementations, the two waveguides (603 and 605 in this example) cross each other without having a parallel coupling region present at the crossing in the non-coupling waveguide crossing region 626 (e.g., the waveguides may be two straight waveguides that cross each other at a nearly 90-degree angle).

Those skilled in the art will understand that the foregoing examples are illustrative and that photonic circuits using beam splitters and/or phase shifters may be used to implement many different transfer matrices, including transfer matrices for real and imaginary Hadamard transforms of any order, discrete Fourier transforms, and the like. One class of photonic circuits, referred to herein as "spreader" or "mode-information erasure (MIE)" circuits, has the property that if the input is a single photon localized in one input mode, the circuit delocalizes the photon amongst each of a number of output modes such that the photon has equal probability of being detected in any one of the output modes. Examples of spreader or MIE circuits include circuits implementing Hadamard transfer matrices. (It is to be understood that spreader or MIE circuits may receive an input that is not a single photon localized in one input mode, and the behavior of the circuit in such cases depends on the particular transfer matrix implemented.) In other instances, photonic circuits may implement other transfer matrices, including transfer matrices that, for a single photon in one input mode, provide unequal probability of detecting the photon in different output modes.

Figure 7:
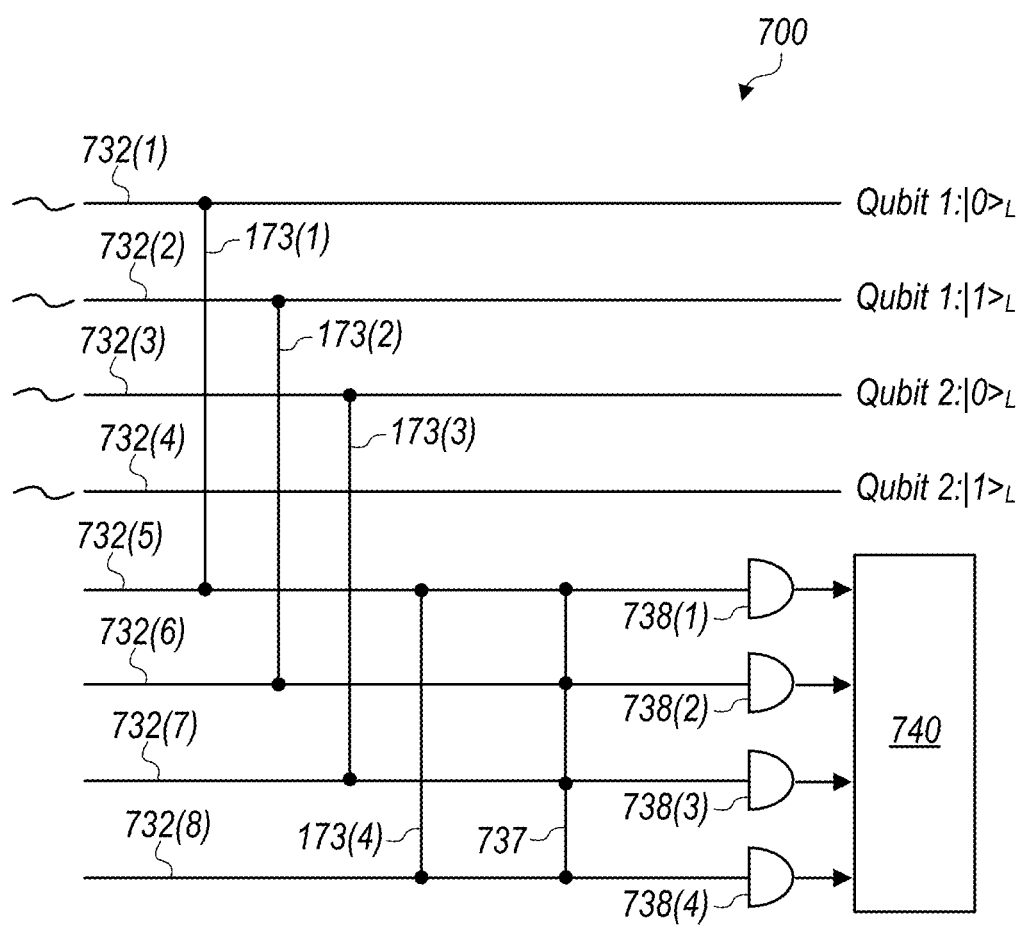
FIG. 7 shows a circuit diagram for a dual-rail-encoded Bell state generator that may be used in some embodiments.

In some embodiments, entangled states of multiple photonic qubits may be created by coupling modes of two (or more) qubits and performing measurements on other modes. By way of example, FIG. 7 shows a circuit diagram for a Bell state generator 700 that may be used in some dual-rail-encoded photonic embodiments. In this example, modes 732(1)-732(4) are initially each occupied by a photon (indicated by a wavy line); modes 732(5)-732(8) are initially vacuum modes. (Those skilled in the art will appreciate that other combinations of occupied and unoccupied modes may be used.)

A first-order mode coupling (e.g., implementing transfer matrix T of Eq. (9)) is performed on pairs of occupied and unoccupied modes as shown by mode couplers 731(1)-731(4). Thereafter, a mode-information erasure coupling (e.g., implementing a four-mode mode spreading transform as shown in FIG. 5) is performed on four of the modes (modes 732(5)-732(8)), as shown by mode coupler 737. Modes 732(5)-732(8) act as "heralding" modes that are measured and used to determine whether a Bell state was successfully generated on the other four modes 732(1)-732(4). For instance, detectors 738(1)-738(4) may be coupled to the modes 732(5)-732(8) after second-order mode coupler 737. Each detector 738(1)-738(4) may output a classical data signal (e.g., a voltage level on a conductor) indicating whether it detected a photon (or the number of photons detected). These outputs may be coupled to classical decision logic circuit 740, which determines whether a Bell state is present on the other four modes 732(1)-732(4). For example, decision logic circuit 740 may be configured such that a Bell state is confirmed (also referred to as "success" of the Bell state generator) if and only if a single photon was detected by each of exactly two of detectors 738(1)-738(4). Modes 732(1)-732(4) may be mapped to the logical states of two qubits (Qubit 1 and Qubit 2), as indicated in FIG. 7. Specifically, in this example, the logical state of Qubit 1 is based on occupancy of modes 732(1) and 732(2), and the logical state of Qubit 2 is based on occupancy of modes 732(3) and 732(4). It should be noted that the operation of Bell state generator 700 may be non-deterministic; that is, inputting four photons as shown does not guarantee that a Bell state will be created on modes 732(1)-732(4). In one implementation, the probability of success is 4/32.

In some embodiments, it is desirable to form cluster states of multiple entangled qubits (typically 3 or more qubits, although the Bell state may be understood as a cluster state of two qubits). One technique for forming larger entangled systems is through the use of an entangling measurement, which is a projective measurement that may be employed to create entanglement between systems of qubits. As used herein, "fusion" (or "fusion operation", "fusion measurement", or "fusing") refers to a two-qubit entangling measurement. A "fusion gate" is a structure that receives two input qubits, each of which is typically part of an entangled system. The fusion gate performs a projective measurement operation on the input qubits that produces either one ("type I fusion") or zero ("type II fusion") output qubits in a manner such that the initial two separate entangled systems are fused into a single entangled system. Fusion gates are specific examples of a general class of two-qubit entangling measurements and are particularly suited for photonic architectures. Type II fusion may more generally referred to as "Bell fusion". In general, a fusion measurement is a projective entangling measurement on multiple qubits, which is implemented by a fusion device receiving input qubits and outputting classical bits giving measurement outcomes.

In a photonic implementation (e.g., one that relies on linear optics), the Bell fusion is probabilistic. It may be implemented on dual-rail photonic qubits using a linear optic circuit. When two qubits from different entangled stabilizer states undergo type-II fusion, with probability (1-$p_{fail}$), the fusion "succeeds" and measures the input qubits in the Bell stabilizer basis $X_1X_2$, $Z_1Z_2$ as intended. However, with probability $p_{fail}$, the fusion "fails" and performs separable single qubit measurements $Z_1I_2,I_1Z_2$ instead.

Figure 9A:
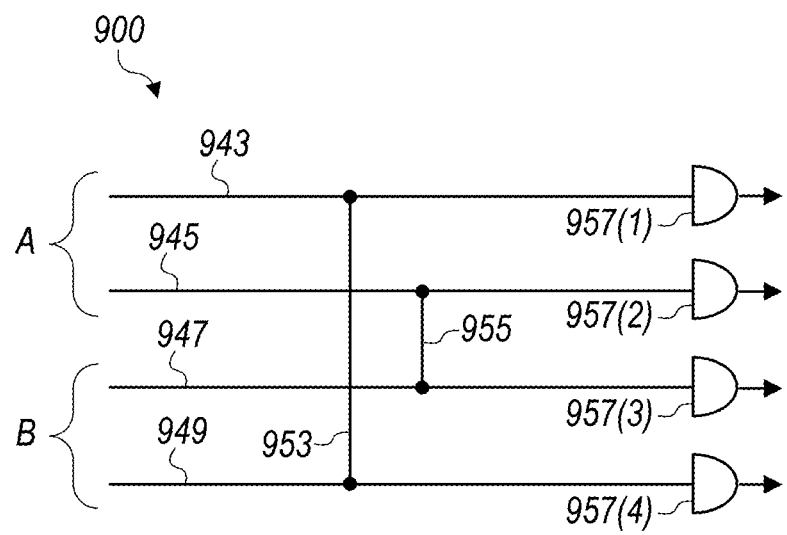
FIG. 9A shows a circuit diagram for a dual-rail-encoded type II fusion gate that may be used in some embodiments.

The failure of type-II fusion is a more benign error than erasure since it is heralded and does not create a mixed state. Pure stabilizer measurements may be obtained regardless of whether there is a success or failure outcome of the fusion. Even in the case of failure, the outcome $Z_1Z_2$ may be obtained by multiplying the two single qubit measurements together, and this allows utilization of the same measurement basis in the case of both success and failure. For example, fusion failure may be treated as a Bell measurement with the information for the $X_1X_2$ measurement erased. In some embodiments, a type-II fusion involves two beamsplitters and four detectors (e.g., as shown in FIG. 9A), and has a failure probability of 50%.

Examples of type I and type II fusion gates will now be described.

Figure 8A:
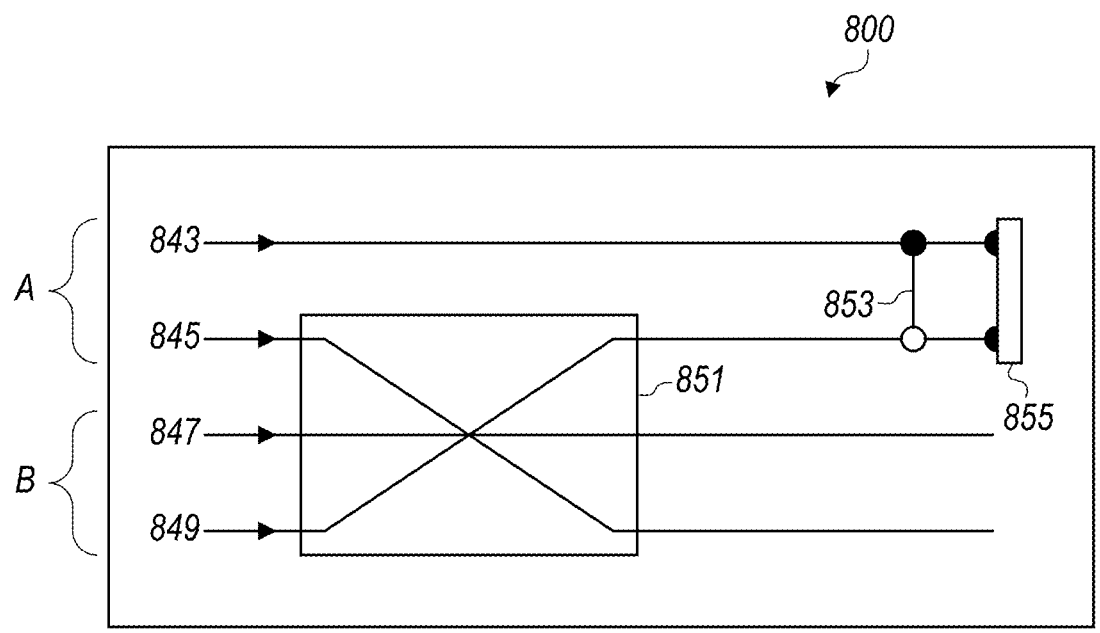
FIG. 8A shows a circuit diagram for a dual-rail-encoded type I fusion gate that may be used in some embodiments.

FIG. 8A shows a circuit diagram illustrating a type I fusion gate 800 in accordance with some embodiments. The diagram shown in FIG. 8A is schematic with each horizontal line representing a mode of a quantum system, e.g., a waveguide that may potentially be occupied by one or more photons. In dual-rail encoding, each pair of modes represents a qubit. In a photonic implementation of the gate the modes in diagrams such as that shown in FIG. 8A may be physically realized using single photons in photonic waveguides. More generally, a type I fusion gate like that shown in FIG. 8A takes qubit A (physically realized, e.g., by photon modes 843 and 845) and qubit B (physically realized, e.g., by photon modes 847 and 849) as input and outputs a single "fused" qubit that inherits the entanglement with other qubits that were previously entangled with either (or both) of input qubit A or input qubit B.

Figure 8B:
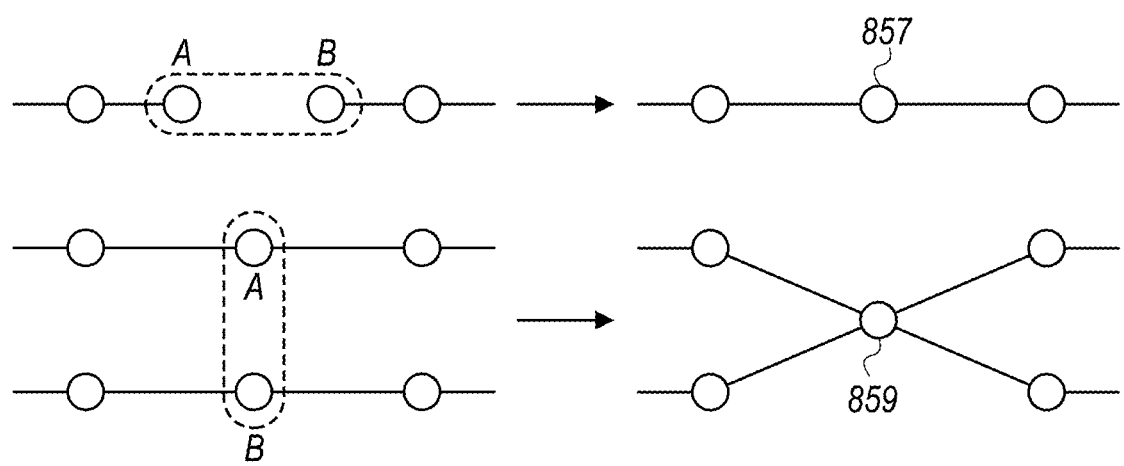
FIG. 8B shows example results of type I fusion operations using the gate of FIG. 8A.

For example, FIG. 8B shows the result of type-I fusing of two qubits A and B that are each, respectively, a qubit located at the end (i.e., a leaf) of some longer entangled cluster state (only a portion of which is shown). The qubit 857 that remains after the fusion operation inherits the entangling bonds from the original qubits A and B thereby creating a larger linear cluster state. FIG. 8B also shows the result of type-I fusing of two qubits A and B that are each, respectively, an internal qubit that belongs to some longer entangled cluster of qubits (only a portion of which is shown). As before, the qubit 859 that remains after fusion inherits the entangling bonds from the original qubits A and B thereby creating a fused cluster state. In this case, the qubit that remains after the fusion operation is entangled with the larger cluster by way of four other nearest neighbor qubits as shown.

Returning to the schematic illustration of a type I fusion gate 800 shown in FIG. 8A, qubit A is dual-rail encoded by modes 843 and 845, and qubit B is dual-rail encoded by modes 847 and 849. For example, in the case of path-encoded photonic qubits, the logical zero state of qubit A (denoted $|0\rangle_A$) occurs when mode 843 is a photonic waveguide that includes a single photon and mode 845 is a photonic waveguide that includes zero photons (and similarly for qubit B). Thus, type I fusion gate 800 may take as input two dual-rail-encoded photon qubits thereby resulting in a total of four input modes (e.g., modes 843, 845, 847, and 849). To accomplish the fusion operation, a mode coupler (e.g., 50/50 beam splitter) 853 is applied between a mode of each of the input qubits, e.g., between mode 843 and mode 849 before performing a detection operation on both modes using photon detectors 855 (which includes two distinct photon detectors coupled to modes 843 and 849 respectively). In addition, to ensure that the output modes are adjacently positioned, a mode swap operation 851 may be applied that swaps the position of the second mode of qubit A (mode 845) with the position the second mode of qubit B (mode 849). In some embodiments, mode swapping may be accomplished through a physical waveguide crossing as described above or by one or more photonic switches or by any other type of physical mode swap.

FIG. 8A shows only an example arrangement for a type I fusion gate and one of ordinary skill will appreciate that the position of the mode coupler and the presence of the mode swap region 851 may be altered without departing from the scope of the present disclosure. For example, beam splitter 853 may be applied between modes 845 and 847. Mode swaps are optional and are not necessary if qubits having non-adjacent modes may be dealt with, e.g., by tracking which modes belong to which qubits by storing this information in a classical memory.

Type I fusion gate 800 is a nondeterministic gate, i.e., the fusion operation succeeds with a certain probability less than 1, and in other cases the quantum state that results is not a larger cluster state that comprises the original cluster states fused together to a larger cluster state. More specifically, gate 800 "succeeds," with probability 50%, when only one photon is detected by detectors 855, and "fails" if zero or two photons are detected by detectors 855. When the gate succeeds, the two cluster states that qubits A and B were a part of become fused into a single larger cluster state with a fused qubit remaining as the qubit that links the two previously unlinked cluster states (see, e.g., FIG. 8B). However, when the fusion gate fails, it has the effect of removing both qubits from the original cluster resource states without generating a larger fused state. A third (less likely) possibility is a loss outcome, where one or more photons within the input states 843-849 escape from their respective waveguides.

FIG. 9A shows a circuit diagram illustrating a type II fusion gate 900 in accordance with some embodiments. Like other diagrams herein, the diagram shown in FIG. 9A is schematic with each horizontal line representing a mode of a quantum system, e.g., a waveguide that may potentially be occupied by one or more photons. In a dual-rail encoding, each pair of modes represents a qubit. In a photonic implementation of the gate the modes in diagrams such as that shown in FIG. 9A may be physically realized using single photons in photonic waveguides. Most generally, a type II fusion gate such as gate 900 takes qubit A (physically realized, e.g., by photon modes 943 and 945) and qubit B (physically realized, e.g., by photon modes 947 and 949) as input and outputs a quantum state that inherits the entanglement with other qubits that were previously entangled with either (or both) of input qubit A or input qubit B. (For type II fusion, if the input quantum state had N qubits, the output quantum state has N−2 qubits. This is different from type I fusion where an input quantum state of N qubits leads to an output quantum state having N−1 qubits.)

Figure 9B:
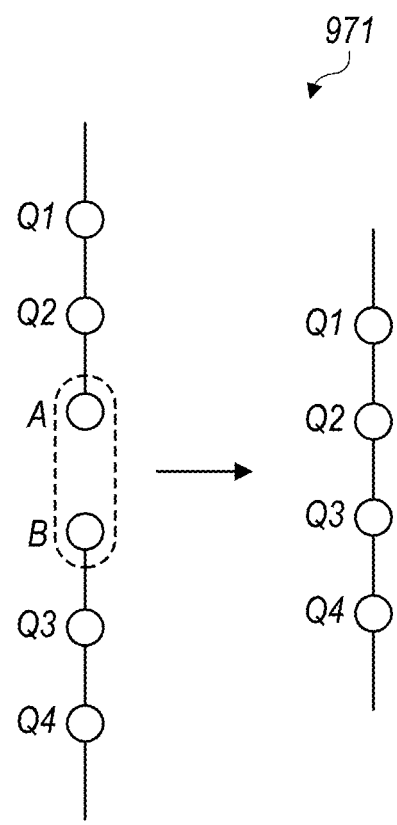
FIG. 9B shows an example result of a type II fusion operation using the gate of FIG. 9A.

For example, FIG. 9B shows the result of type-II fusing of two qubits A and B that are each, respectively, a qubit located at the end (i.e., a leaf) of some longer entangled cluster state (only a portion of which is shown). The resulting qubit system 971 inherits the entangling bonds from qubits A and B thereby creating a larger linear cluster state.

Returning to the schematic illustration of type II fusion gate 900 shown in FIG. 9A, qubit A is dual-rail encoded by modes 943 and 945, and qubit B is dual-rail encoded by modes 947 and 949. For example, in the case of path encoded photonic qubits, the logical zero state of qubit A (denoted $|0\rangle_A$) occurs when mode 943 is a photonic waveguide that includes a single photon and mode 945 is a photonic waveguide that includes zero photons (and likewise for qubit B). Thus, type II fusion gate 900 takes as input two dual-rail-encoded photon qubits thereby resulting in a total of four input modes (e.g., modes 943, 945, 947, and 949). To accomplish the fusion operation, a first mode coupler (e.g., 50/50 beam splitter) 953 is applied between a mode of each of the input qubits, e.g., between mode 943 and mode 949, and a second mode coupler (e.g., 50/50 beam splitter) 955 is applied between the other modes of each of the input qubits, e.g., between modes 945 and 947. A detection operation is performed on all four modes using photon detectors 957(1)-957(4). In some embodiments, mode swap operations (not shown in FIG. 9A) may be performed to place modes in adjacent positions prior to mode coupling. In some embodiments, mode swapping may be accomplished through a physical waveguide crossing as described above or by one or more photonic switches or by any other type of physical mode swap. Mode swaps are optional and are not necessary if qubits having non-adjacent modes may be dealt with, e.g., by tracking which modes belong to which qubits by storing this information in a classical memory.

FIG. 9A shows only an example arrangement for the type II fusion gate and one of ordinary skill will appreciate that the positions of the mode couplers and the presence or absence of mode swap regions may be altered without departing from the scope of the present disclosure.

The type II fusion gate shown in FIG. 9A is a nondeterministic gate, i.e., the fusion operation succeeds with a certain probability less than 1, and in other cases the quantum state that results is not a larger cluster state that comprises the original cluster states fused together to a larger cluster state. More specifically, the gate "succeeds" in the case where one photon is detected by one of detectors 957(1) and 957(4) and one photon is detected by one of detectors 957(2) and 957(3); in other cases where two photons are detected in different combinations of detectors, the gate "fails." When the gate succeeds, the two cluster states that qubits A and B were a part of become fused into a single larger cluster state; unlike type-I fusion, no fused qubit remains (e.g., compare FIG. 8B and FIG. 9B). When the fusion gate fails, it has the effect of removing both qubits from the original cluster resource states without generating a larger fused state. As a third possibility, if fewer than two photons are detected, one or both photons may have escaped, resulting in a loss outcome.

The foregoing description provides an example of how photonic circuits may be used to implement physical qubits and operations on physical qubits using mode coupling between waveguides. In these examples, a pair of modes may be used to represent each physical qubit. Examples described below may be implemented using similar photonic circuit elements.

It should be understood that all numerical values used herein are for purposes of illustration and may be varied. In some instances, ranges are specified to provide a sense of scale, but numerical values outside a disclosed range are not precluded.

It should also be understood that all diagrams herein are intended as schematic. Unless specifically indicated otherwise, the drawings are not intended to imply any particular physical arrangement of the elements shown therein, or that all elements shown are necessary. Those skilled in the art with access to this disclosure will understand that elements shown in drawings or otherwise described in this disclosure may be modified or omitted and that other elements not shown or described may be added.

This disclosure provides a description of the claimed invention with reference to specific embodiments. Those skilled in the art with access to this disclosure will appreciate that the embodiments are not exhaustive of the scope of the claimed invention, which extends to all variations, modifications, and equivalents.

Figure 10:
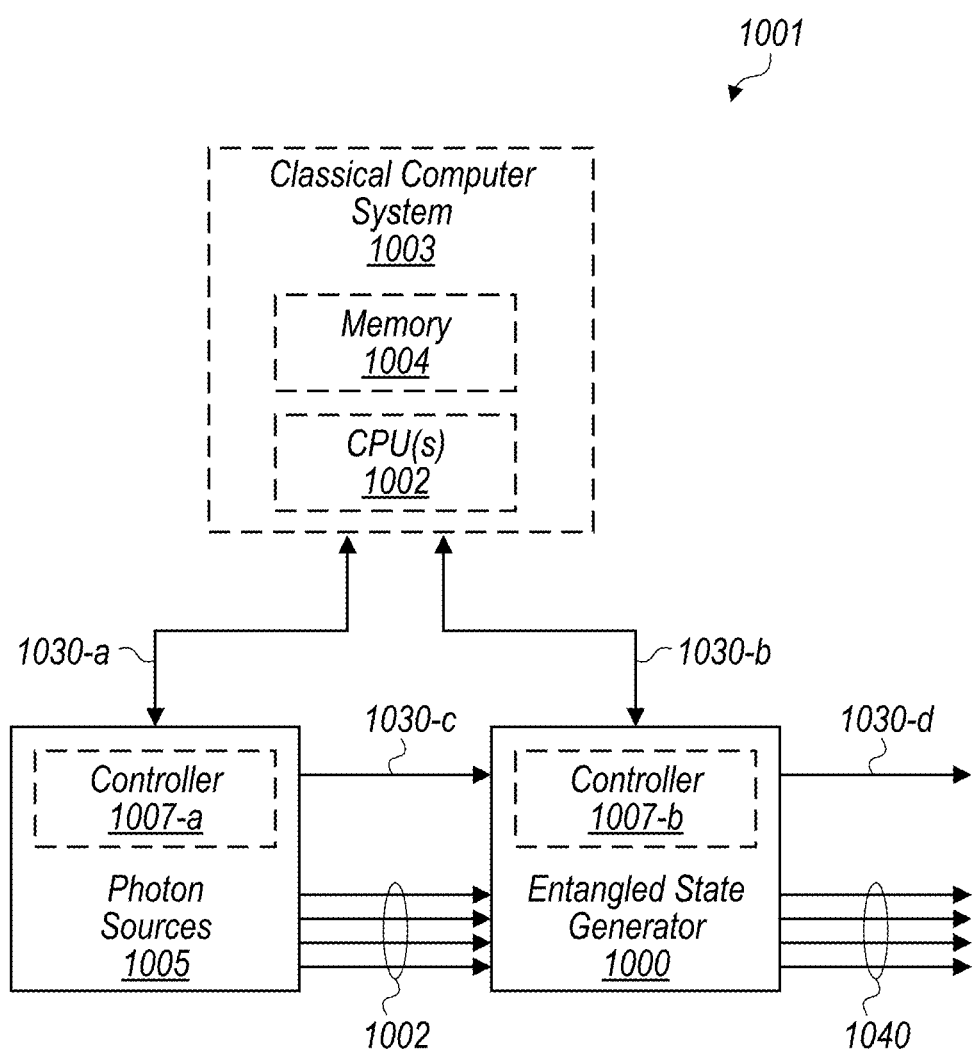
FIG. 10 illustrates an example of a qubit entangling system 1001 in accordance with some embodiments.

FIG. 10 illustrates an example of a qubit entangling system 1001 in accordance with some embodiments. Such a system may be used to generate qubits (e.g., photons) in an entangled state (e.g., a GHZ state, Bell pair, and the like), in accordance with some embodiments.

In an illustrative photonic architecture, qubit entangling system 1001 may include a photon source module 1005 that is optically connected to entangled state generator 1000. Both the photon source module 1005 and the entangled state generator 1000 may be coupled to a classical processing system 1003 such that the classical processing system 1003 may communicate and/or control (e.g., via the classical information channels 1030a-b) the photon source module 1005 and/or the entangled state generator 1000. Photon source module 1005 may include a collection of single-photon sources that may provide output photons to entangled state generator 1000 by way of interconnecting waveguides 1032. Entangled state generator 1000 may receive the output photons and convert them to one or more entangled photonic states and then output these entangled photonic states into output waveguides 1040. In some embodiments, output waveguide 1040 may be coupled to some downstream circuit that may use the entangled states for performing a quantum computation. For example, the entangled states generated by the entangled state generator 1000 may be used as resources for a downstream quantum optical circuit (not shown).

In some embodiments, system 1001 may include classical channels 1030 (e.g., classical channels 1030-a through 1030-d) for interconnecting and providing classical information between components. It should be noted that classical channels 1030-a through 1030-d need not all be the same. For example, classical channel 1030-a through 1030-c may comprise a bi-directional communication bus carrying one or more reference signals, e.g., one or more clock signals, one or more control signals, or any other signal that carries classical information, e.g., heralding signals, photon detector readout signals, and the like.

In some embodiments, qubit entangling system 1001 includes the classical computer system 1003 that communicates with and/or controls the photon source module 1005 and/or the entangled state generator 1000. For example, in some embodiments, classical computer system 1003 may be used to configure one or more circuits, e.g., using system clock that may be provided to photon sources 1005 and entangled state generator 1000 as well as any downstream quantum photonic circuits used for performing quantum computation. In some embodiments, the quantum photonic circuits may include optical circuits, electrical circuits, or any other types of circuits. In some embodiments, classical computer system 1003 includes memory 1004, one or more processor(s) 1002, a power supply, an input/output (I/O) subsystem, and a communication bus or interconnecting these components. The processor(s) 1002 may execute modules, programs, and/or instructions stored in memory 1004 and thereby perform processing operations.

In some embodiments, memory 1004 stores one or more programs (e.g., sets of instructions) and/or data structures. For example, in some embodiments, entangled state generator 1000 may attempt to produce an entangled state over successive stages, any one of which may be successful in producing an entangled state. In some embodiments, memory 1004 stores one or more programs for determining whether a respective stage was successful and configuring the entangled state generator 1000 accordingly (e.g., by configuring entangled state generator 1000 to switch the photons to an output if the stage was successful, or pass the photons to the next stage of the entangled state generator 1000 if the stage was not yet successful). To that end, in some embodiments, memory 1004 stores detection patterns (described below) from which the classical computing system 1003 may determine whether a stage was successful. In addition, memory 1004 may store settings that are provided to the various configurable components (e.g., switches) described herein that are configured by, e.g., setting one or more phase shifts for the component.

In some embodiments, some or all of the above-described functions may be implemented with hardware circuits on photon source module 1005 and/or entangled state generator 1000. For example, in some embodiments, photon source module 1005 includes one or more controllers 1007-*a* (e.g., logic controllers) (e.g., which may comprise field programmable gate arrays (FPGAs), application specific integrated circuits (ASICS), a "system on a chip" that includes classical processors and memory, or the like). In some embodiments, controller 1007-*a* determines whether photon source module 1005 was successful (e.g., for a given attempt on a given clock cycle, described below) and outputs a reference signal indicating whether photon source module 1005 was successful. For example, in some embodiments, controller 1007-*a* outputs a logical high value to classical channel 1030-*a* and/or classical channel 1030-*c* when photon source module 1005 is successful and outputs a logical low value to classical channel 1030-*a* and/or classical channel 1030-*c* when photon source module 1005 is not successful. In some embodiments, the output of control 1007-*a* may be used to configure hardware in controller 1007-*b*.

Similarly, in some embodiments, entangled state generator 1000 includes one or more controllers 1007-*b* (e.g., logical controllers) (e.g., which may comprise field programmable gate arrays (FPGAs), application specific integrated circuits (ASICS), or the like) that determine whether a respective stage of entangled state generator 1000 has succeeded, perform the switching logic described above, and output a reference signal to classical channels 1030-*b* and/or 1030-*d* to inform other components as to whether the entangled state generator 400 has succeeded.

In some embodiments, a system clock signal may be provided to photon source module 1005 and entangled state generator 1000 via an external source (not shown) or by classical computing system 1003 generates via classical channels 1030-*a* and/or 1030-*b*. In some embodiments, the system clock signal provided to photon source module 1005 triggers photon source module 1005 to attempt to output one photon per waveguide. In some embodiments, the system clock signal provided to entangled state generator 1000 triggers, or gates, sets of detectors in entangled state generator 1000 to attempt to detect photons. For example, in some embodiments, triggering a set of detectors in entangled state generator 1000 to attempt to detect photons includes gating the set of detectors.

It should be noted that, in some embodiments, photon source module 1005 and entangled state generator 1000 may have internal clocks. For example, photon source module 1005 may have an internal clock generated and/or used by controller 1007-*a* and entangled state generator 1000 has an internal clock generated and/or used by controller 1007-*b*. In some embodiments, the internal clock of photon source module 1005 and/or entangled state generator 1000 is synchronized to an external clock (e.g., the system clock provided by classical computer system 1003) (e.g., through a phase-locked loop). In some embodiments, any of the internal clocks may themselves be used as the system clock, e.g., an internal clock of the photon source may be distributed to other components in the system and used as the master/system clock.

In some embodiments, photon source module 1005 includes a plurality of probabilistic photon sources that may be spatially and/or temporally multiplexed, i.e., a so-called multiplexed single photon source. In one example of such a source, the source is driven by a pump, e.g., a light pulse, that is coupled into an optical resonator that, through some nonlinear process (e.g., spontaneous four wave mixing, second harmonic generation, and the like) may generate zero, one, or more photons. As used herein, the term "attempt" is used to refer to the act of driving a photon source with some sort of driving signal, e.g., a pump pulse, that may produce output photons non-deterministically (i.e., in response to the driving signal, the probability that the photon source will generate one or more photons may be less than 1). In some embodiments, a respective photon source may be most likely to, on a respective attempt, produce zero photons (e.g., there may be a 90% probability of producing zero photons per attempt to produce a single-photon). The second most likely result for an attempt may be production of a single-photon (e.g., there may be a 9% probability of producing a single-photon per attempt to produce a single-photon). The third most likely result for an attempt may be production of two photons (e.g., there may be an approximately 1% probability of producing two photons per attempt to produce a single photon). In some circumstances, there may be less than a 1% probability of producing more than two photons.

In some embodiments, the apparent efficiency of the photon sources may be increased by using a plurality of single-photon sources and multiplexing the outputs of the plurality of photon sources.

The precise type of photon source used is not critical and any type of source may be used, employing any photon generating process, such as spontaneous four wave mixing (SPFW), spontaneous parametric down-conversion (SPDC), or any other process. Other classes of sources that do not necessarily require a nonlinear material may also be employed, such as those that employ atomic and/or artificial atomic systems, e.g., quantum dot sources, color centers in crystals, and the like. In some cases, sources may or may be coupled to photonic cavities, e.g., as may be the case for artificial atomic systems such as quantum dots coupled to cavities. Other types of photon sources also exist for SPWM and SPDC, such as optomechanical systems and the like. In some examples the photon sources may emit multiple photons already in an entangled state in which case the entangled state generator 1000 may not be necessary, or alternatively may take the entangled states as input and generate even larger entangled states.

For the sake of illustration, an example which employs spatial multiplexing of several non-deterministic is described as an example of a MUX photon source. However, many different spatial MUX architectures are possible without departing from the scope of the present disclosure.

Temporal MUXing may also be implemented instead of or in combination with spatial multiplexing. MUX schemes that employ log-tree, generalized Mach-Zehnder interferometers, multimode interferometers, chained sources, chained sources with dump-the-pump schemes, asymmetric multi-crystal single photon sources, or any other type of MUX architecture may be used. In some embodiments, the photon source may employ a MUX scheme with quantum feedback control and the like.

1.4 Introduction to Fusion Based Quantum Computing

Quantum computation is often considered in the framework of 'Circuit Based Quantum Computation' (CBQC) in which operations (or gates) are performed on physical qubits. Gates may be either single qubit unitary operations (rotations), or two qubit entangling operations such as the CNOT gate.

Fusion Based Quantum Computation (FBQC) is another approach to implementing quantum computation. In the FBQC approach, computation proceeds by first preparing a particular entangled state of many qubits, commonly referred to as a cluster state, and then carrying out a series of single qubit measurements to enact the quantum computation. In this approach, the choice of single qubit measurements is dictated by the quantum algorithm being run on the quantum computer. In the FBQC approach, fault tolerance may be achieved by careful design of the cluster state and using the topology of this cluster state to encode a logical qubit that is protected against errors that may occur on any one of the physical qubits that make up the cluster state. In practice, the value of the logical qubit may be determined based on the results of the single-particle measurements that are made of the physical qubits that form the cluster state as the computation proceeds.

However, the generation and maintenance of long-range entanglement across the cluster state and subsequent storage of large cluster states may be a challenge. For example, for a physical implementation of the FBQC approach proposed by Raussendorf et al., a cluster state containing many thousands, or more, of mutually entangled qubits must be prepared and then stored for some period of time before the single-qubit measurements are performed. For example, to generate a cluster state representing a single logical error corrected qubit, each of the collection of underlying physical qubits is prepared in the $|+\rangle$ state and a controlled-phase gate (CZ) state is applied between each physical qubit pair to generate the overall cluster state. More explicitly, a cluster state of highly entangled qubits described by the undirected graph G=(V, E) with V and E denoting the sets of vertices and edges, respectively may be generated as follows: 1) initialize all the physical qubits in the $|+\rangle$ state, where $|+\rangle = (|0\rangle + |1\rangle)/\sqrt{2}$. 2) apply the controlled-phase gate CZ to each pair (i, j) of qubits. Accordingly, any cluster state, which physically corresponds to a large entangled state of physical qubits, may be described as $$|\Psi\rangle_{graph} = \prod_{(i,j)\in E} CZ_{i,j} |+\rangle^{\otimes |V|}$$

where the $CZ_{i,j}$ is the controlled phase gate operator. Graphically, any cluster state may be represented by a graph that includes vertices that represent the physical qubits (initialized in the $|+\rangle$ state) and edges that represent entanglement between them (i.e., the application of the various CZ gates).

After $|\Psi\rangle_{graph}$ is generated, this large state of mutually entangled qubits must be preserved long enough for a stabilizer measurement to be performed, e.g., by making x measurements on all physical qubits in the bulk of the lattice and z-measurements on the boundary qubits.

Figure 11A:
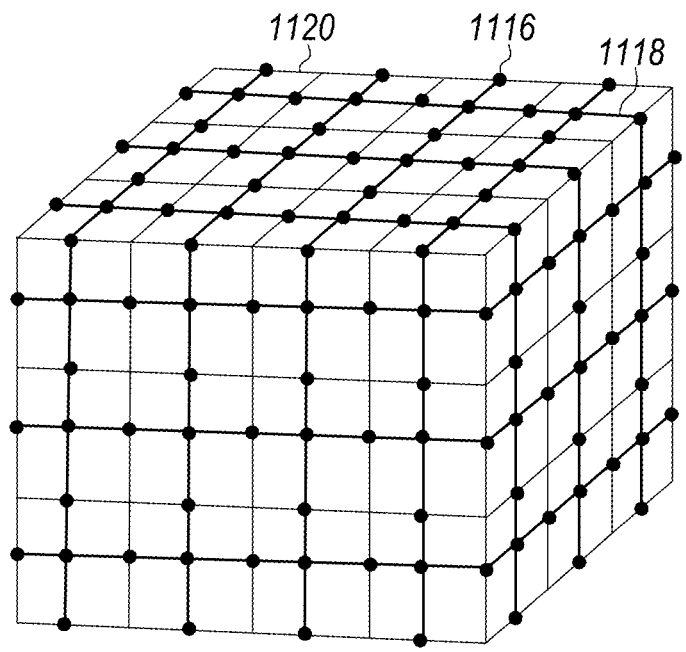
FIGS. 11A-11C are diagrams illustrating a cluster state and a corresponding syndrome graph for an entangled state of physical qubits in accordance with some embodiments.

FIG. 11A shows one example of a fault tolerant cluster state that may be used in FBQC. Specifically, FIG. 11A illustrates the topological cluster state introduced by Raussendorf et al. commonly referred to as the Raussendorf lattice. The cluster state is in the form of repeating lattice cells (e.g., cell 1120, delineated by non-bold lines) with physical qubits (e.g., physical qubit 1116) arranged on the faces and edges of the cells. Entanglement between the physical qubits is represented by edges that connect the physical qubits (e.g., edge 1118, indicated by bold lines). The cluster state shown in FIG. 11A is merely one example among many and other cluster states may be used without departing from the scope of the present disclosure. Furthermore, while the example shown here is represented in three spatial dimensions, the same structure may also be obtained from other implementations of codes that are not based on a purely spatial entangled cluster state, but rather may include both entanglement in 2D space and entanglement in time, e.g., a 2+1D surface code implementation may be used or any other foliated code. For such cluster states, all of the quantum gates needed for fault tolerant quantum computation may be constructed by making a series of single particle measurements to the physical qubits that make up the lattice.

Returning to FIG. 11A, a chunk of a Raussendorf lattice is shown. Such an entangled state may be used to encode one or more logical qubits (i.e. one or more error corrected qubits) using many entangled physical qubits. The measurement results of the multiple physical qubits, e.g., physical qubit 1116, may be used for correcting errors and for performing fault tolerant computations on the logical qubits through the use of a decoder. One of ordinary skill will appreciate that the number of physical qubits required to encode a single logical qubit may vary depending on the precise nature of the physical errors, noise, etc., that are experienced by the physical qubits, but to achieve fault tolerance, all proposals to date utilize at least thousands of physical qubits to encode a single logical qubit. Generating and maintaining such a large entangled state of thousands, tens of thousands, or even millions of physical qubits remains a key challenge for any practical implementation of the FBQC approach.

Figure 11B:
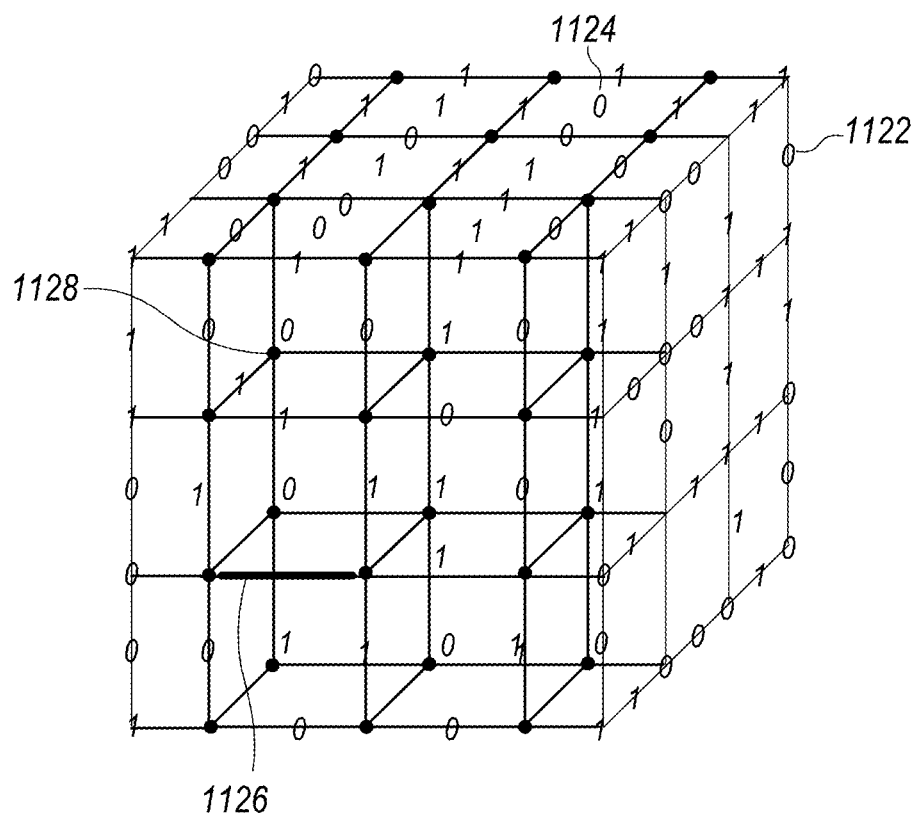
Figure 11C:
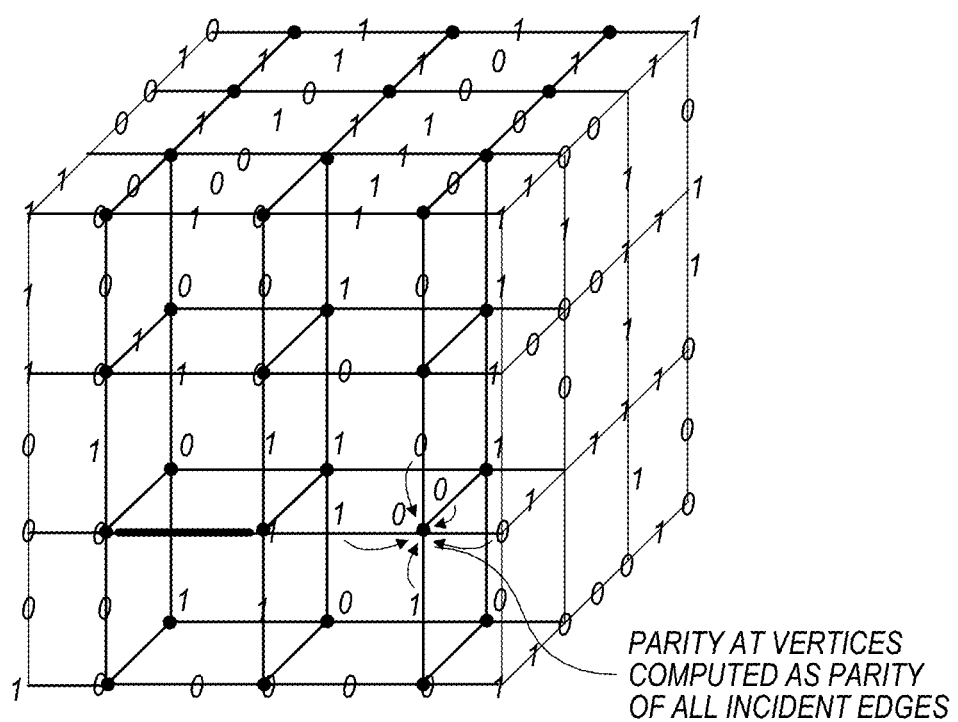

FIGS. 11B-11C illustrate how the decoding of a logical qubit could proceed for the case of a cluster state based on the Raussendorf lattice. As may be seen in FIG. 11A, the geometry of the cluster state is related to the geometry of a cubic lattice (e.g., with lattice cell 1120) shown superimposed on the cluster state in FIG. 11A. FIG. 11B shows the measurement results (also superimposed on the cubic lattice) after the state of each physical qubit of the cluster state has been measured, with the measurement results being placed in the former position of the physical qubit that was measured (for clarity only measurement results that result from measurements of the surface qubits are shown).

In some embodiments, a measured qubit state may be represented by a numerical bit value of either 1 or 0 after all qubits have been measured, e.g., in a particular basis such as the x-basis. As illustrated, qubits may be classified as one of two types, those that are located on the edges of a unit cell (e.g. edge qubit 1122), and those that are located on the faces of a unit cell (e.g., face qubit 1124). In some cases, a measurement of the qubit may not be obtained, or the result of the qubit measurement may be invalid (e.g., due to a failure or loss outcome). In these cases, there is no bit value assigned to the location of the corresponding measured qubit, but instead the outcome is an erasure, illustrated here as thick line 1126, for example. These measurement outcomes that are known to be missing may be reconstructed during the decoding procedure.

To identify errors in the physical qubits, a syndrome graph is generated from the collection of measurement outcomes resulting from the measurements of the physical qubits. For example, the bit values associated with a plurality of edge qubits may be combined to create a syndrome value associated with an adjacent vertex that results from the intersection of the respective edges, e.g., vertex 1128 as shown in FIG. 11B. A set of syndrome values (or "syndromes"), also referred to herein as parity checks, may be associated with each vertex of the syndrome graph, as shown in FIG. 11C. More specifically, in FIG. 11C, the computed values of some of the vertex parity checks of the syndrome graph are shown. Only the 12 syndrome values on the front face of the cluster state of FIG. 11C are illustrated as 0s and 1s. The parity check values may be found by computing the parity of the bit values associated with each edge of the syndrome graph incident to the vertex. In some embodiments, a parity computation entails determining whether the sum of the edge values is an even or odd integer, with the parity result being the result of the sum modulo 2. If no errors have occurred in the quantum state or in the qubit measurement, then all syndrome values should be even (or 0). On the contrary, if an error occurs, it may result in some odd (or 1) syndrome values. Only half of the bit values from the qubit measurements are associated with the syndrome graph shown in FIG. 11C (e.g., the bits aligned with the edges of the unit cells), and this illustrated syndrome graph is referred to herein as the "primal graph". There is another syndrome graph that is related to parity checks on all the bit values located on the faces of the unit cells of the lattice shown, and this graph is referred to as the "dual graph". There is generally an equivalent decoding problem on the syndrome values of the dual graph.

As mentioned above, the generation and subsequent storage of large cluster states of qubits may be a challenge. However, some embodiments, methods and systems described herein provide for the generation of a set of classical measurement data (e.g., a syndrome graph) that includes the necessary correlations for performing quantum error correction, without the need to first generate a large entangled state of qubits in an error correcting code. For example, embodiments disclosed herein described systems and method whereby two-qubit (i.e., joint) measurements may be performed on a collection of much smaller entangled states to generate a set of classical data that includes the long-range correlations necessary to generate the syndrome graph for a particular chosen cluster state, without the need to actually generate the cluster state. In other words, in some systems and methods described herein, there is only ever generated a collection of relatively small entangled states (referred to herein as resource states) and these resource states need not be all entangled together to form a new larger entangled state that is a quantum error correcting code (e.g., a topological code).

For example, as will be described in further detail below, in the case of linear optical quantum computing using a Raussendorf lattice structure, to generate the syndrome graph data, a destructive fusion gate may be applied to a collection of small entangled states (e.g., 4-GHZ states) that are themselves not entangled with each other and thus are never part of a larger Raussendorf lattice. Despite the fact that the individual resource states were not mutually entangled prior to the destructive fusion measurement, the measurement outcomes that result from the fusion measurements generate a syndrome graph that includes all the necessary correlations to perform quantum error correction. Such systems and methods are described in greater detail below and are referred to herein as Fusion Based Quantum Computing (FBQC).

1.5 Fusion Based Quantum Computing

Figure 12:
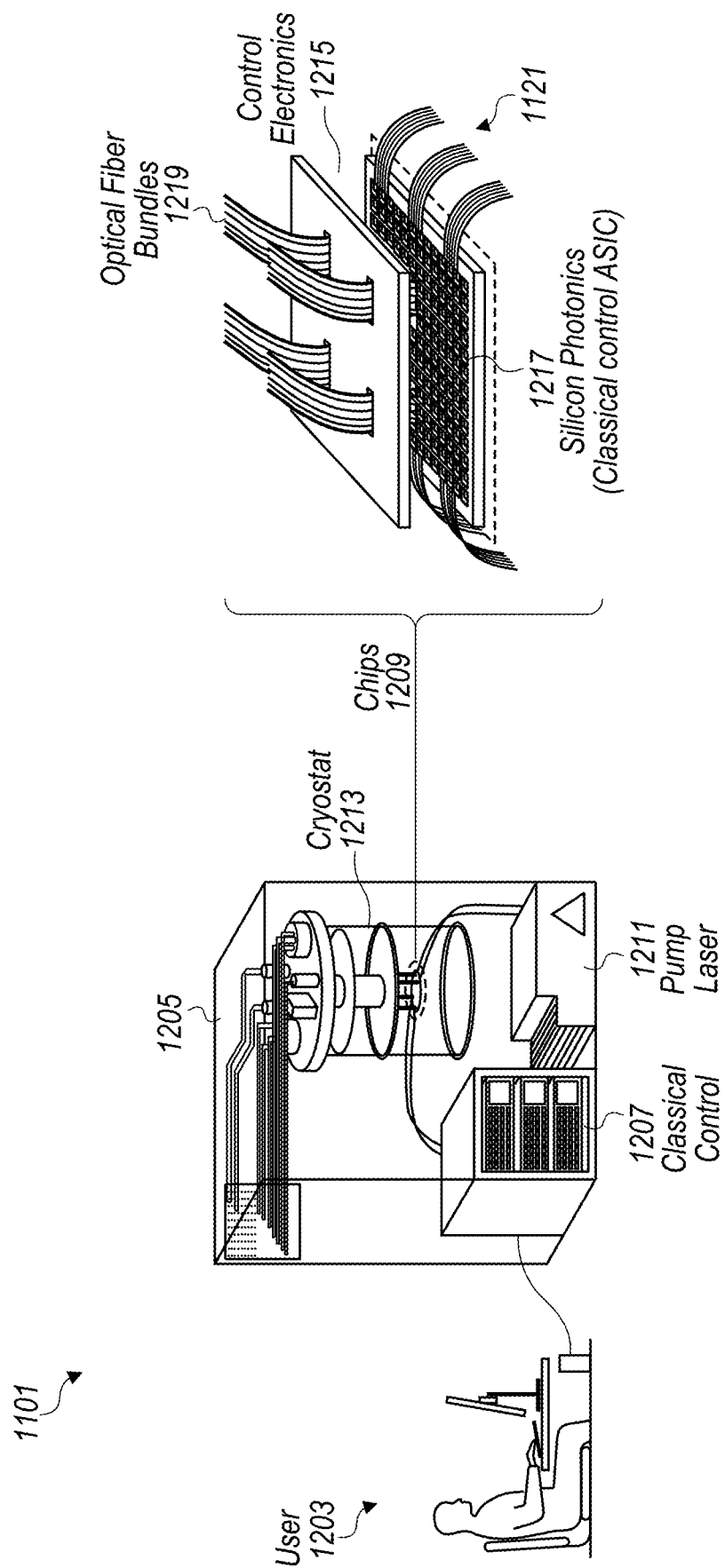
FIG. 12 shows a quantum computing system in accordance with one or more embodiments.

FIG. 12 shows a hybrid computing system in accordance with one or more embodiments. The hybrid computing system 1201 includes a user interface device 1203 that is communicatively coupled to a hybrid quantum computing (QC) sub-system 1205, described in more detail below in FIG. 13. The user interface device 1203 may be any type of user interface device, e.g., a terminal including a display, keyboard, mouse, touchscreen and the like. In addition, the user interface device may itself be a computer such as a personal computer (PC), laptop, tablet computer and the like. In some embodiments, the user interface device 1203 provides an interface with which a user may interact with the hybrid QC subsystem 1205. For example, the user interface device 1203 may run software, such as a text editor, an interactive development environment (IDE), command prompt, graphical user interface, and the like so that the user may program, or otherwise interact with, the QC subsystem to run one or more quantum algorithms. In other embodiments, the QC subsystem 1205 may be pre-programmed and the user interface device 1203 may simply be an interface where a user may initiate a quantum computation, monitor the progress, and receive results from the hybrid QC subsystem 1205. Hybrid QC subsystem 1205 may further include a classical computing system 1207 coupled to one or more quantum computing chips 1209. In some examples, the classical computing system 1207 and the quantum computing chip 1209 may be coupled to other electronic components 1211, e.g., pulsed pump lasers, microwave oscillators, power supplies, networking hardware, etc. In some embodiments that require cryogenic operation, the quantum computing system 1209 may be housed within a cryostat, e.g., cryostat 1213. In some embodiments, the quantum computing chip 1209 may include one or more constituent chips, e.g., hybrid electronic chip 1215 and integrated photonics chip 1217. Signals may be routed on- and off-chip any number of ways, e.g., via optical interconnects 1219 and via other electronic interconnects 1221. In addition, the hybrid computing system 1201 may employ a quantum computing process, e.g., fusion-based quantum computing (FBQC) that employs one or more cluster states of qubits as described in further detail herein.

Figure 13:
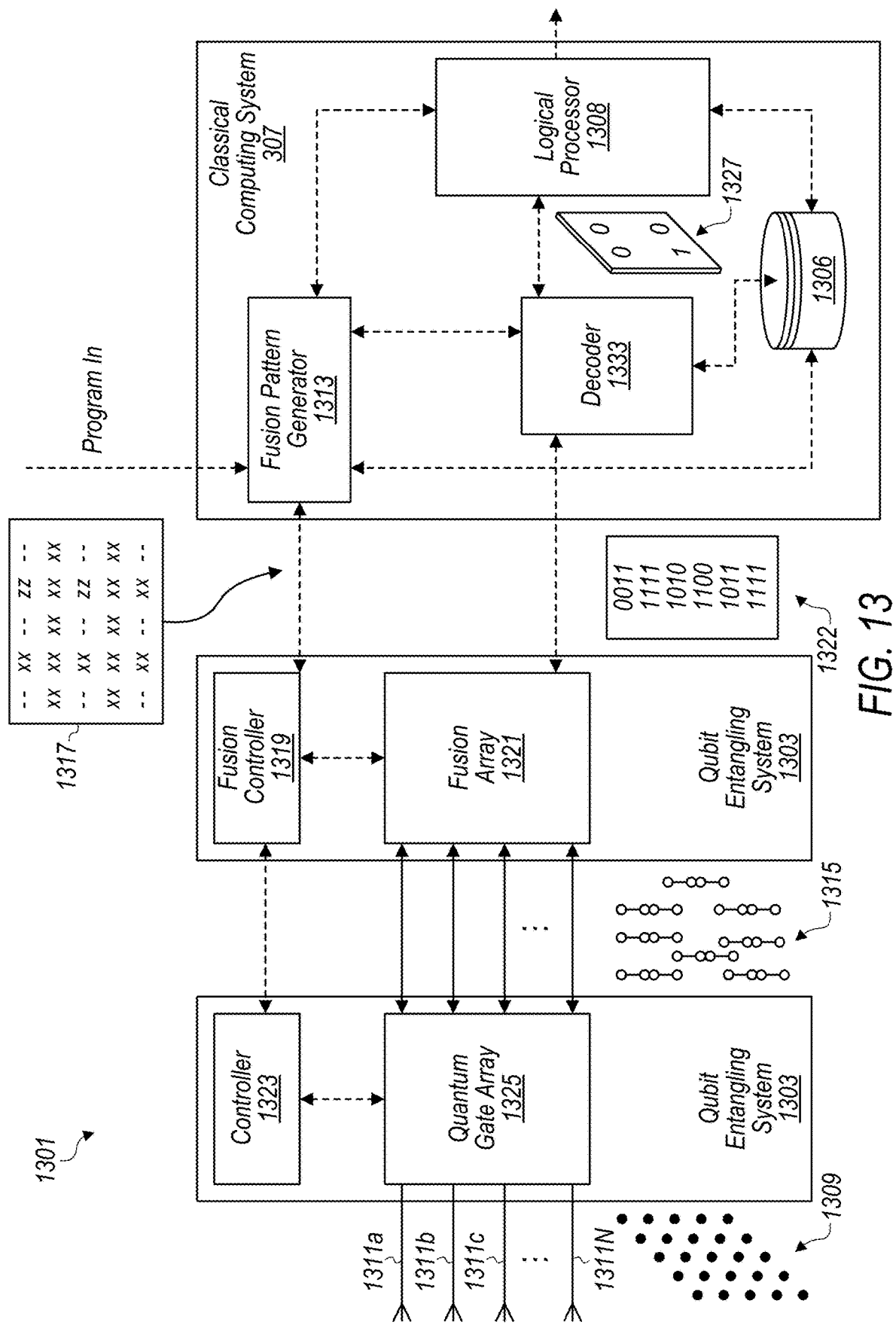
FIG. 13 is a schematic illustration of quantum computing system including a qubit fusion system in accordance with some embodiments.

FIG. 13 shows a block diagram of a QC system 1301 in accordance with some embodiments. Such a system may be associated with the computing system 1201 introduced above in reference to FIG. 12. In FIG. 13, solid lines represent quantum information channels and dashed lines represent classical information channels. The QC system 1301 includes a qubit entangling system 1303, qubit fusion system 1305, and classical computing system 1307. In some embodiments, the qubit entangling system 1303 takes as input a collection of N physical qubits, e.g., physical qubits 1309 (also represented schematically as inputs 1311*a*, 1311*b*, 1311*c*, . . . , 1311N) and generates quantum entanglement between two or more of them to generate entangled resource states 1315. For example, in the case of photonic qubits, the qubit entangling system 1303 may be a linear optical system such as an integrated photonic circuit that includes waveguides, beam splitters, photon detectors, delay lines, and the like. In some examples, the entangled resource states 1315 may be relatively small entangled states of qubits, (e.g., Bell states of two qubits, 3-GHZ states, 4-GHZ states, etc.) or may be small entangled states that are not large enough to operate as a quantum error correcting code. In some embodiments, the resource states are chosen such that the fusion operations applied to certain qubits of these states results in syndrome lattice data that includes the required correlations for quantum error correction. Advantageously, the system shown in FIG. 13 provides for fault tolerant quantum computation using relatively small resource states, without requiring that the resource states become mutually entangled with each other to form a lattice, cluster, or graph state prior to the final measurements.

In some embodiment, the input qubits 1309 may be a collection of quantum systems and/or particles and may be formed using any qubit architecture. For example, the quantum systems may be particles such as atoms, ions, nuclei, and/or photons. In other examples, the quantum systems may be other engineered quantum systems such as flux qubits, phase qubits, or charge qubits (e.g., formed from a superconducting Josephson junction), topological qubits (e.g., Majorana fermions), or spin qubits formed from vacancy centers (e.g., nitrogen vacancies in diamond). Furthermore, for the sake of clarity of description, the term "qubit" is used herein although the system may also employ quantum information carriers that encode information in a manner that is not necessarily associated with a binary bit. For example, qudits (i.e., quantum systems that encode information in more than two quantum states) may be used in accordance with some embodiments.

In accordance with some embodiments, the QC system 1301 may be a fusion-based quantum computer. For example, a software program (e.g., a set of machine-readable instructions) that represents the quantum algorithm to be run on the QC system 1301 may be passed to a classical computing system 1307 (e.g., corresponding to system 1208 in FIG. 12 above). The classical computing system 1307 may be any type of comping device such as a PC, one or more blade servers, and the like, or even a high-performance computing system such as a supercomputer, server farm, and the like. Such a system may include one or more processors (not shown) coupled to one or more computer memories, e.g., memory 1306. Such a computing system will be referred to herein as a "classical computer." In some examples, the software program may be received by a classical computing module, referred to herein as a fusion pattern generator 1313. One function of the fusion pattern generator 1313 is to generate a set of machine-level instructions from the input software program (which may originate as code that may be more easily written by a user to program the quantum computer). In some embodiments, the fusion pattern generator 1313 operates as a compiler for software programs to be run on the quantum computer. Fusion pattern generator 1313 may be implemented as pure hardware, pure software, or any combination of one or more hardware or software components or modules. In various embodiments, fusion pattern generator 1313 may operate at runtime or in advance; in either case, machine-level instructions generated by fusion pattern generator 1313 may be stored (e.g., in memory 1306). In some examples, the compiled machine-level instructions take the form of one or more data frames that instruct, for a given clock cycle, the qubit fusion system 1305 to make one or more fusions between certain qubits from the separate, mutually unentangled resource states 1315. For example, fusion pattern data frame 1317 is one example of the set of fusion measurements (e.g., type two fusion measurements) that should be applied between certain pairs of qubits from different entangled resource states 1315 during a certain clock cycle as the program is executed. In some embodiments, several fusion pattern data frames 1317 may be stored in memory 1306 as classical data. In some embodiments, the fusion pattern data frames 1317 may dictate whether or not XX Type II Fusion is to be applied (or whether any other type of fusion, or not, is to be applied) for a particular fusion gate within the fusion array 1321 of the qubit fusion system 1305. In addition, the fusion pattern data frames 1317 may indicate that the Type II fusion is to be performed in a different basis, e.g., XX, XY, ZZ, etc.

A fusion controller circuit 1319 of the qubit fusion system 1205 may receive data that encodes the fusion pattern data frames 1317 and, based on this data, may generate configuration signals, e.g., analog and/or digital electronic signals, that drive the hardware within the fusion array 1321. For example, for the case of photonic qubits, the fusion gates may include photon detectors coupled to one or more waveguides, beam splitters, interferometers, switches, polarizers, polarization rotators and the like. More generally, the detectors may be any detector that can detect the quantum states of one or more of the qubits in the resource states 1315. One of ordinary skill will appreciate that many types of detectors may be used depending on the particular qubit architecture being employed In some embodiments, the result of applying the fusion pattern data frames 1317 to the fusion array 1321 is the generation of classical data (generated by the fusion gates' detectors) that is read out, and optionally pre-processed, and sent to decoder 1333. More specifically, the fusion array 1321 may include a collection of measuring devices that implement the joint measurements between certain qubits from two different resource states and generate a collection of measurement outcomes associated with the joint measurement. These measurement outcomes may be stored in a measurement outcome data frame, e.g., data frame 1322 and passed back to the classical computing system for further processing.

In some embodiments, any of the submodules in the QC system 1301, e.g., controller 1323, quantum gate array 1325, fusion array 1321, fusion controller 1319, fusion pattern generator 1313, decoder 1323, and logical processor 1308 may include any number of classical computing components such as processors (CPUs, GPUs, TPUs) memory (any form of RAM, ROM), hard coded logic components (classical logic gates such as AND, OR, XOR, etc.) and/or programmable logic components such as field programmable gate arrays (FPGAs and the like). These modules may also include any number of application specific integrated circuits (ASICs), microcontrollers (MCUs), systems on a chip (SOCs), and other similar microelectronics.

In some embodiments, the entangled resource states 1315 may be any type of entangled resource state, that, when the fusion operations are performed, produces measurement outcome data frames that include the necessary correlations for performing fault tolerant quantum computation. While FIG. 13 shows an example of a collection of identical resource states, a system may be employed that generates many different types of resource states and may even dynamically change the type of resource state being generated based on the demands of the quantum algorithm being run. As described herein, the logical qubit measurement outcomes 1327 may be fault tolerantly recovered, e.g., via decoder 1333, from the measurement outcomes 1322 of the physical qubits. Logical processor 1308 may then process the logical outcomes as part of the running of the program. As shown, the logical processor may feed back information to the fusion pattern generator 1313 for affect downstream gates and/or measurements to ensure that the computation proceeds fault tolerantly.

Figure 14:
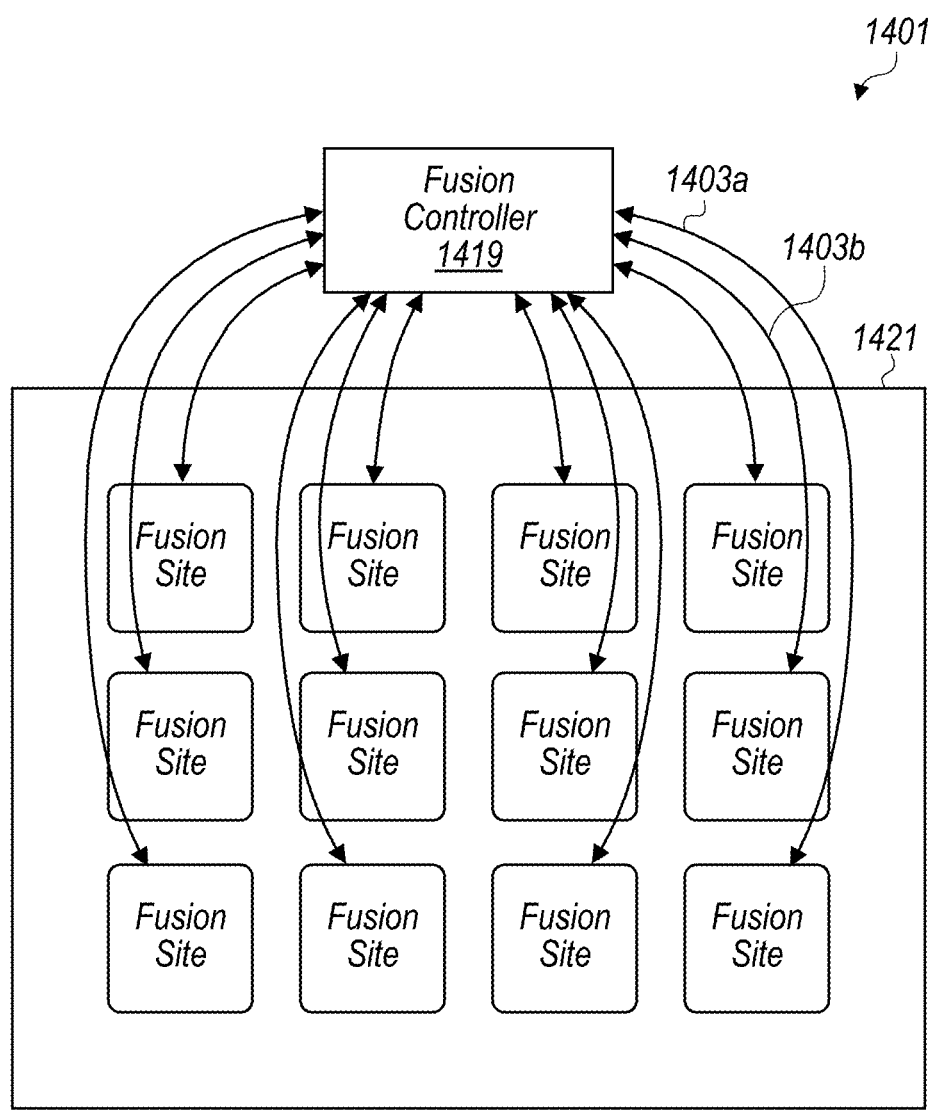
FIG. 14 shows one example of qubit fusion system in accordance with some embodiments.

FIG. 14 shows one example of qubit fusion system 1401 in accordance with some embodiments. In some embodiments, qubit fusion system 1401 may be employed within a larger FBQC system such as qubit fusion system 1305 shown in FIG. 13.

Qubit fusion system 1401 includes a fusion controller 1419 that is coupled to a fusion array 1421. Fusion controller 1419 is configured to operate as described above in reference to fusion controller circuit 1319 of FIG. 13 above. Fusion array 1421 includes a collection of fusion sites that each receive two or more qubits from different resource states (not shown) and perform one or more fusion operations (e.g., Type II fusion) on selected qubits from the two or more resource states. The fusion operations performed on the qubits may be controlled by the fusion controller 1419 via signals that are sent from the fusion controller 1419 to each of the fusion gates via control channels 1403a, 1403b, etc. Based on the joint measurements performed at each fusion site, classical measurement outcomes in the form of classical data are output and then provided to a decoder system, as shown and described above in reference to FIG. 13. Examples of photonic circuits that may be employed as Type II fusion gates are described below.

Figure 15:
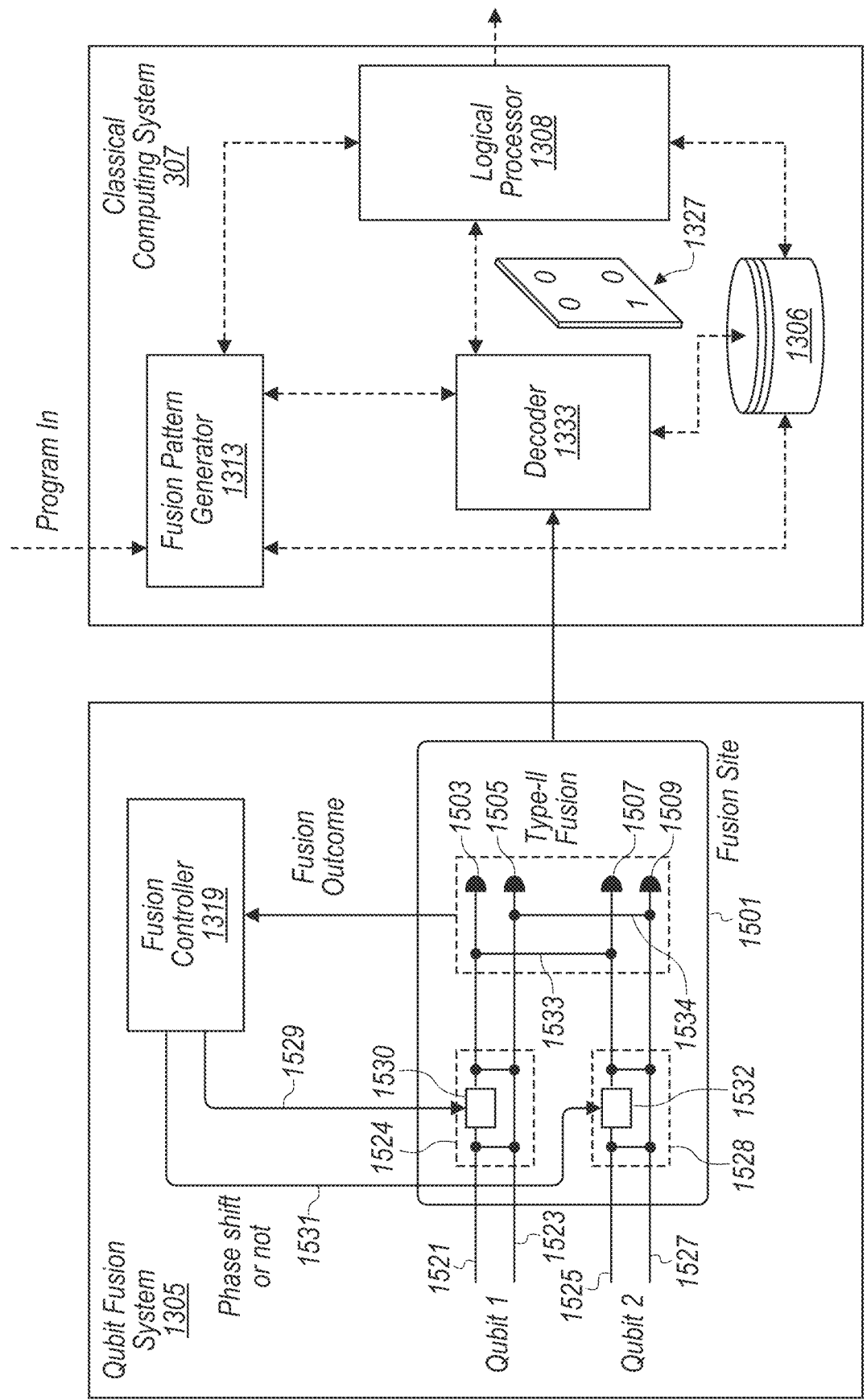
FIG. 15 shows one possible example of a fusion site as configured to operate with a fusion controller to provide measurement outcomes to a decoder for fault tolerant quantum computation in accordance with some embodiments.

FIG. 15 shows one possible example of a fusion site 1501 as configured to operate with a fusion controller 1319 to provide measurement outcomes to a decoder for fault tolerant quantum computation in accordance with some embodiments. In this example, fusion site 1501 may be an element of fusion array 1321 (shown in FIG. 13), and although only one instance is shown for purposes of illustration, fusion array 1321 may include any number of instances of fusion sites 1501.

As described above, the qubit fusion system 1305 may receive two or more qubits (Qubit 1 and Qubit 2) that are to be fused. Qubit 1 is one qubit that is entangled with one or more other qubits (not shown) as part of a first resource state and Qubit 2 is another qubit that is entangled with one or more other qubits (not shown) as part of a second resource state. Advantageously, in contrast to ordinary fusion-based quantum computing, none of the qubits from the first resource state need be entangled with any of the qubits from the second (or any other) resource state in order to facilitate a fault tolerant quantum computation. Also advantageously, at the inputs of a fusion site 1501, the collection of resource states are not mutually entangled to form a cluster state that takes the form of a quantum error correcting code and thus there is no need to store and or maintain a large cluster state with long-range entanglement across the entire cluster state. Also advantageously, the fusion operations that take place at the fusion sites are fully destructive joint measurements between Qubit 1 and Qubit 2 such that all that is left after the measurement is classical information representing the measurement outcomes on the detectors, e.g., detectors 1503, 1505, 1507, 1509. At this point, the classical information is all that is needed for the decoder 333 to perform quantum error correction, and no further quantum information is propagated through the system. This may be contrasted with an FBQC system that might employ fusion sites to fuse resource states into a cluster state that serves as a topological code and only then generates the required classical information via single particle measurements on each qubit in the large cluster state. In such an FBQC system, not only does the large cluster state need to be stored and maintained but an extra single particle measurement step needs to be applied, in addition to the fusions used to generate the cluster state, to every qubit of the cluster state in order to generate the classical information necessary for the decoder to perform quantum error correction.

FIG. 15 shows an illustrative example for one way to implement a fusion site as part of a photonic quantum computer architecture, according to some embodiments. In this example, qubit 1 and qubit 2 may be dual rail encoded photonic qubits. Accordingly, qubit 1 and qubit 2 are input on waveguides 1521, 1523 and 1525, 1527, respectively. An interferometer 1524, 1528 may be placed in line with each qubit, and within one arm of each interferometer 1524, 1528 a programmable phase shifter 1530, 1532 may be applied to affect the basis in which the fusion operation is applied, e.g., XX, XY, YY, ZZ, etc.). The programmable phase shifters 1530, 1532 may be coupled to the fusion controller 1319 via control line 1529 and 1531 such that signals from the fusion controller 1319 may be used to set the basis in which the fusion operation is applied to the qubits. For example, the programmable phase shifters may be programmable to either apply or not apply a Hadamard gate to their respective qubits, altering the basis (e.g., x vs. z) of the type II fusion measurement. In some embodiments the basis may be hard-coded within the fusion controller 1319, or in some embodiments the basis may be chosen based upon external inputs, e.g., instructions provided by the fusion pattern generator 1313. In particular, in some embodiments, adaptive basis selection may be employed, wherein the basis of each fusion measurement is selected based on the results of one or more previous fusion measurements. Additional mode couplers, e.g., mode couplers 1533 and 1532 may be applied after the interferometers followed by single photon detectors 1503, 1505, 1507, 1509 to provide a readout mechanism for performing the joint measurement. In the example shown in FIG. 15, the fusion site implements an un-boosted Type II fusion operation on the incoming qubits. One of ordinary skill will appreciate that any type of fusion operation may be applied (and may be boosted or un-boosted) without departing from the scope of the present disclosure. In some embodiments, the fusion controller 1319 may also provide a control signal to the detectors 1503, 1505, 1507, 1509. A control signal may be used, e.g., for gating the detectors or for otherwise controlling the operation of the detectors. Each of the detectors 1503, 1505, 1507, 1509 provides one bit of information (representing a "photon detected" or "no photon detected" state of the detector), and these four bits may be preprocessed at the fusion site 1501 to determine a measurement outcome (e.g., fusion success or not) or passed directly to the decoder 1333 for further processing.

Success, Failure, and Loss Measurement Outcomes

Several different measurement outcomes may result from a fusion measurement. As one example, a fusion measurement may be a joint measurement on qubit 1 and qubit 2 to measure a) the product of their qubit values in the x-basis (i.e., $X_1 X_2$), and b) the product of their qubit values in the z-basis (i.e., $Z_1 Z_2$). Two respective edges of the primal and dual syndrome graphs may correspond to each of these joint measurement results.

As a first possibility, if the fusion measurement is a "success", then both of these values will be returned as a result of the dual-qubit fusion measurement. However, even in the absence of photon loss, linear optic fusion does not always produce this result.

As a second possibility (termed herein a "failure"), instead of measuring $X_1 X_2$ and $Z_1 Z_2$, the two-qubit fusion measurement may measure $Z_1$ and $Z_2$. In this case, the measurement outcome may be used to deduce $Z_1 Z_2$ (e.g., by multiplying $Z_1$ and $Z_2$), but may not be able to deduce $X_1X_2$ (e.g., because a definite value of $Z_1$ and $Z_2$ may correspond to either of a positive or negative value for the product $X_1X_2$). Accordingly, the edge in one of the graphs (e.g., the primal graph) corresponding to the $Z_1Z_2$ measurement will be successfully measured, while the edge in the other graph (e.g., the dual graph) corresponding to the $X_1X_2$ measurement will be erased. In this example, the fusion measurement is said to be performed with a failure basis of $X_1X_2$. In other words, the "failure basis" refers to the measurement outcome that risks erasure for a particular fusion measurement. In general, each of the primal and dual graphs contain edges corresponding to both $Z_1Z_2$ and $X_1X_2$ measurements, and a successful $Z_1Z_2$ measurement may measure either a primal or dual graph edge, depending on the particular edge being measured. If a Hadamard gate is applied to the dual-rail photonic system, the measurement basis may be altered such that $X_1$ and $X_2$ are measured in a failure outcome (i.e., rather than $Z_1$ and $Z_2$). In this case, $X_1$ and $X_2$ may be used to deduce the product $X_1X_2$, but the edge corresponding to the $Z_1Z_2$ measurement will be erased.

As a third possibility (termed herein a "loss"), one or both of the dual-rail photons may tunnel out and not be detected at all. In this case, since one or both of the dual-rail photons is missing, neither $X_1X_2$ or $Z_1Z_2$ will be measured, and both edges will be erased.

1.5.1 Syndrome Graphs in FBQC

FIGS. 16A-E illustrate various aspects and elements of syndrome graphs in an FBQC scheme for fault tolerant quantum computation, in accordance with one or more embodiments. In the examples shown in FIGS. 16A-E, a topological code utilizing 6-qubit cluster states is used. However, more generally any other error correcting code may be used without departing from the scope of the present disclosure. FBQC may be implemented using any type of code, e.g., various volume codes (such as the diamond code, triamond code, etc.), and various color codes, or other topological codes may be used without departing from the scope of the present disclosure.

Figure 16A:
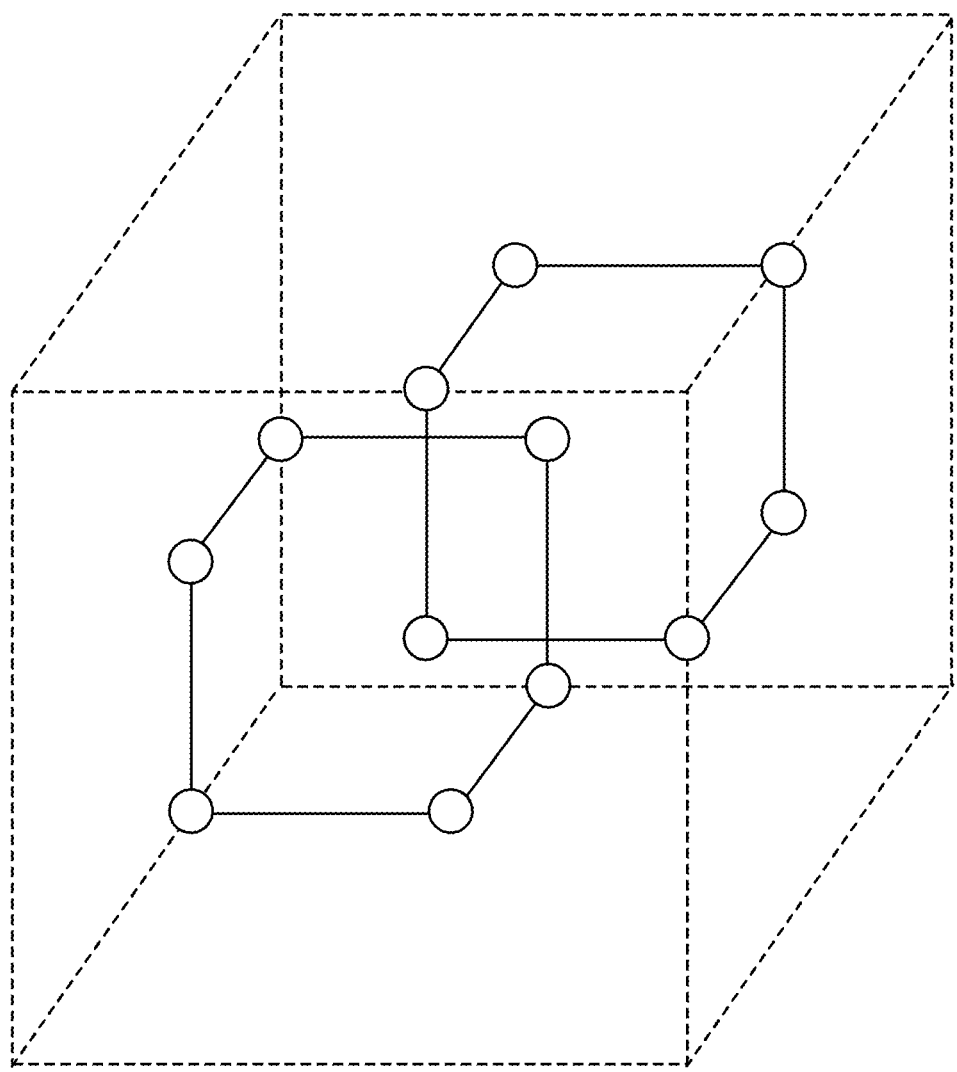
FIGS. 16A-B illustrate resource states and unit cells for fault tolerant quantum computation in accordance with one or more embodiments.
Figure 16B:
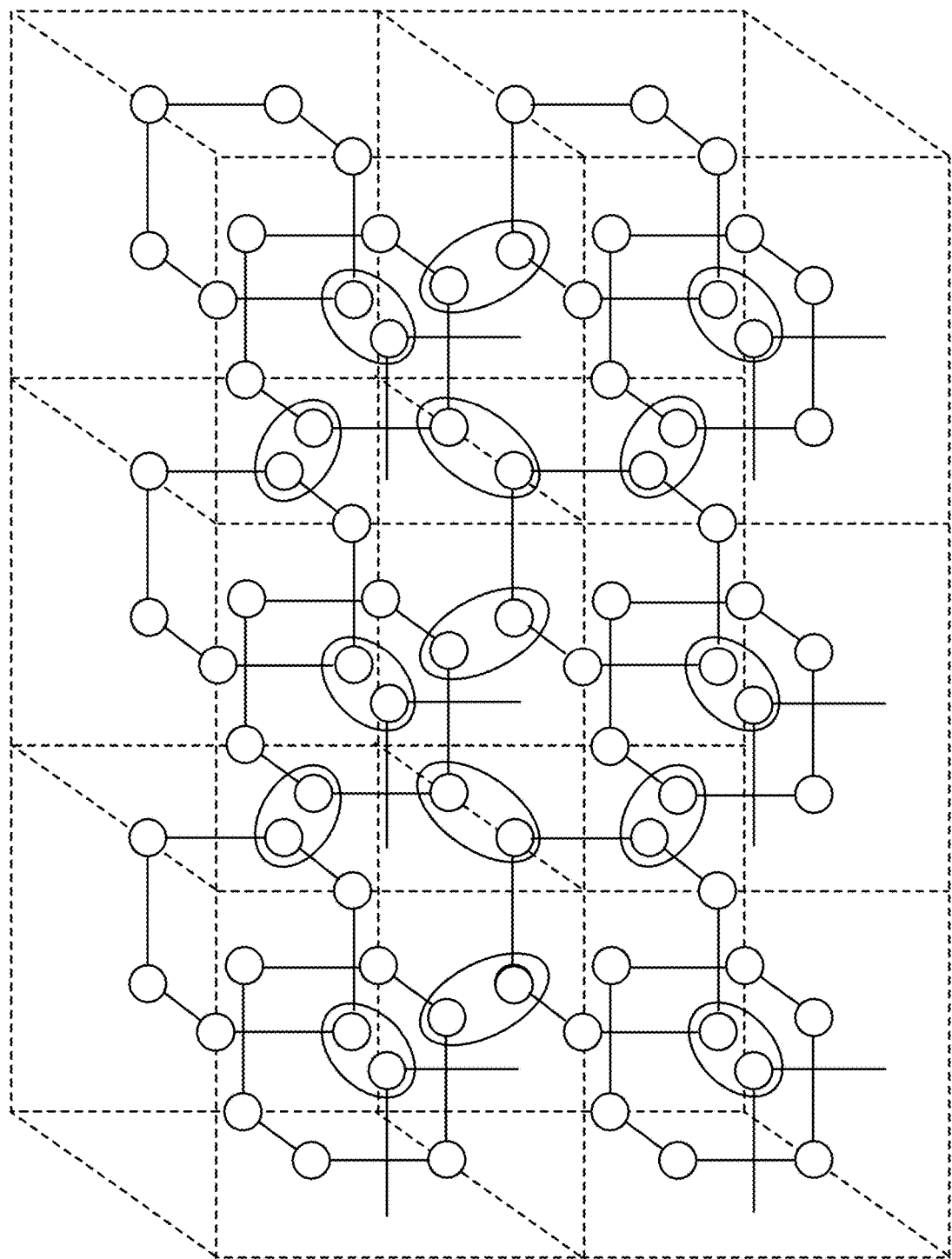

In FBQC, through a series of joint measurements on two or more qubits (e.g., measurements of a positive-operator valued measure, also referred to as a POVM), a set of classical data may be generated that corresponds to the error syndrome of a quantum error correcting code. FIG. 16A illustrates two 6-qubit resource states within a unit cell of a lattice, where the circles represent individual qubits, the lines connecting the qubits represent entanglement between respective qubits, and the dashed lines delineate the boundary of the unit cell. Using a plurality of unit cells with resource states as illustrated in FIG. 16A, a set of measurements that may be used to generate a syndrome graph value is shown in FIG. 16B. As illustrated, the indicated sets of 6 qubits are used as resource states and the illustrated pairings between neighboring qubits of two different resource states represent fusion measurements on the respective neighboring qubits. FIG. 16B illustrates resource states and fusion measurements for several unit cells, where the lattice extends in three dimensions. For clarity, only one repetition is illustrated in the dimension coming out of the page, with a subset of the fusions along that dimension shown. However, FIG. 16B is illustrative only, and the actual lattice implemented according to embodiments herein may extend significantly farther in one, two, or three dimensions. For example, typically each of the 6 qubits of each of the plurality of resource states will be involved in a fusion measurement. However, for clarity, only those fusion measurements are shown where both of the involved qubits are visible in the truncated lattice illustrated in FIG. 16B. In order to generate a desired error syndrome, a lattice preparation protocol (LPP) is chosen that generates the appropriate syndrome lattice from the fusions of the multiple smaller entangled states, referred to herein as resource states.

Figure 16C:
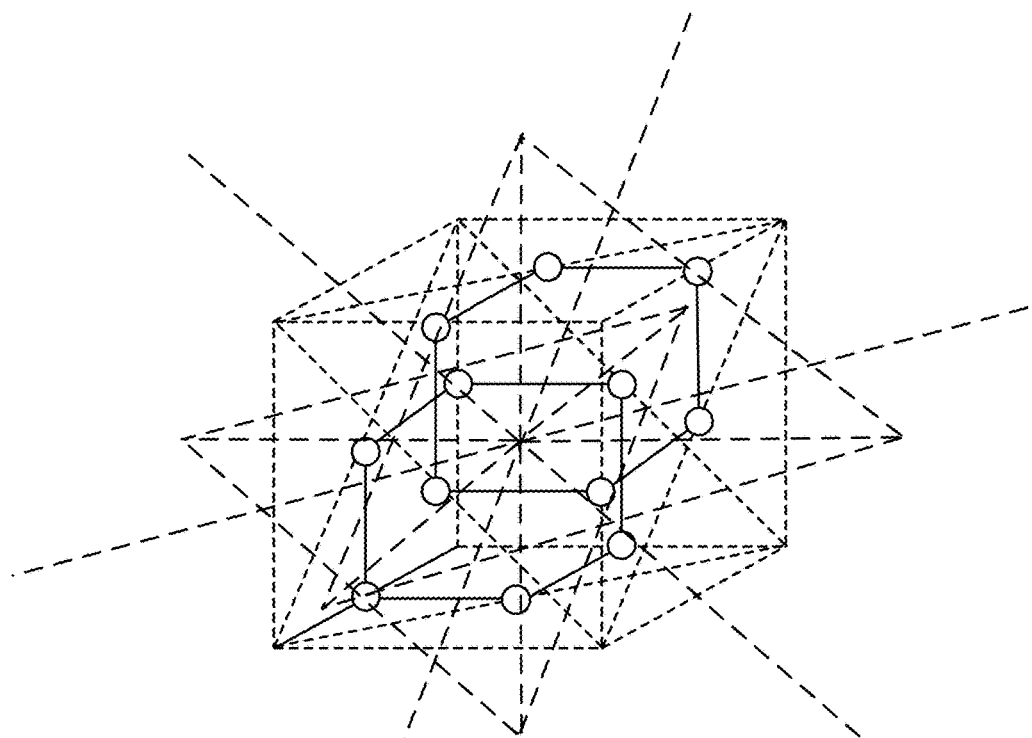
Figure 16D:
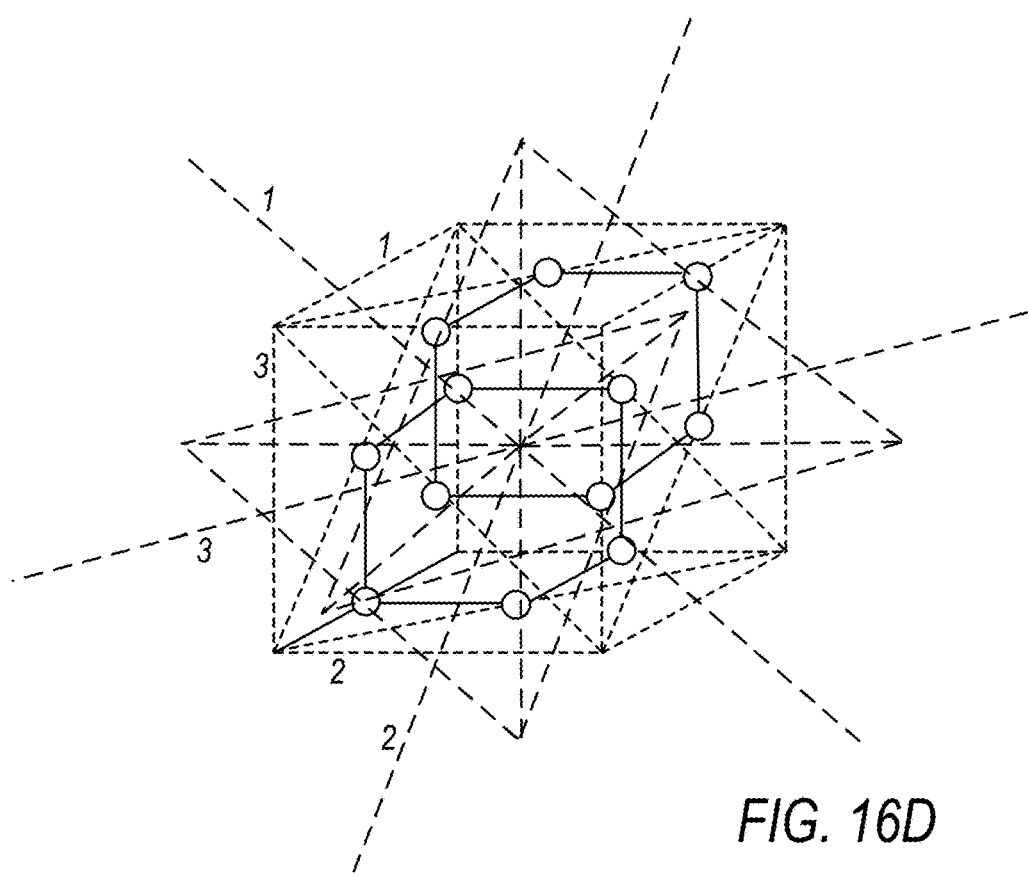

FIG. 16C illustrates two resource states in a unit cell (solid lines) with the primal and dual syndrome graph edges indicated with short dotted lines and long dotted lines, respectively. The dual syndrome graph is geometrically identical to the primal syndrome graph, except that it is shifted in the three Cartesian directions by half of the unit cell distance, relative to the primal syndrome graph. FIG. 16D additionally illustrates correspondence between several primal and dual graph edges. Primal and dual measurements coming from the same fusion measurement have the same midpoint and are paired, and several examples of pairings between primal and dual syndrome graph edges are illustrated numerically in FIG. 16D (e.g., (1,1), (2,2) and (3,3)).

In some embodiments, the fusion measurements on pairs of qubits are sequentially executed in a predetermined fusion measurement sequence until each qubit pair has been measured. Similar to the description above in reference to FIGS. 11A-C, the results of each fusion measurement may be used to populate values in each of a primal and dual syndrome graph corresponding to the set of resource states. FIG. 16E illustrates several unit cells of the primal syndrome graph (left) and dual syndrome graph (right) that correspond to the resource states illustrated in Figure B. Note that the dual syndrome graph in FIG. 16E is rotated relative to the primal syndrome graph for ease of visualization. Further note that, in these embodiments, the syndrome graph is self-dual such that the primal and dual syndrome graphs have the same topological structure. For each sequential fusion measurement, an edge value will be determined for and edge in each of the primal and dual syndrome graphs. Depending on the result of the fusion measurement, the edge value may be either successfully measured or erased. To avoid an overall logical error in the logical qubit encoded by the set of resource states, it is desirable to avoid a contiguous chain of erased edges that spans the overall lattice, in either the primal or dual syndrome graph. Embodiments herein present methods and devices for selectively adjusting the basis for performing the fusion measurements to reduce the likelihood of obtaining such a lattice-spanning chain of erasures (and thereby obtaining an overall logical error).

As used herein, the term "edge" is intended to refer to an edge in either the primal syndrome graph or the dual syndrome graph. An edge may have one of three edge values: it may be unmeasured, successfully measured, or erased. An erased edge may result from either a failed measurement or a photon loss, as explained in greater detail below.

1.5.2 FIGS. 17A-D—Connected Components—2D Example

FIG. 17A-D are simplified diagrams of 2-dimensional syndrome graphs illustrating the relationship between the primal and dual graphs during a sequence of fusion measurements. Actual implementations of FBQC will typically employ 3-dimensional syndrome graphs. However, the essential concepts of primal/dual correspondence and connected components may be more easily visualized and explained in the context of a 2-dimensional syndrome graph. It may be appreciated by one of skill in the art that the concepts introduced herein for a connected component in the context of a 2D syndrome graph may be generalized to apply to a 3D syndrome graph.

Figure 17A:
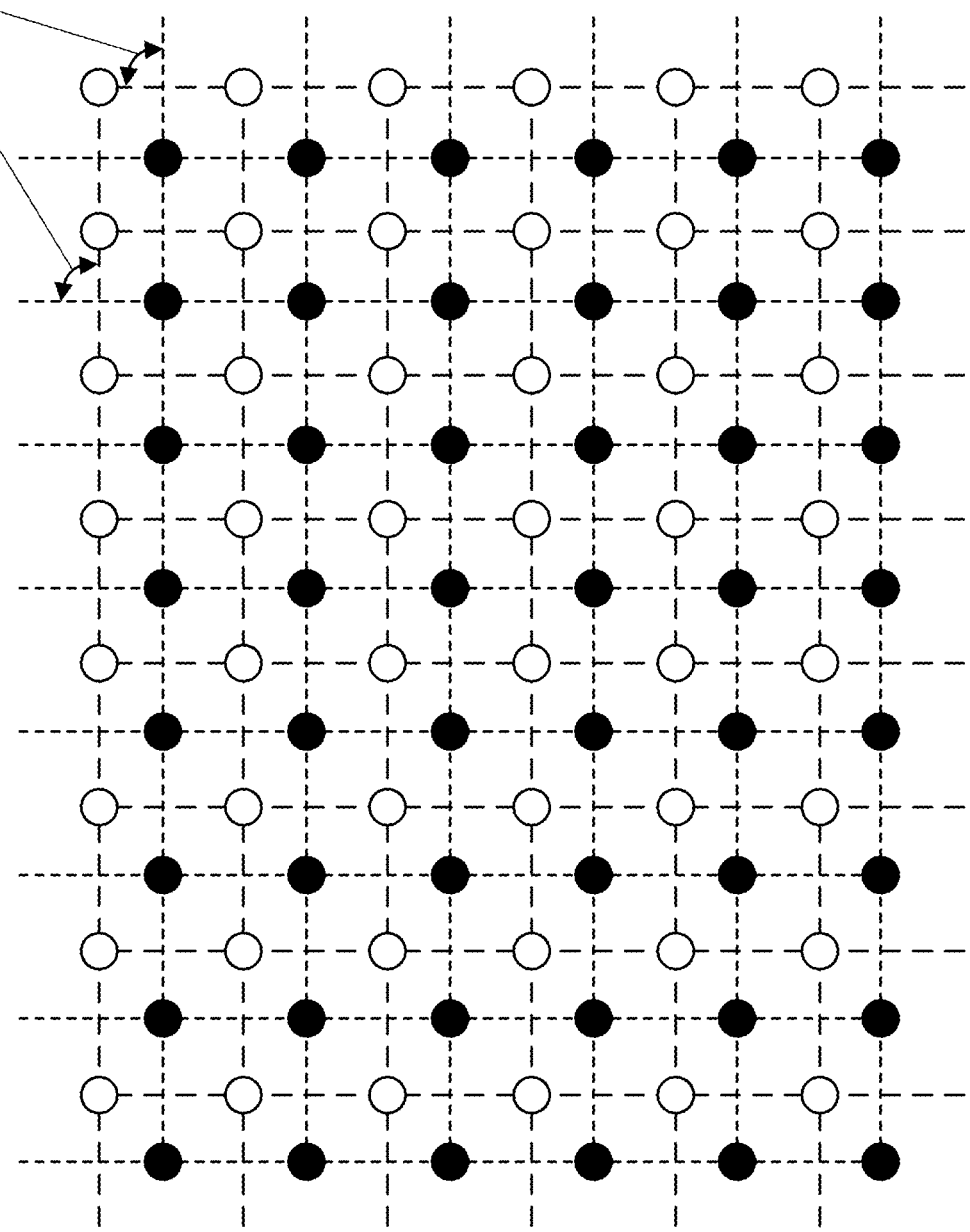
FIGS. 17A-D illustrate connected components of primal and dual syndrome graphs in two dimensions in accordance with some embodiments.

FIG. 17A illustrates an overlay of an example 2D primal syndrome graph (dotted lines) and a 2D dual syndrome graph (dashed lines). Solid circles connected to dotted lines are syndrome values of the primal graph, whereas solid circles connected to dashed lines are syndrome values of the dual graph. Note that the solid circles of FIGS. 17A-D are entirely different from the open circles shown in FIGS. 16A-E, which designate qubits. As explained above in reference to FIGS. 11A-C, syndrome values may be calculated by performing a parity check once all of the syndrome graph edges connected to the syndrome value have been measured. A single fusion measurement will measure both a single edge in the primal graph and a single corresponding edge in the dual graph, two examples of which are shown in FIG. 17A. More generally, each primal edge and dual edge pair that intersects at their midpoint will have both edges measured by a single fusion measurement.

Figure 17B:
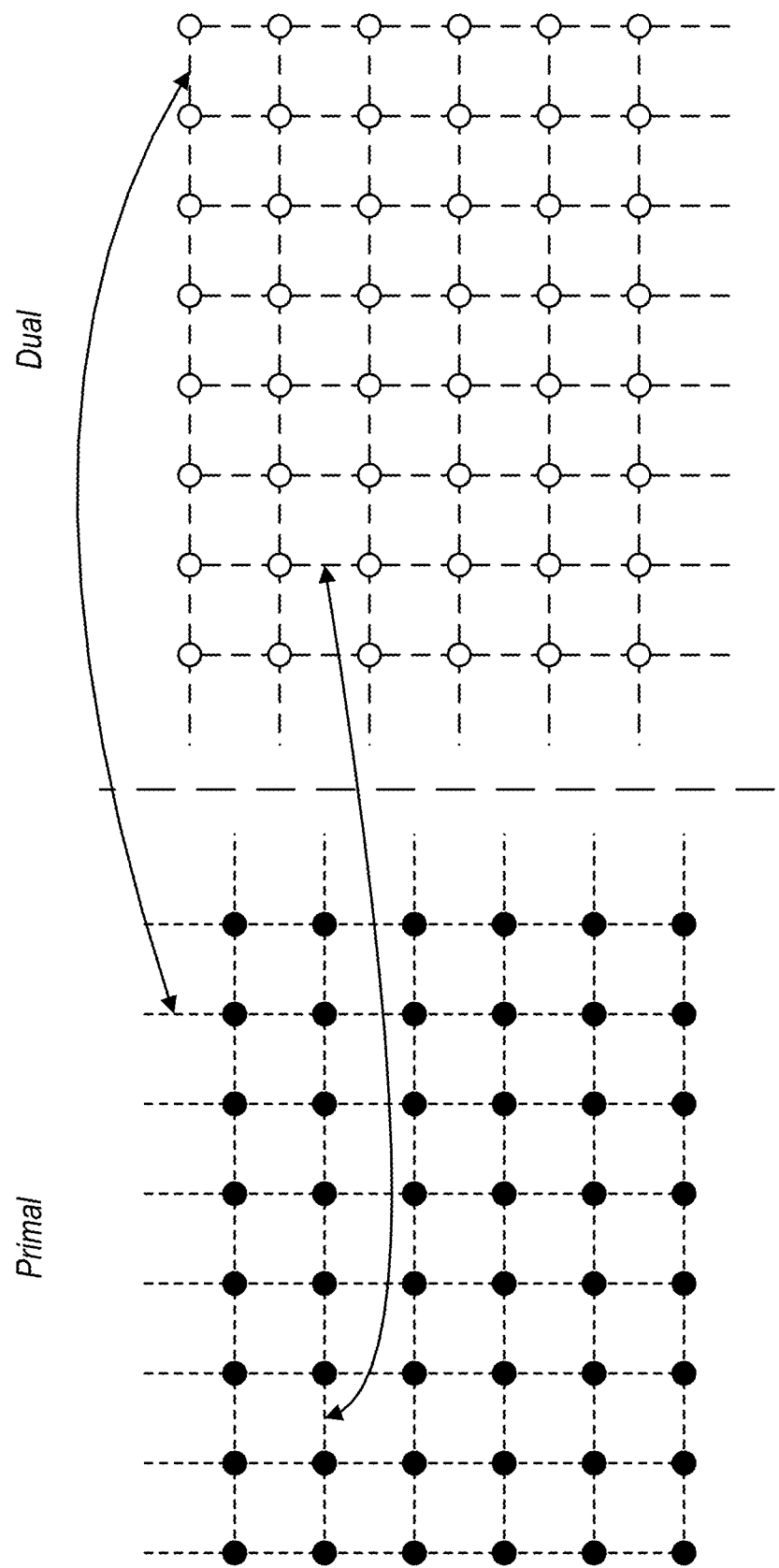

FIG. 17B illustrates the same syndrome graphs as FIG. 17A, but with the lattices separated for clarity. The arrows illustrate the correspondence between two sets of primal/dual edges, where the two edges indicated by an arrow will be measured by a single fusion measurement.

Figure 17C:
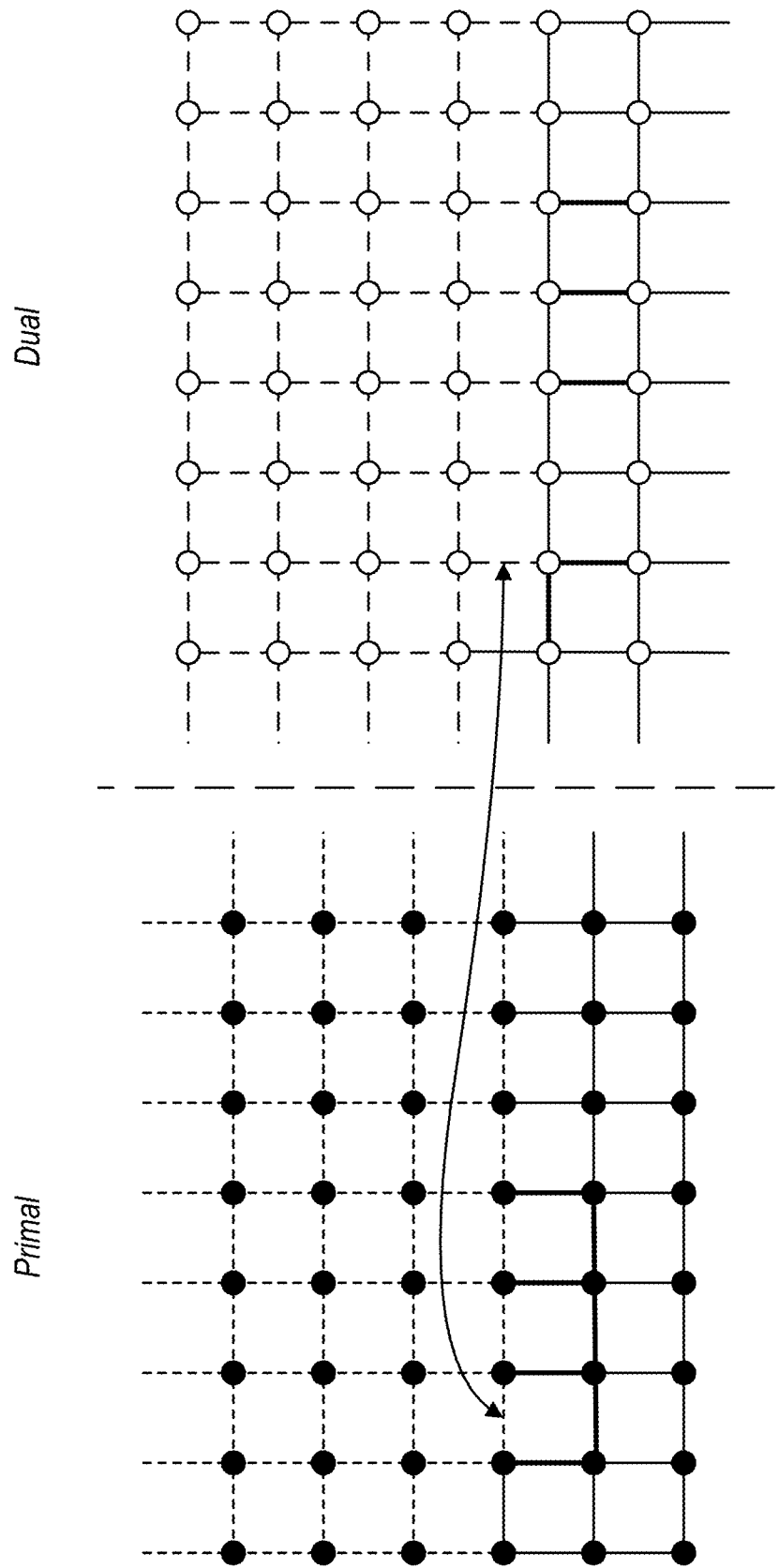

FIG. 17C illustrates the same syndrome graphs as FIGS. 17A-17B after a subset of the sequence of fusion measurements have been performed. As illustrated, bold solid black edges indicate that the fusion measurement resulted in an erasure, whereas non-bold solid edges indicate that the fusion measurement was successful. Unmeasured edges are indicated with dashed lines. For clarity, primal and dual edges are not distinguished by line type in FIGS. 17C-D, rather, they are separated (left and right, respectively).

As used herein, the term "connected component" refers to any contiguous set of erased edges in either the primal or dual syndrome graph. For example, a connected component composed of seven erased edges is shown in the primal graph on the left side of FIG. 17C, whereas the dual graph shown on the right side of FIG. 17C has a larger number of smaller connected components (e.g., 4 connected components of size two, one, one, and one). An edge may be erased by either a loss measurement result or a failed measurement result. As used herein, any node that is connected to an edge of a connected component is considered to be "within" the connected component.

In the example shown in FIG. 17C, the subsequent fusion measurement to be performed involves the two edges indicated by the double-headed arrow (one primal edge and one dual edge). According to embodiments herein, the basis for performing this fusion measurement may be selected based on the results of previous fusion measurements. The basis may be selected to reduce the likelihood of the entire sequence of fusion measurements resulting in a connected component that spans the lattice, thus reducing the likelihood of an overall logical error. A failure outcome will result in one of the primal or dual edges involved in the measurement being erased, and the basis for performing the fusion measurement may be selected to determine which of the involved primal or dual edge will be erased in the event of a failure outcome. In other words, the basis may be selected to determine which of the involved primal or dual edge will risk erasure in the event of a failure result. Of course, a successful outcome will successfully measure both of the involved primal and dual edges. While a loss outcome of a fusion measurement will erase both edges, a loss outcome is relatively less common than either a success outcome or a failure outcome. Accordingly, as shown in the numerical examples given below in reference to FIGS. 21-22, performing adaptive basis selection to selectively allocate erasures from failure results to either the primal or dual graph may substantially improve the fault tolerance of the FBQC code.

In the example shown in FIG. 17C, the two ends of the primal edge involved in the fusion measurement are part of the same connected component. Accordingly, an erasure of this primal edge will not increase the likelihood of an overall logical error, and it may be desirable to select the basis for the fusion measurement such that this primal edge is risked. Said another way, in some embodiments, in this case the failure basis is selected such that the dual edge is successfully measured and primal edge is erased in the case of a failure result. This is an example of a "trivial" decision where an erasure of one edge involved in the fusion measurement does not increase the likelihood of a lattice-spanning connected component, so that the basis is selected to risk erasure for this edge.

Figure 17D:
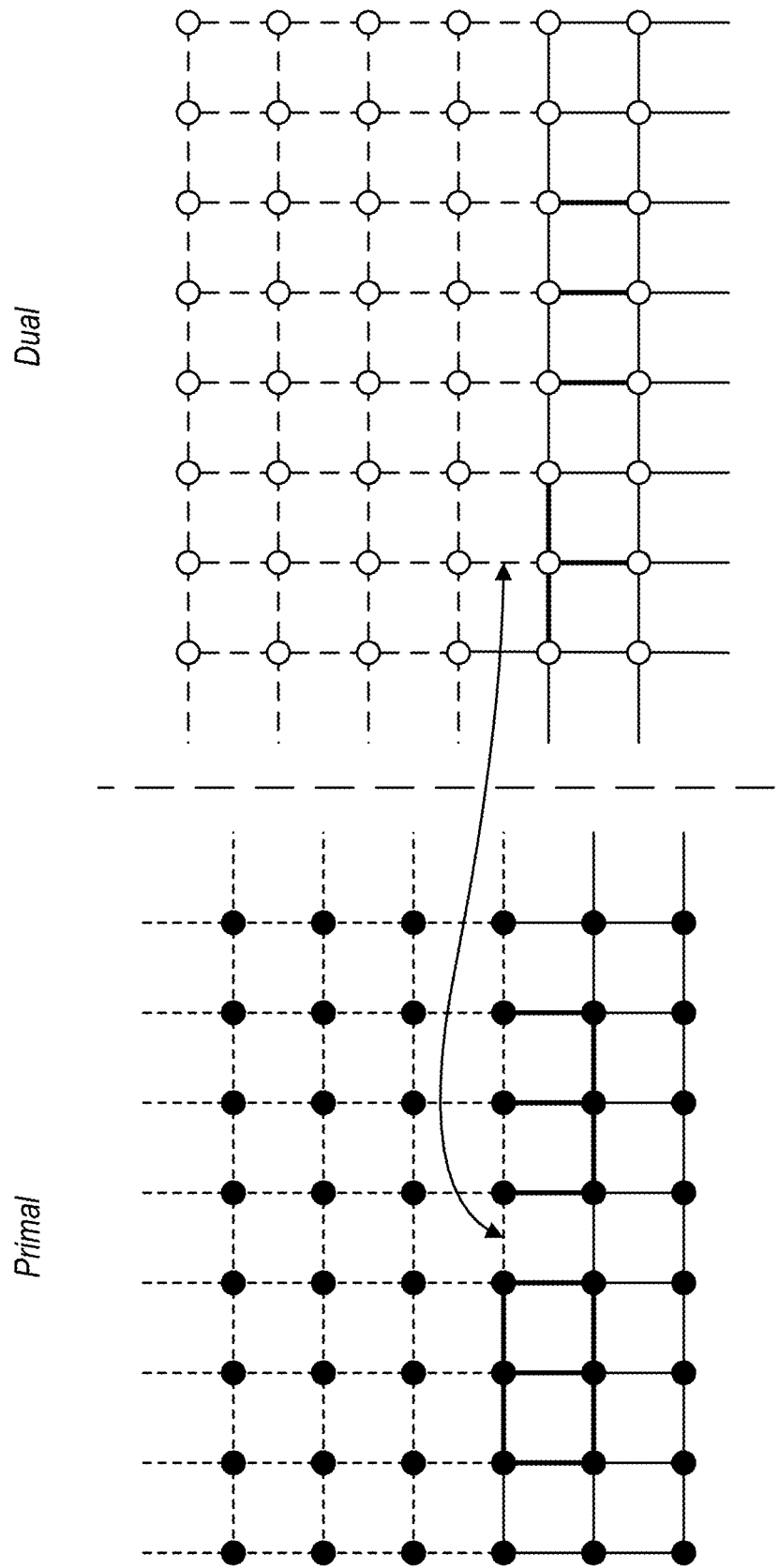

FIG. 17D illustrates an alternative scenario, similar to FIG. 17C but with a different set of prior fusion measurement results. Similar to FIG. 17C, bold solid black edges indicate that a fusion measurement of the edge resulted in an erasure, non-bold solid edges indicate that the fusion measurement was successful, and unmeasured edges are indicated with dashed lines. The two edges involved in the next fusion measurement are indicated with the double-headed arrow. However, in contrast to the trivial case illustrated in FIG. 17C, a more subtle determination utilizing an exposure comparison is employed for the graph illustrated in FIG. 17D to select the basis for the fusion measurement.

In the example illustrated in FIG. 17D, an erasure of either of the involved primal or dual edges will increase the likelihood of a logical error. To determine which edge to risk (i.e., which edge will be erased in the event of a failure), an exposure may be calculated for each of the involved primal and dual edges.

The "exposure" of an edge is defined herein as follows. Each edge connects two nodes of either the primal or dual graph. Often, one or both of these nodes may be part of one or more respective connected components. For example, the left node connected to the indicated edge of the primal graph in FIG. 17D is part of a 6-node connected component, and the right node connected to the indicated edge of the primal graph is part of a different 6-node connected component. The exposure of an edge is calculated as the product of the exposures of these two connected components. The exposure of a connected component, in turn, is defined as a sum (either weighted or unweighted) of the unmeasured edges and/or the measured edges adjacent to the connected component, not counting the edge for which the exposure is being calculated. For example, the left connected component adjacent to the indicated edge of the primal graph in FIG. 17D may be determined to have an exposure of 3, whereas the right connected component adjacent to the indicated edge of the primal graph in FIG. 17D has an exposure of 6, leading to an overall exposure of the indicated edge of the primal graph of 3*6=18.

In some cases, the edge may be adjacent to a node that is not part of a connected component. For example, the indicated edge in the dual graph of FIG. 17D is directly above a connected component of size 3, but directly below a region of unmeasured nodes that does not contain a connected component. For such nodes that are not part of a connected component, the exposure of the node is set equal to 3 to account for the three unmeasured edges (not counting the indicated edge) adjacent to this node. Accordingly, the indicated edge of the dual graph of FIG. 17D has an exposure of 3*1=3.

In FIG. 17D, since the indicated primal edge has a higher exposure, in some embodiments, the fusion failure basis is chosen such that the primal edge is successfully measured and the dual edge is erased in the case of a failure result.

Figure 18:
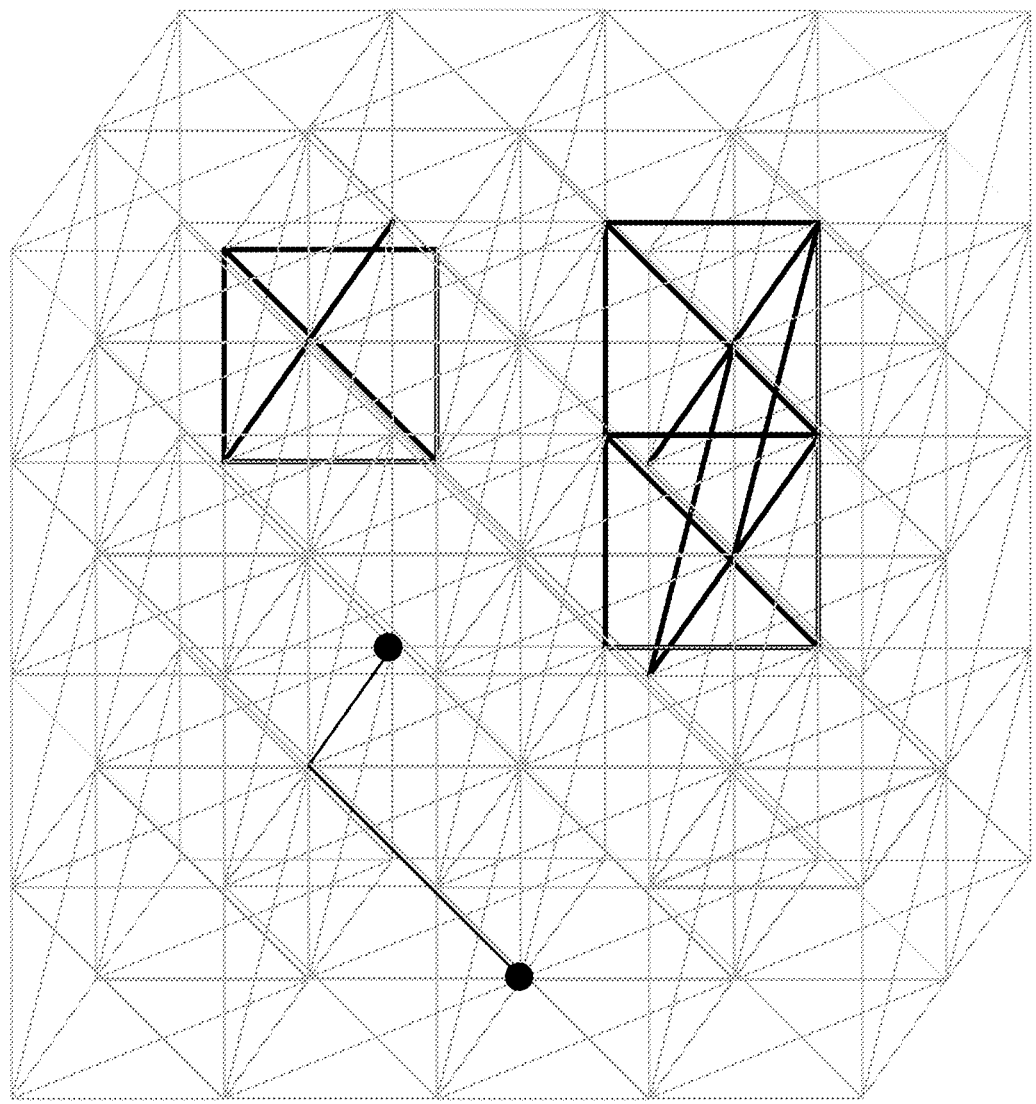
FIG. 18 illustrates erasures in a three-dimensional syndrome graph in accordance with some embodiments.

FIG. 18 illustrates a 3D lattice with two connected components (i.e., two contiguous clusters of erased edges) indicated with bold lines.

These examples are illustrative. The choice of error correcting code determines the set of qubit pairs that are fused from certain resource states, such that the output of the qubit fusion system is the classical data from which the syndrome lattice may be directly constructed. In some embodiments, the classical error syndrome data is generated directly from the qubit fusion system without the need to preform additional single particle measurements on any remaining qubits. In some embodiments, the joint measurements performed at the qubit fusion system are destructive of the qubits upon which joint measurement is performed.

Section II. Adaptive Basis Selection for Fusion Measurements

Embodiments herein present systems and methods for performing adaptive basis selection for fusion measurements for constructing entangled quantum states and executing quantum algorithms. Advantageously, the loss tolerance of Lattice Preparation Protocols (LPPs) may be significantly increased by adaptively choosing the failure basis to obtain fusions that are more important for avoiding logical error. As one example, methods described herein may increase the loss tolerance of an LPP based on 6 qubit resource states (which includes placing failures in 2D sheets) from 0.4% per photon in the non-adaptive case to 1.4% per photon (including boosting measurements, as explained below).

Errors (e.g., erasures) in a fault-tolerance lattice cause logical failure if they link up in a way that spans the logical qubit. Embodiments herein employ fusion basis adaptivity to organize erasures coming from fusions in a way that reduces the likelihood that they link up to cause a logical error, enabling a significant increase in error tolerance. The reorganization of errors into a docile configuration (i.e., a configuration that does not result in logical error) may be achieved simply by adaptively changing the basis of the fusion measurement. Fusion adaptivity can be shown to be extremely effective in increasing the loss threshold for fault tolerant quantum computing.

Three outcome results are possible in a type-II fusion measurement. First, a successful outcome of a fusion measurement results in successful entanglement of the resource states involved in the fusion measurement for both the primal and dual syndrome graphs. Second, a failure outcome results in a single qubit measurement wherein a fusion may be obtained in one of the primal or dual syndrome graphs, while the second fusion of the other syndrome graph is lost. The fusion that is successfully obtained for a failure result may be chosen based on selective application of local Clifford gates before the Bell measurement. Said another way, the basis of a fusion measurement may be selected such that a failure result will cause an error in an edge of either the primal or the dual syndrome graph of the entangled state, whereas the measurement of the other edge of the primal or dual syndrome graph still succeeds. Third, a loss outcome of a fusion measurement results when one or more photons escape during the measurement and are not detected, resulting in a failed fusion for both the primal and dual syndrome graphs.

Embodiments herein consider results of previous measurements before performing a subsequent fusion measurement, use this information to determine which edge is more important for avoiding a logical error (i.e., the edge in the primal or dual graph), and then choose the failure basis of the fusion measurement such that this edge is obtained even when the fusion measurement fails. Advantageously, embodiments herein may be used in any syndrome graph and may result in significant increase in loss tolerance even with relatively small unencoded states.

Syndrome Graphs

The results of a type-II fusion measurement may be understood in terms of its effect on edges in a syndrome graph of the entangled state. Each type-II fusion measurement measures one edge in the primal graph and one in the dual graph of the syndrome graph. A success results in the erasure of neither edge, a loss results in the erasure of both edges, and a failure results in the erasure of either the primal or dual edge, depending on the basis of the fusion measurement. A chain of erasures that spans the logical qubit results in a logical error. Before performing a fusion measurement, embodiments herein determine which edge is more likely to result in a spanning chain of erasures after all edges of the syndrome graph have been measured, and a fusion basis is chosen for the measurement such that this edge is not erased even in the case of a failure outcome.

Edges that exist in the syndrome graph may be classified as one of three types, 1) successful edges for which the parity has been obtained successfully, 2) failed edges for which the parity measurement was attempted but was not be obtained due to a loss or failure (these edges are erased in the syndrome graph), and 3) un-attempted edges which have not yet been measured. Un-attempted edges may or may not be erased in the future depending on the outcome of future fusion measurements.

Figure 19:
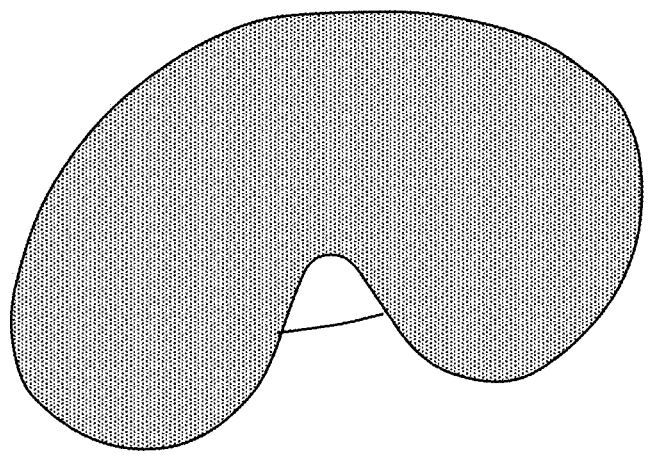
FIG. 19 is a schematic illustration of an edge that connects two portions of a single connected component, according to some embodiments.

Various metrics may be employed to determine which edge to risk in a fusion measurement. As a first possibility, a trivial rule may be applied whereby, if an edge is connecting two nodes that are part of the same connected component, the erasure of that edge may not increase the probability of a spanning path since its neighbors already have an alternate path connecting them. For example, as shown schematically in FIG. 19, the illustrated edge connects two portions of a single connected component. Hence, whenever possible, such an edge may be preferentially risked to protect the complementary edge in the other (e.g., primal or dual) syndrome graph.

In some embodiments, an un-attempted edge may be unable to be part of a loop of erasures, even in the future (i.e. if there is no other path composed of failed and un-attempted edges connecting its adjacent nodes), and this edge may not be able to contribute to a logical error. Hence, this edge may be risked without increasing the probability of a logical error. Accordingly, in some embodiments, this type of un-attempted edge may be selectively risked in a fusion measurement.

For the remaining edges (i.e., where the trivial rule may not apply), embodiments herein present decision-making strategies to determine which error configuration is better or worse given the outcome of previous measurements. In some embodiments, as described in greater detail below, a strategy referred to herein as Exposure Based Adaptivity (XBA) is utilized that results in high error tolerance in the regime of high loss, and allows for computationally efficient decision making.

Exposure Based Adaptivity (XBA)

Figure 20:
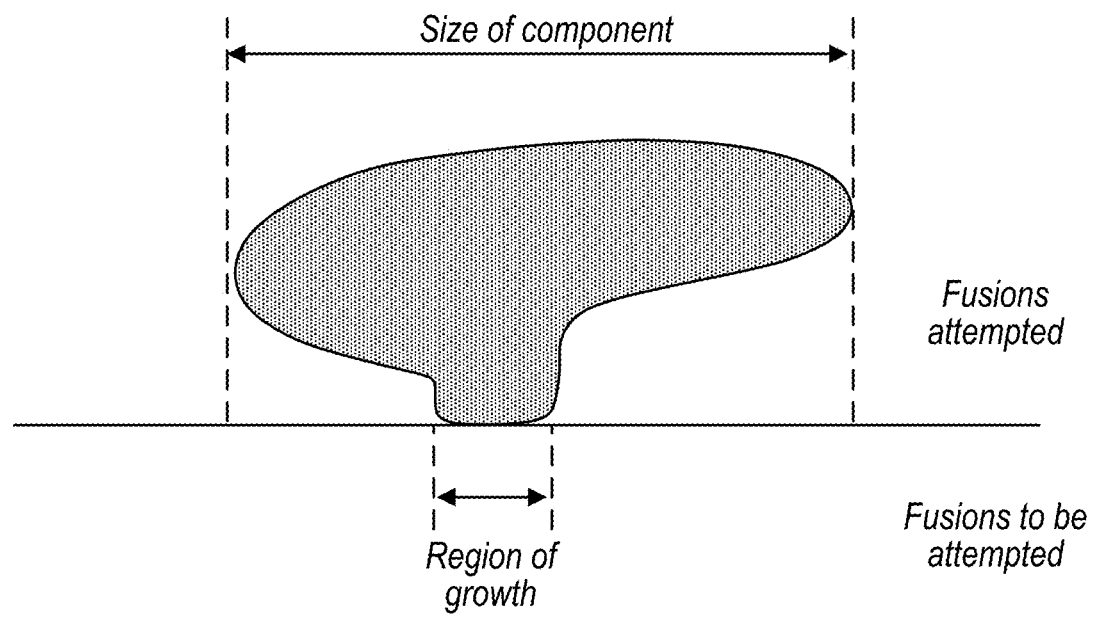
FIG. 20 is a schematic illustration of a growth region of a connected component, according to some embodiments.

A connected component in a syndrome graph is a set of contiguous erased edges. XBA attempts to prevent the growth of the more dangerous of the connected components in either the primal or dual syndrome graphs (i.e., the one that is more likely to lead to a logical error). If every edge were either erased or successfully measured in an independent and identically distributed (i.i.d.) random fashion in a large lattice, the presence of either a spanning path of erased edges (i.e. logical error) or a connected component of the same size as the full lattice have roughly the same probability of occurring. Although the size of the connected components adjacent to an edge may seem to be a good heuristic for determining the importance of an edge, this may not always be an effective metric. For example, if most of the edges adjacent to a large component are successful edges, the connected component has very limited potential for growth. For example, as shown in FIG. 20, even though the size of the connected component is large, it is mainly surrounded by successful edges. Hence, it's potential for growth, and of being part of a future spanning path, is dictated by the smaller illustrated "region of growth". Such a situation where most of the edges adjacent to a connected component are successful is quite likely in a linear optical quantum computer, as one dimension of the lattice is time.

The XBA metric defines the exposure of a connected component as a sum of un-attempted edges adjacent to the connected component. The sum may be weighted or unweighted as described in greater detail below, in various embodiments. Advantageously, this metric provides an effective indicator of a connected component's potential for growth. The rule for applying the XBA metric is to risk the edge of either the dual or primal syndrome graph for which the product of the exposures of the components at the two ends of the respective edge is smaller. The XBA metric may be utilized for cases where the end points of both edges connect to neighbor nodes that are not already part of the same connected component. In these cases, where the two nodes on either side of an edge to be measured are already connected by a single connected component (i.e., when the edge is an intra-cluster edge), the trivial selection rule described above may be employed (i.e., the basis will be selected to risk this edge).

In some embodiments, the XBA metric may be generalized to include a weighting that considers the relative importance of measurements in the primal and dual syndrome graphs. For example, consider a fusion measurement that performs a probabilistic projective measurement to measure a particular primal edge in the primal syndrome graph and a particular dual edge in the dual syndrome graph. In some embodiments, the calculation of the exposures of the primal and dual edge may utilize a parameter $\beta$, where $\beta=0$ when the dual edge is an intra-cluster edge, $\beta=1$ when the primal edge is an intra-cluster edge and the dual edge is not, $$\beta = \frac{1}{2}\left(\frac{\chi_{dual}}{\chi_{primal}}\right)^s (1-q) + 0.5q$$

when $\chi_{dual} \geq \chi_{primal}$ and neither edge is an intra-cluster edge, and $$\beta = \left[1 - \frac{1}{2}\left(\frac{\chi_{dual}}{\chi_{primal}}\right)^s\right](1-q) + 0.5q$$

when $\chi_{dual} < \chi_{primal}$ and neither edge is an intra-cluster edge. Here $\chi_{primal}$ and $\chi_{dual}$ are the exposures of the primal edge and the dual edge, respectively, and q and s are numerically optimized parameters. For example, a quantum computing test algorithm may be performed a plurality of times for different combinations of values of q and s, and it may be determined which combination of values of the tested combinations produces the most desirable fault tolerance for the test algorithm. The parameter $\beta$ may be used to choose one or more parameters and/or settings for the fusion measurement being performed. For example, in the case of encoded fusion there are many choices for performing the fusion which may have different probabilities of primal and dual erasure. In such a scenario, $\beta$ may be computed according to the equations above, and may be used to determine a minimum value of a cost function $f$:

$$f=(1-\beta)*\text{Prob(primal erasure)}+\beta*\text{Prob(dual erasure)} \quad (17)$$

In the case of unencoded fusions, the two choices of a failure basis may be XX failure and ZZ failure. In some embodiments, the cost function shown in Eq. (17) may be computed for each of the XX and ZZ failure bases (e.g., the probability of an erasure in the primal and dual graphs may vary depending on the selected failure basis), and the failure basis that results in a smaller cost function may be selected for performing the fusion measurement. In other embodiments, the definition of more general and may work for encoded fusions with other failure basis choices as well.

Numerical Results

Figure 21:
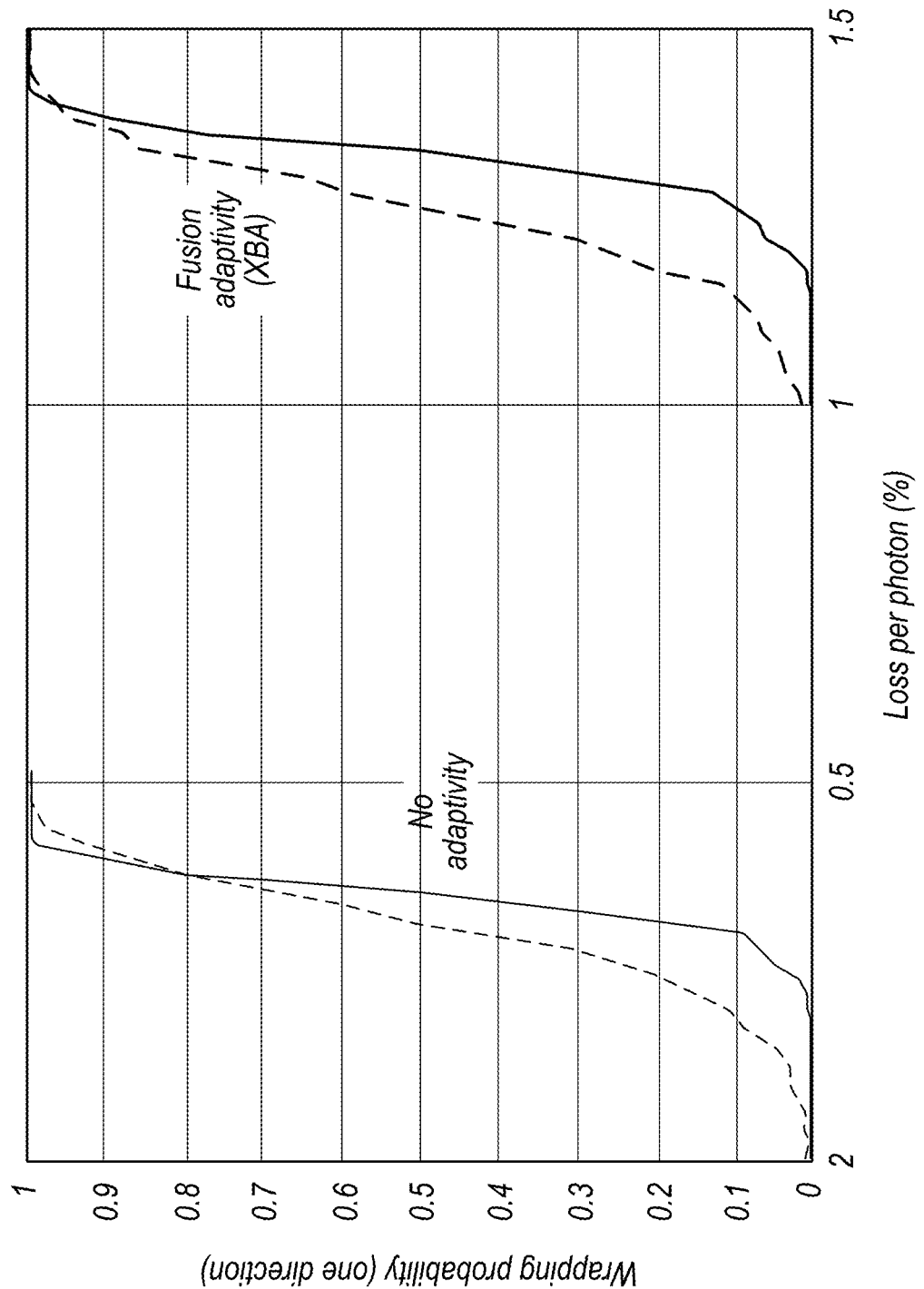
FIG. 21 is a graph illustrating photon loss thresholds while performing and not performing adaptive basis selection during a fusion measurement sequence, according to some embodiments.

FIG. 21 is a graph illustrating numerical results for loss rates per photon for a variety of methodologies, according to various embodiments. In producing the data illustrated in FIG. 21, it was assumed that each photon in the resource state and each photon in the boosting resource state experiences the same probability of loss, which is referred to as the loss per photon l. Type-II fusion boosted with a Bell pair was utilized. Accordingly, the probability of a non-loss outcome is $\eta=(1-l)^4$. The success probability is $\frac{3}{4}\eta \approx \frac{3}{4}(1-4l)$, the failure probability is $\frac{1}{4}\eta \approx \frac{3}{4}(1-4l)$, and the loss probability is $1-\eta \approx 4l$.

In FIG. 21, the threshold value of loss per photon is computed by calculating the wrapping probability of a spanning series of connected failed edges on lattices of size $25^3$ (dashed lines) and $50^3$ (solid lines). A fusion measurement process without selective basis adaptivity (purple) corresponds to the 6 ring LPP where failures in the absence of loss form disconnected sheets. While such an LPP may tolerate 34.7% failures in the absence of loss, any loss starts connecting the sheets caused by failure resulting in a relatively small loss tolerance per photon of 0.4% (purple lines). For the same syndrome graph, using fusion adaptivity with XBA (red lines), a per photon loss tolerance of 1.4% is obtained.

The wrapping probability is used in FIG. 21 to estimate the photon loss threshold because it is less sensitive to finite size effects than the spanning probability. It may be shown, however, that spanning probability and size of the largest component exhibit similar results for non-adaptive and XBA adaptive basis selection.

In the results illustrated in FIG. 21, the exposure of a measured edge is defined to be zero. However, in a fusion measurement scenario with a significant probability of Pauli errors, more measurements surrounding a cluster may make it more likely that an error has occurred. Accordingly, in some embodiments, tolerance to Pauli errors may be improved by assigning a non-zero exposure to every unmeasured edge. This parameter, which is referred to herein as accretion, has a small impact on the loss-only results but becomes important once Pauli errors are introduced.

The XBA rule used above gives each connected component involved in the fusion measurement a score based on the number of exposed (i.e., unmeasured) edges, but the XBA rule does not consider how far apart those exposed edges are. However, exposed edges that are far apart in the connected component may be more likely to cause a graph-spanning connected component, and may accordingly be more likely to result in a logical error than exposed edges that are nearby to each other. To account for this, in some embodiments, the second moment of the exposed edges of a connected component about their mean position may be used to determine the overall exposure of a connected component. Additionally or alternatively, while the XBA rule described above only looks at the exposure of the immediate neighborhood of a connected component, in other embodiments the exposure of the extended neighborhood of a connected component may be considered. For example, a connected component with a large exposure one un-attempted edge away from the connected component may be considered to have a larger exposure, in some embodiments.

Adaptive Boosting

In some embodiments, in addition to adaptively choosing the basis for fusion measurements, an adaptive level of boosting may be chosen for the fusion measurement process. "Boosting" refers to the introduction of redundancy by utilizing multiple sets of photons for performing a single fusion measurement. For example, as described in greater detail in the Appendix below, boosting may utilize ancillary Bell pairs or pairs of single photons to increase the probability of a success outcome. Boosting increases the probability of obtaining a successful outcome for a fusion measurement, while decreasing the probability of a failure outcome. The inclusion of additional photons increases the probability of a loss outcome, but this may be more than compensated for by the decrease in the probability of a failure outcome, at least in some embodiments. This section describes methods for adaptive boosting, whereby boosting is turned on or off based on the results of previous fusion measurements. Boosting may be turned off if one of the edges (i.e., from the primal or dual syndrome graph) measured in a fusion measurement does not increase the probability of a spanning path of erasures (e.g. where the edge connects two nodes that are already part of the same connected component). Boosting may be turned off in these situations, since only one of the edges is important and the basis may be selected to guarantee a successful measurement of the important edge in the case of a failure outcome.

In some embodiments, if the product of the size of the connected components at either end of the edge corresponding to one of the primal or dual syndrome graphs is greater than that at the ends of the other edge by a predetermined factor $\gamma_b$, one of the edges may be expected to be much more important than the other, and boosting may be turned off. The factor $\gamma_b$ may be tuned numerically (e.g., empirically) to increase the resultant photon loss threshold.

Figure 22:
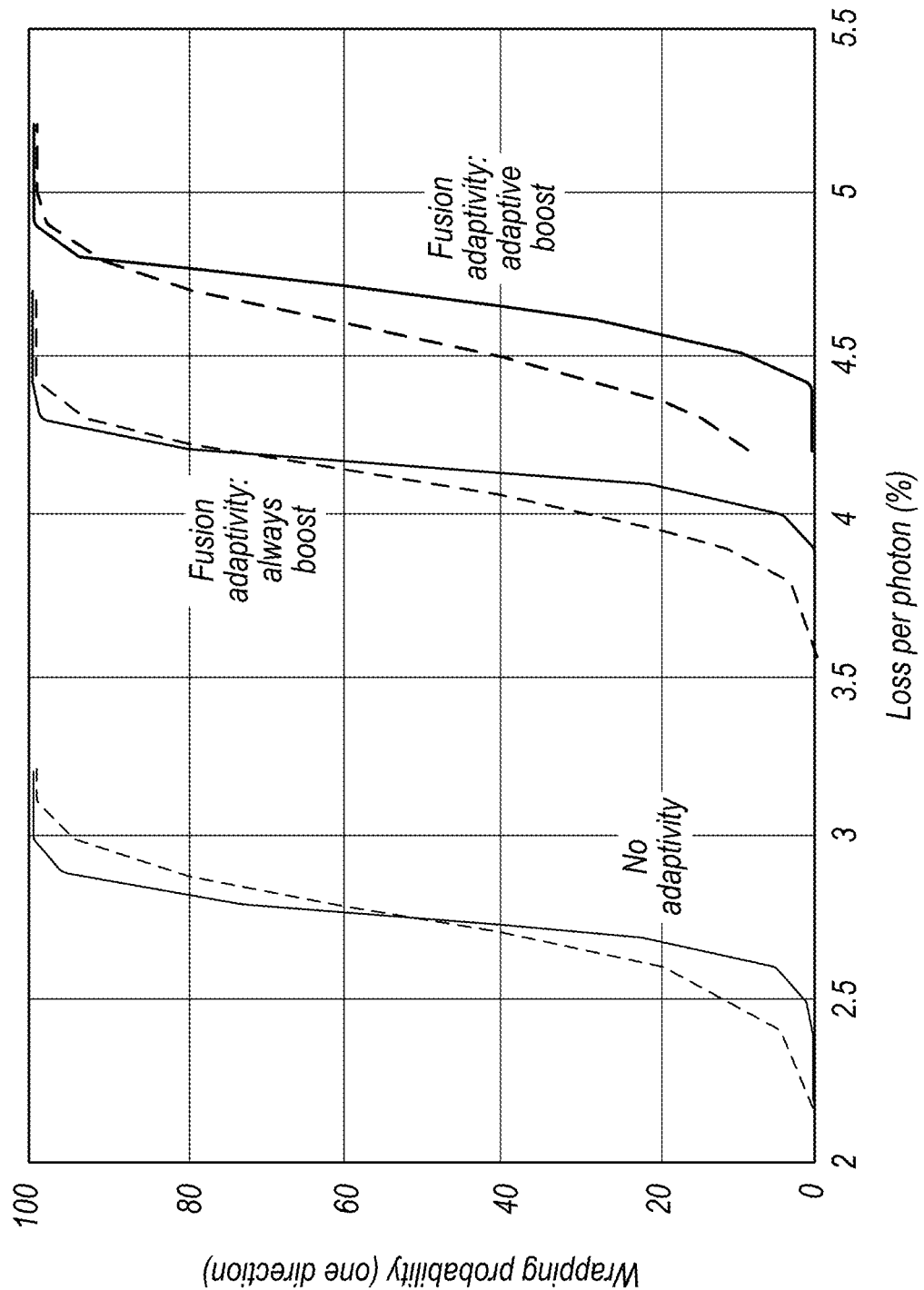
FIG. 22 is a graph illustrating photon loss thresholds while performing adaptive basis selection and always boosting, performing adaptive basis selection and adaptive boosting, and not performing adaptive basis selection during a fusion measurement sequence, according to some embodiments.

FIG. 22 is a graph comparing photon loss percentages using no basis selection adaptivity, basis selection adaptivity with boosting always present, and basis selection adaptivity with boosting selectively applied. The data illustrated in FIG. 22 was derived for a Kagome-24 lattice, and the solid and dashed line are simulations for lattices of size $48^3$ and $24^3$, respectively. The threshold is determined based on the crossing of the solid and dashed lines. As illustrated, fusion adaptivity and adaptive boosting both increase the photon loss threshold, and adaptive boosting improves the photon loss threshold compared to always boosting. Table 1 tabulates results for photon loss thresholds (LTs) for a variety of different lattice geometries.

TABLE 1

| Fusion Geometry | LT: No Adaptivity | LT: Fusion Adaptivity, Always Boost | LT: Fusion Adaptivity, Adaptive Boost |
|---|---|---|---|
| Kagome-6 | 0.4% | 1.4% | 1.5% |
| Kagome-10 | 1% | 2.2% | 2.3% |
| Kagome-16 | 2% | 3.4% | 3.8% |
| Kagome-24 | 2.8% | 4.2% | 4.8% |
| Kagome-∞ 2-strands | 2.5% | 3.4% | 3.8% |

As shown in Table 1, schemes with larger resource states tend to have better loss thresholds. One interesting comparison is between Kagome-16 and Kagome-∞ 2-strands. In the case of no adaptivity, the Kagome-∞ 2-strands lattice has a higher threshold since it uses infinitely long resource states which results in 1D failure subgraphs. However, when fusion adaptivity is used (both with and without adaptive boosting), the loss threshold for Kagome-16 is the same as Kagome-∞ 2-strands, although Kagome-16 uses much smaller resource states than Kagome-∞ 2-strands (16 vs ∞). This may be because both schemes have the same degree distribution in the full syndrome graph, and it appears that this is a good metric for evaluating the performance of fusion geometries for fusion adaptivity with the XBA rule.

The no adaptivity cases and the always boost cases here use single boosting with Bell pairs. In some cases, it is possible to run these schemes un-boosted e.g. Kagome-16 with fusion adaptivity and Kagome-24, Kagome∞ 2-strands both with and without fusion adaptivity. However, for the cases studied here, this results in a lower loss tolerance.

Advantageously, embodiments herein for adaptive basis selection and/or adaptive boosting provide significantly more loss tolerance without additional active components in the path of a photon to incorporate the local Cliffords before the fusion measurements in the multiplexing network.

Adaptive Basis Selection for Encoded Fusion

In some embodiments, a FBQC system may utilize encoded qubits for performing fusion measurements in a quantum computing algorithm. These methods may be referred to as "encoded fusion", where each qubit is replaced by multiple qubits that are entangled together, to collectively form a single encoded qubit. In these embodiments, the term "physical qubit" is used to refer to the individual qubits that collectively form an encoded qubit. Each physical qubit may be a dual-rail photonic qubit, as one example.

Figure 23:
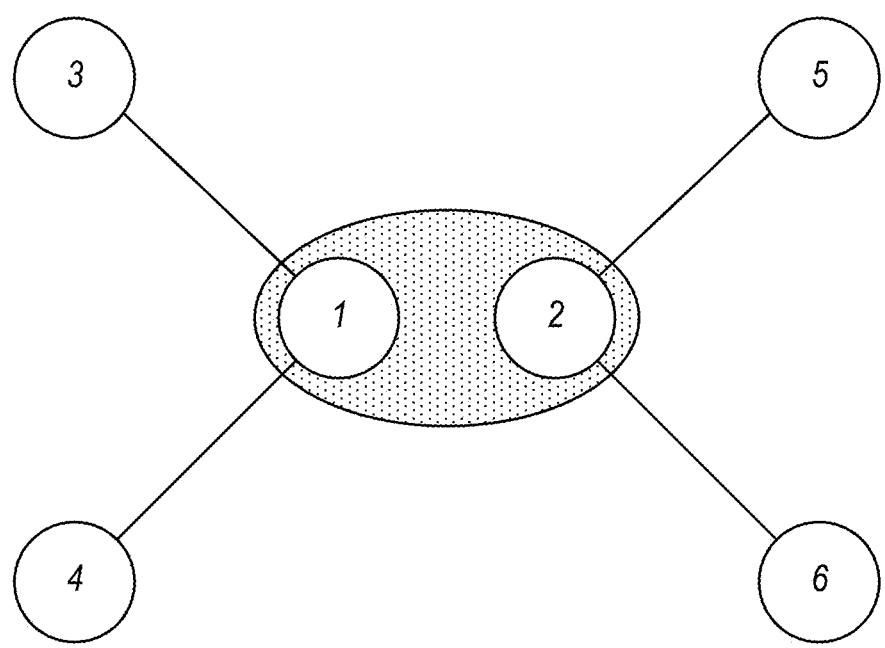
FIG. 23 is a schematic illustration of a typical fusion measurement, according to some embodiments.

For example, a typical (non-encoded) fusion measurement is schematically illustrated in FIG. 23, where a fusion measurement is to be performed on qubits 1 and 2. In FIG. 23, qubit 1 is entangled with qubits 3 and 4, whereas qubit 2 is entangled with qubits 5 and 6. The fusion measurement on qubits 1 and 2 may perform a projective measurement on the stabilizers $X_1 X_2$ and $Z_1 Z_2$. Said another way, the fusion measurement may project the state of the qubits 1 and 2 onto the stabilizers $X_1 X_2$ and $Z_1 Z_2$. In linear optical quantum computing, fusion measurements are probabilistic with a particular likelihood of success, failure, and loss, as described in greater detail above. If the fusion successfully performs both of these stabilizer measurements, the qubits 3, 4, 5, 6 will be entangled in a desired way. For example, measurement outcomes for success and failure results for various specific examples of fusion measurements are illustrated in FIG. 34. While FIG. 23 illustrates one configuration of external qubits (3, 4, 5, 6), more generally there may be any number of qubits pre-entangled with qubits 1 and 2.

Fusion measurements in linear optics don't measure $X_1 X_2$ and $Z_1 Z_2$ deterministically. For example, even in the absence of loss (i.e., photon escape, absorption, etc.), a failure outcome may occur with a probability of 50%, where one of $X_1X_2$ or $Z_1Z_2$ is not successfully measured (e.g., either $X_1X_2$ or $Z_1Z_2$ will be unsuccessfully measured depending on the selected basis of the fusion measurement).

Figure 24A:
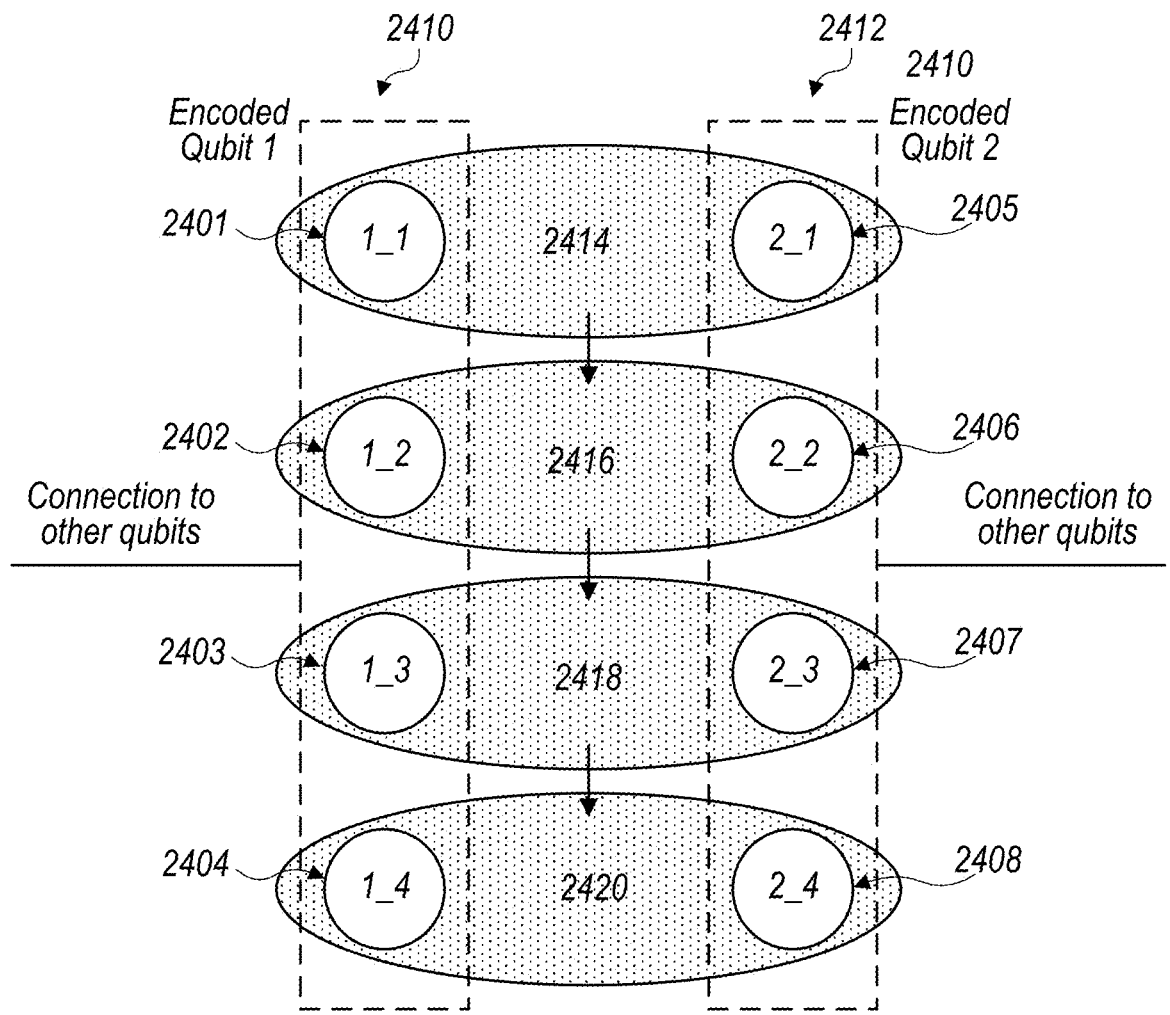
FIG. 24A illustrates a fusion measurement where the two qubits to be fused are encoded qubits.

To increase the probability of successfully obtaining both measurements, encoded fusion may be employed. In encoded fusion, the two qubits to be fused may be replaced by composite qubits, i.e., encoded qubits that are each made from a collection of two or more entangled physical qubits. The encoded qubits may be encoded using a small error correcting code, e.g., using a (2,2) Shor code, or any other quantum error correcting code. For example, qubits 1 and 2 may be encoded and are thereby replaced with multiple entangled qubits, e.g., 4 qubits each as shown in FIG. 24A. In FIG. 24A, "1_1" denotes the first qubit within the encoded qubit 1, "1_2" denotes the second qubit within the encoded qubit 1, "2_1" denotes the first qubit within encoded qubit 2, etc. As illustrated, the dashed box represents an encoded qubit (i.e. the qubits inside the dashed boxed are pre-entangled in some way, e.g., according to a small error correcting code). Similar to regular unencoded fusion measurements, encoded qubits may undergo an entangling measurement referred to herein as an encoded fusion measurement. In some embodiments, an encoded fusion measurement may be a transversal operation whereby the encoded fusion measurement includes a plurality of applications of individual fusion measurements on physical qubits of the encoded qubits, where the individual fusion measurements are of the same type as the encoded fusion measurement. For example, in a transversal operation, an encoded fusion measurement of $\overline{X_1X_2}$ may be obtained, where the overbar indicates a value of the encoded qubits 1 and 2, by performing $X_1X_2$ fusion measurements on individual physical qubit pairs of the encoded qubits.

In the examples that follow, the terminology of the stabilizer formalism for quantum error correction is used. In the stabilizer formalism, encoded qubit states are used that take form of what are referred to as stabilizer states. Stabilizer states are given this name because they are the +1/−1 eigenstates of a set of operators, called the stabilizer operators (or simply the stabilizers). In some embodiments, the stabilizers are the set of n-qubit Pauli operators which leave the code invariant (i.e., the stabilizer states are invariant under operation by any of the stabilizers, except for an overall factor of +1 or −1). Stated another way, in the language of quantum measurements, the stabilizers that define the stabilizer code are the set of measurements that will return +1 eigenvalues when the state being measured (i.e., the encoded qubit) has no errors on the underlying physical qubits and will return one or more −1 eigenvalues when the state being measured has a detectable error on one or more of the underlying physical qubits. In addition, stabilizer measurements may be understood to be joint parity measurements, and (unlike individual qubit measurements) these parity measurements do not measure the quantum state of the encoded qubit, but rather only its parity. Accordingly, measurement of the stabilizers does not collapse the encoded qubit state, thereby leaving the underlying quantum information intact.

Figure 24B:
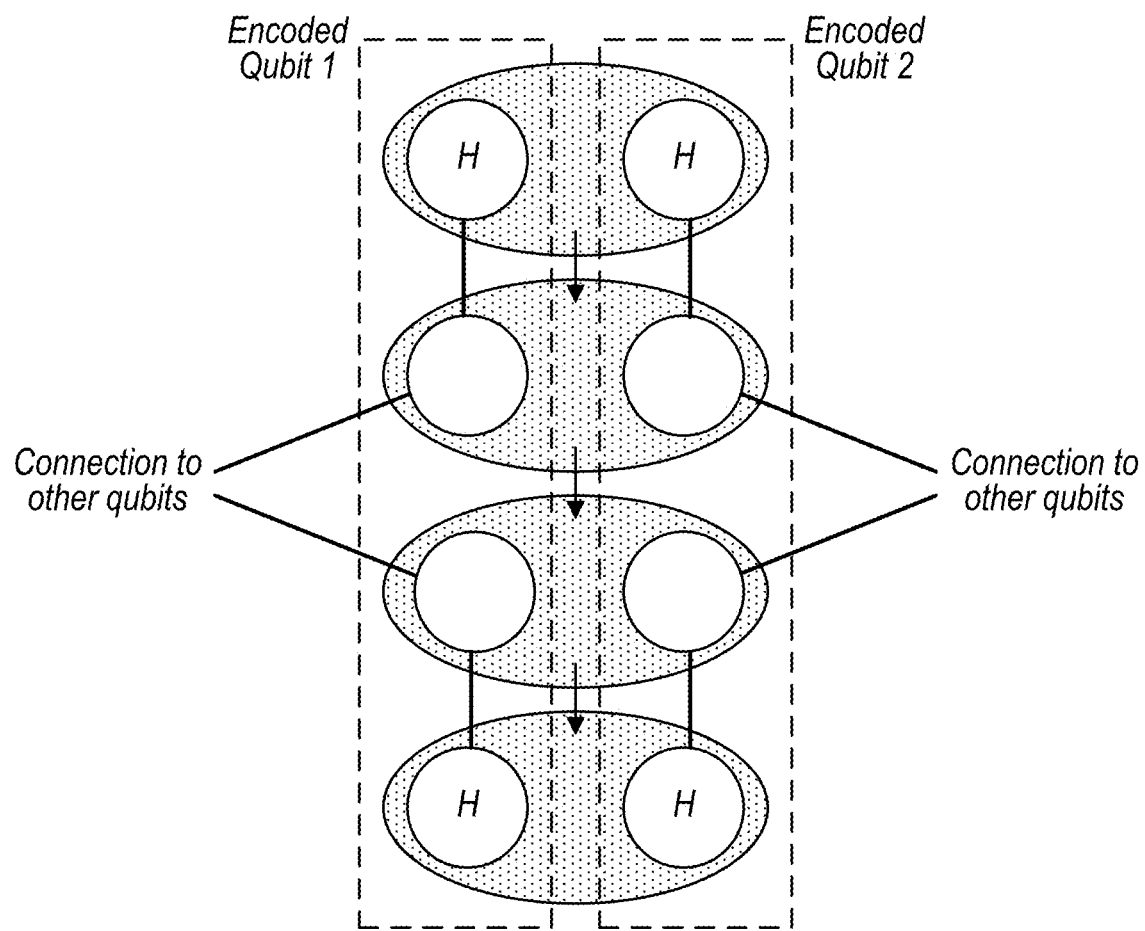
FIG. 24B illustrates an example of how the encoded qubits of FIG. 24A may be entangled, according to some embodiments.

In the example illustrated in FIG. 24A, the stabilizers for the qubits inside the dashed boxes are $Z_{i\_1}Z_{i\_2}$, $Z_{i\_3}Z_{i\_4}$, $X_{i\_1}X_{i\_2}$, and $X_{i\_3}X_{i\_4}$ for both i=1 and i=2. In terms of graph states, the entangled qubits may be represented as shown in FIG. 24B, where "H" denotes that the particular qubit has a Hadamard gate applied to it. The physical fusion measurements may be performed in the order shown by the arrows in FIGS. 24A and 24B.

The encoded fusion measurement shown in FIG. 24A performs a projective measurement, and similar to the case of unencoded fusion, results in a probabilistic measurement of $\overline{X_1X_2}$ and $\overline{Z_1Z_2}$, where the overline denotes that the quantity refers to an overall value of the encoded qubit, and the subscript under the overline is the label for the encoded operator. However, because of the encoding and the fact that there are stabilizers that initially exist within an encoded qubit, there is more than one way to measure the encoded operators. For example, for the illustrated example, $$\overline{X_1X_2} = X_{1\_1}X_{2\_1}X_{1\_2}X_{2\_2} = X_{1\_3}X_{2\_3}X_{1\_4}X_{2\_4} \quad (17)$$

$$\overline{Z_1Z_2} = Z_{1\_1}Z_{2\_1}Z_{1\_3}Z_{2\_3} = Z_{1\_1}Z_{2\_1}Z_{1\_4}Z_{2\_4} = Z_{1\_2}Z_{2\_2}Z_{1\_3}Z_{2\_3} = Z_{1\_2}Z_{2\_2}Z_{1\_4}Z_{2\_4} \quad (18)$$

These variations may be obtained by multiplying the encoded operator by the stabilizers of the code. While $\overline{X_1X_2}$ and $\overline{Z_1Z_2}$ are the desired encoded fusion measurement outcomes, as used herein, $X_{1\_1}X_{2\_1}X_{1\_2}X_{2\_2}$, $X_{1\_3}X_{2\_3}X_{1\_4}X_{2\_4}$, etc. are sets of "effective measurement results" that may equivalently be used to obtain the desired encoded fusion measurement outcomes. The set of effective measurement results may be referred to as an effective measurement group of the encoded fusion measurement. Since there are multiple ways of obtaining a valid set of effective measurement results to measure the desired logical operators, the encoded measurements may be obtained even when some of the measurements are erased.

For example, during the sequence of four fusion measurements shown in FIG. 24A (e.g., the top measurement is performed first, followed by the next measurement down, etc., as indicated by the arrows), at each subsequent fusion measurement, depending on the outcome of the previous measurements, it may be that a failure of a particular X or Z measurement does not compromise the ability of the set of encoded fusion measurements to successfully measure both $\overline{X_1X_2}$ and $\overline{Z_1Z_2}$. As one example, if $X_{1\_1}$, $X_{2\_1}$, $X_{1\_2}$ and $X_{2\_2}$ have all been previously successfully measured, $\overline{X_1X_2}$ may be determined according to equation (17) even if one or more of $X_{1\_3}$, $X_{2\_3}$, $X_{1\_4}$ and $X_{2\_4}$ are not obtained (e.g., from a failure result).

Embodiments herein present methods and devices whereby previous measurement outcomes within the sequence of encoded fusion measurements are used to choose a basis for how a subsequent fusion measurement will be performed. Accordingly, in the example above, it may be desirable to set the failure basis for the (1_3, 2_3) and (1_4, 2_4) fusion measurements to be XX, since a failure in the XX basis will still obtain the Z measurements in a failure outcome, and a failure in the XX basis will not compromise the overall encoded fusion measurement.

The examples here describe embodiments where each encoded fusion measurement is selected to be performed in either the XX or the ZZ basis. However, it may be appreciated that any two orthogonal bases may be used for the encoded fusion measurements. In general, a basis for performing each encoded fusion measurement is selected from two potential orthogonal bases, where XX and ZZ are a typical set of orthogonal bases, in some embodiments.

More generally, in various embodiments the set of encoded fusion measurements may involve encoded qubits that are each encoded with different numbers of qubits, and/or the encoded fusion measurements may involve more than two encoded qubits (e.g., there may be a 3-way encoded fusion measurement, as described in greater detail below). In these embodiments, the stabilizers and/or the effective measurement results that correspond to the desired fusion measurement outcomes may vary. Accordingly, the specific method whereby a basis is selected for a subsequent fusion measurement may also vary. However, in each of these embodiments, the basis may be selected from two orthogonal bases such that a failure result in the selected basis either a) does not prevent the measurement of the desired encoded fusion measurement outcomes (i.e., a particular basis may be selected if the encoded fusion measurement may be obtained even if a failure outcome occurs in the selected basis) or b) has a lower likelihood of preventing the measurement of the desired encoded fusion measurement outcomes compared to the alternative basis.

In some embodiments, each encoded fusion measurement may be performed in one of four different ways. It may be performed in one of two failure bases (e.g., X or Z) and may be performed with or without boosting. A photon may be lost in each fusion measurement with probability l, and $\eta=1-l$. The photon loss probability may be determined experimentally for a particular photonic system. In these embodiments, if a fusion measurement is un-boosted, it will succeed with probability ½ if no photon is lost during the measurement. In this case, the probability of success is $\eta^2/2$. The probability of failure is also $\eta^2/2$. If either input photon is lost, no measurement is obtained.

The fusion measurement may be boosted using a Bell pair to increase the success probability to ¾ in the absence of photon loss. However, now there are now 4 photons going into a fusion, which increases the probability of loss. It may be assumed that all of the photons (including the photons from the Bell pair) have the same loss probability l. Further, by placing a Hadamard before the boosted qubit, the failure basis may be selected to be either X or Z, whereby the measurement erased in case of failure may be chosen in both the boosted and un-boosted cases.

In these embodiments, the probabilities of each possible outcome for each type of measurement are as follows.

For an un-boosted measurement where a failure successfully measures ZZ (and not XX), the probability of measuring both XX and ZZ is $\eta^2/2$, the probability of measuring ZZ but not XX is $\eta^2/2$, and the probability of not measuring either XX or ZZ (i.e., for photon loss) is $1-\eta^2$.

For an un-boosted measurement where a failure successfully measures XX (and not ZZ), the probability of measuring both XX and ZZ is $\eta^2/2$, the probability of measuring XX but not ZZ is $\eta^2/2$, and the probability of not measuring either XX or ZZ (i.e., for photon loss) is $1-\eta^2$.

For a boosted measurement where a failure successfully measures ZZ (and not XX), the probability of measuring both XX and ZZ is $3\eta^4/4$, the probability of measuring ZZ but not XX is $\eta^4/4$, and the probability of not measuring either XX or ZZ (i.e., for photon loss) is $1-\eta^4$.

For a boosted measurement where a failure successfully measures XX (and not XZZX), the probability of measuring both XX and ZZ is $3\eta^4/4$, the probability of measuring XX but not ZZ is $\eta^4/4$, and the probability of not measuring either XX or ZZ (i.e., for photon loss) is $1-\eta^4$.

Figure 25:
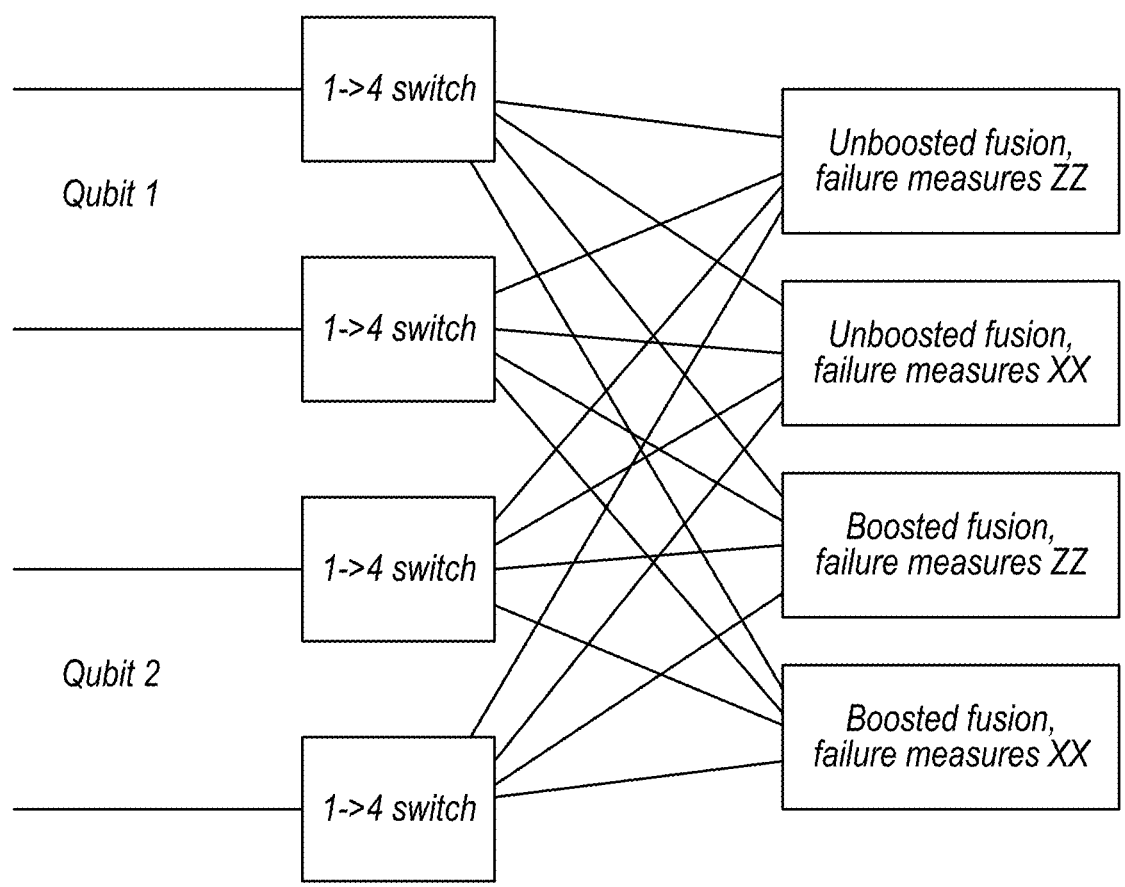
FIG. 25 illustrates a system setup for performing a fusion measurement in one of four different manners, according to some embodiments.

Embodiments herein may determine whether to boost a measurement or not to increase the likelihood of a successful outcome, depending on the specific value of l (and/or $\eta$). The outcomes described here may be inferred from detector clicks after a physical fusion is performed. The four options for performing the fusion measurement may be selected using a switching network, as shown in FIG. 25. If required, the circuits for all four kinds of fusion measurements may be obtained using beam splitters and passive phase shifters. Local encoding may be utilized to determine which of these four measurement options to choose for a fusion measurement, depending on the outcomes that have been observed in the past, to have the best probability of obtaining $\overline{X_1X_2}$ and $\overline{Z_1Z_2}$ for the encoded qubits.

Figure 26:
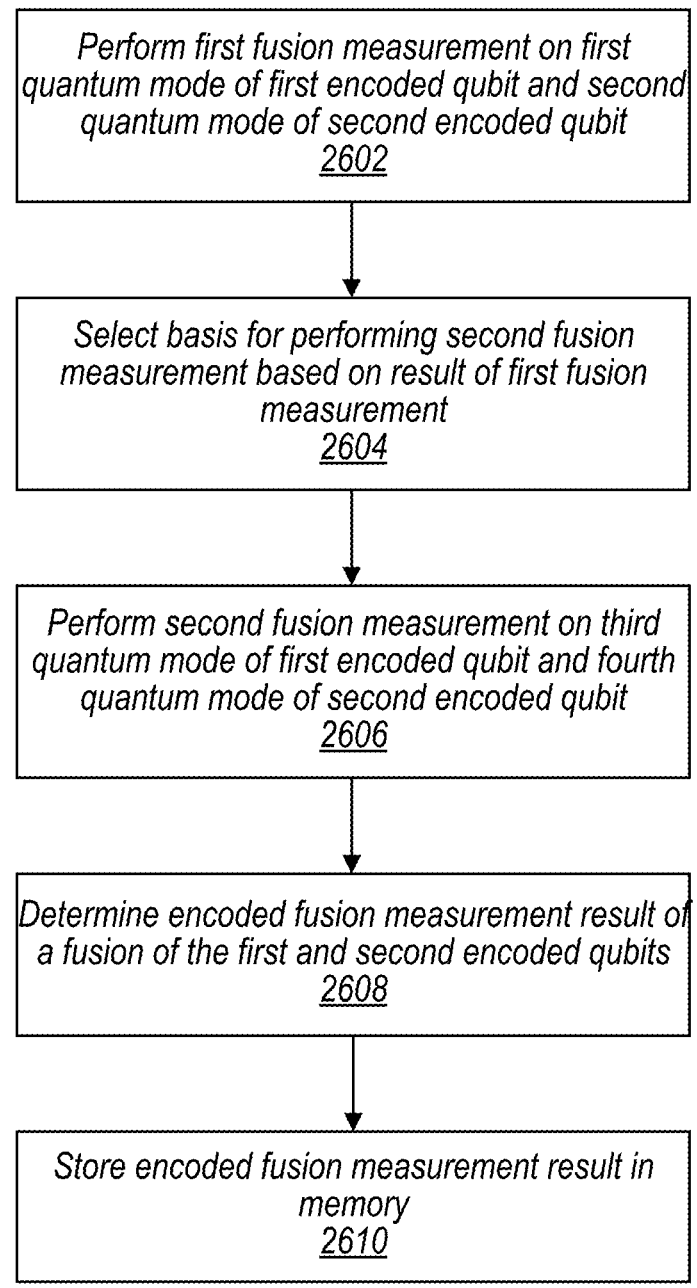
FIG. 26 is a flow chart diagram illustrating a method for performing adaptive basis selection during an encoded fusion measurement, according to some embodiments.

FIG. 26—Flowchart for Performing Adaptive Encoded Fusion

FIG. 26 is a flowchart diagram illustrating a method for performing adaptive basis selection during a sequence of encoded fusion measurements. The method shown in FIG. 26 may be used in conjunction with any of the computer systems or devices shown in the above Figures, among other devices. For example, the method shown in FIG. 26 may be performed by a photonic quantum computing device or system 1001 and/or 1201 as illustrated in FIGS. 10 and 12, respectively. Utilization of the described method may utilize one or more sets of waveguides, one or more sets of beam splitters that couple the respective waveguides to produce a photonic state comprising a plurality of photonic qubits within the one or more sets of waveguides. The quantum computing system may further include a fusion controller (e.g., the fusion controller 1319 and/or 1419 illustrated in FIGS. 13-15) configured to direct the described method steps, and may be include (or be coupled to) a classical computing system 1003/1207 for processing classic information and directing operations of the quantum computing device. In other embodiments, the quantum computing system may utilize a general type of mode structure, rather than optical waveguides, and may further utilize more general forms of mode coupling (i.e., rather than beam splitters). Alternatively, in some embodiments the methods described in FIG. 26 may be utilized in a quantum communication network, quantum internet, or more generally in any application where it is desired to perform a projective encoded fusion measurement on two or more encoded qubits. It is to be understood this method may be used by any of a variety of types of photonic quantum computing architectures, and these other types of systems should be considered within the scope of the embodiments described herein.

Figure 27:
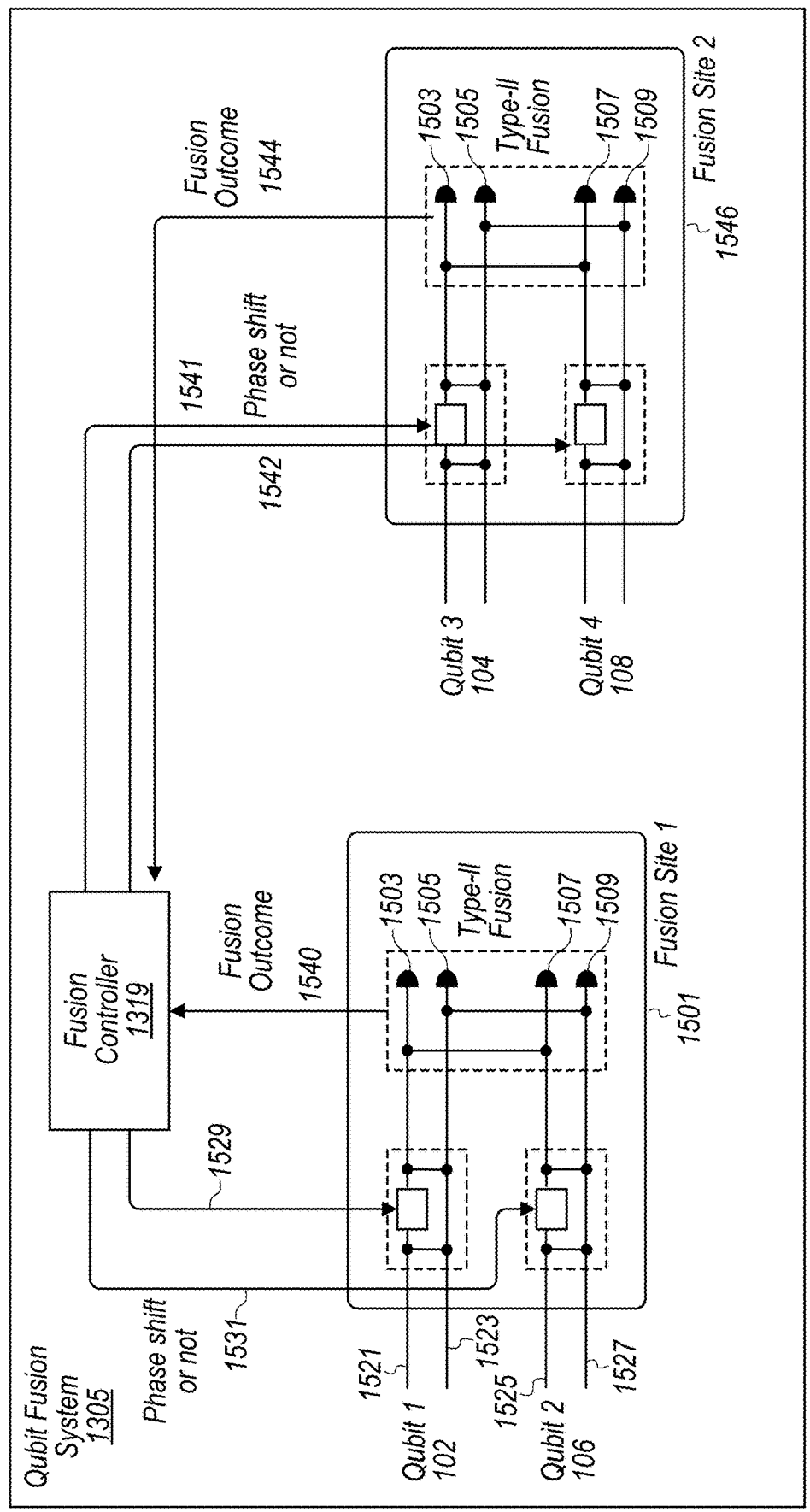
FIG. 27 is a schematic illustration of a qubit fusion system that may be used to perform method steps of some embodiments.

FIGS. 24A-B and FIG. 27 illustrate additional supporting material to help explain the methods described in association with FIG. 26. In particular, FIGS. 24A-B illustrate an example set of first and second encoded qubits that may serve as inputs to an encoded fusion measurement, and FIG. 27 is a system diagram illustrating a qubit fusion system 1305 that may be used to implement the methods described in association with FIG. 26. Reference numbers from these Figures are utilized to clarify potential relationships between the described methods and the Figures, in some embodiments. The system shown in FIG. 27 shares some components with the system shown in FIG. 15, but differs in that FIG. 27 explicitly illustrates first and second fusion sites.

In various embodiments, some of the elements of the scheme shown may be performed concurrently, in a different order than shown, or may be omitted. Additional and/or alternative elements may also be performed as desired. As shown, the method of FIG. 26 may operate as follows.

At 2602, a first fusion measurement 2414 is performed on a first physical qubit 2401 of a first encoded qubit 2410 and a second physical qubit 2405 of a second encoded qubit 2412. The first fusion measurement may be performed at a first fusion site 1501 and may be directed by the fusion controller 1319.

The first encoded qubit may include a first plurality of physical qubits including the first physical qubit, and the second encoded qubit may include a second plurality of physical qubits including the second physical qubit. The first encoded qubit and the second encoded qubit may be received from a source or multiple sources. The first fusion measurement may be a Type-II fusion measurement, or a Type-I fusion measurement. A first classical measurement result 1540 of the first fusion measurement may be obtained. The first classical measurement result may be obtained at a first fusion site 1501 and transmitted to the fusion controller 1319. The first classical measurement result may be stored in a non-transitory memory medium.

At 2604, a basis (1541, 1542) is selected for performing a second fusion measurement 2416 based at least in part on the first classical measurement result 1540. The second fusion measurement may be performed at a second fusion site 1546 and may be directed by the fusion controller 1319. The basis may be selected from a set of two orthogonal measurement bases. The selected basis may determine which of two measurement outcomes will fail in the case of a failure outcome of the fusion measurement. For example, when the failure basis is selected as $X_1X_2$ and a failure occurs, $X_1X_2$ may not be measured while $Z_1Z_2$ is successfully measured. Note that the subscripts correspond to the first and second physical qubits. Some examples of possible outcomes for several specific fusion measurements for both success and failure are illustrated in FIG. 34.

In some embodiments, selecting the basis for performing the second fusion measurement based at least in part on the first classical measurement result includes determining that, when the second fusion measurement fails in a first basis, the encoded qubit measurement result may still be determined based at least in part on the first and the second classical measurement results. In these embodiments, the first basis is selected as the basis for performing the second fusion measurement based at least in part on determining that, when the second fusion measurement fails in the first basis, the encoded qubit measurement result may still be determined based at least in part on the first and second classical measurement results.

In some embodiments, selecting the basis for performing the second fusion measurement includes determining, based on stabilizers of the first and second encoded qubits, a plurality of effective measurement results that correspond to the encoded fusion measurement result. Because of the redundancy introduced by the plurality of physical qubits of an encoded qubit, an encoded fusion measurement results may be obtained through one or multiple effective measurement results, where each effective measurement result is a combination of measurements of the individual physical qubits that is equivalent to the encoded fusion measurement result. For example, Equations 17 and 18 above show one example of the set of effective measurement results that correspond to each of two encoded fusion measurement results. In these embodiments, the selected basis may be selected such that a first effective measurement result of the plurality of effective measurement results includes the first classical measurement result and the second classical measurement result when the second fusion measurement fails in the selected basis. In other words, it may be determined that when the second fusion measurement fails in a particular basis, an effective measurement result that corresponds to the desired encoded fusion measurement result may still be determined based on the measurement that is still obtained in the case of a failure outcome.

In some embodiments, it is determined, based at least in part on the first classical measurement result, whether to employ boosting for the second fusion measurement. Determining whether to employ boosting may include determining whether the encoded fusion measurement result is determinable when the second fusion measurement fails in the selected basis, wherein it is determined not to employ boosting when the encoded fusion measurement result is determinable when the second fusion measurement fails in the selected basis. Alternatively or additionally, in some embodiments determining whether to employ boosting includes determining a photon loss rate of the second fusion measurement, determining loss probabilities for performing the second fusion measurement with and without boosting based on the photon loss rate, determining success probabilities for performing the second fusion measurement with and without boosting based on the loss probabilities and based on failure probabilities for performing the second fusion measurement with and without boosting, and determining whether to employ boosting based on a comparison of the success probabilities for performing the second fusion measurement with and without boosting.

At 2606, the second fusion measurement (1546, 2416) is performed on a third physical qubit 2402 of the first encoded qubit 2410 and a fourth physical qubit 2406 of the second encoded qubit 2412 according to the selected basis. A second classical measurement result 1544 of the second fusion measurement is obtained. The second classical measurement result may be obtained at a second fusion site 1546 and transmitted to the fusion controller 1319. The second classical measurement result may be stored in a non-transitory memory medium.

At 2608, an encoded fusion measurement result is determined of a fusion of the first encoded qubit 2410 and the second encoded qubit 2412 based at least in part on the first 1540 and second 1544 classical measurement results.

In some embodiments, one or more bases are sequentially selected for performing one or more subsequent fusion measurements on additional physical qubits from the first and second plurality of physical qubits, wherein the one or more bases are selected based at least in part on classical measurement results of previous fusion measurements. For example, each subsequent fusion measurement may be performed in a basis that is selected based on the results of one or more previous measurements. While the method steps of FIG. 26 describe only first and second fusion measurements, this represents the simplest case and typically an encoded fusion measurement result is obtained from encoded qubits that each include more than two qubits (e.g., 4, 6, 24, etc.). The one or more subsequent fusion measurements may be performed, obtaining one or more subsequent classical measurement results In these embodiments, determining the encoded fusion measurement result is performed further based at least in part on the one or more subsequent classical measurement results.

At 2610, the encoded fusion measurement result is stored in a non-transitory memory medium. The encoded fusion measurement result may be used in a fusion based quantum computing (FBQC) algorithm. For example, an output of a FBQC algorithm may be computed based at least in part on the encoded fusion measurement result, and the output may be stored in the non-transitory memory medium.

Figure 28:
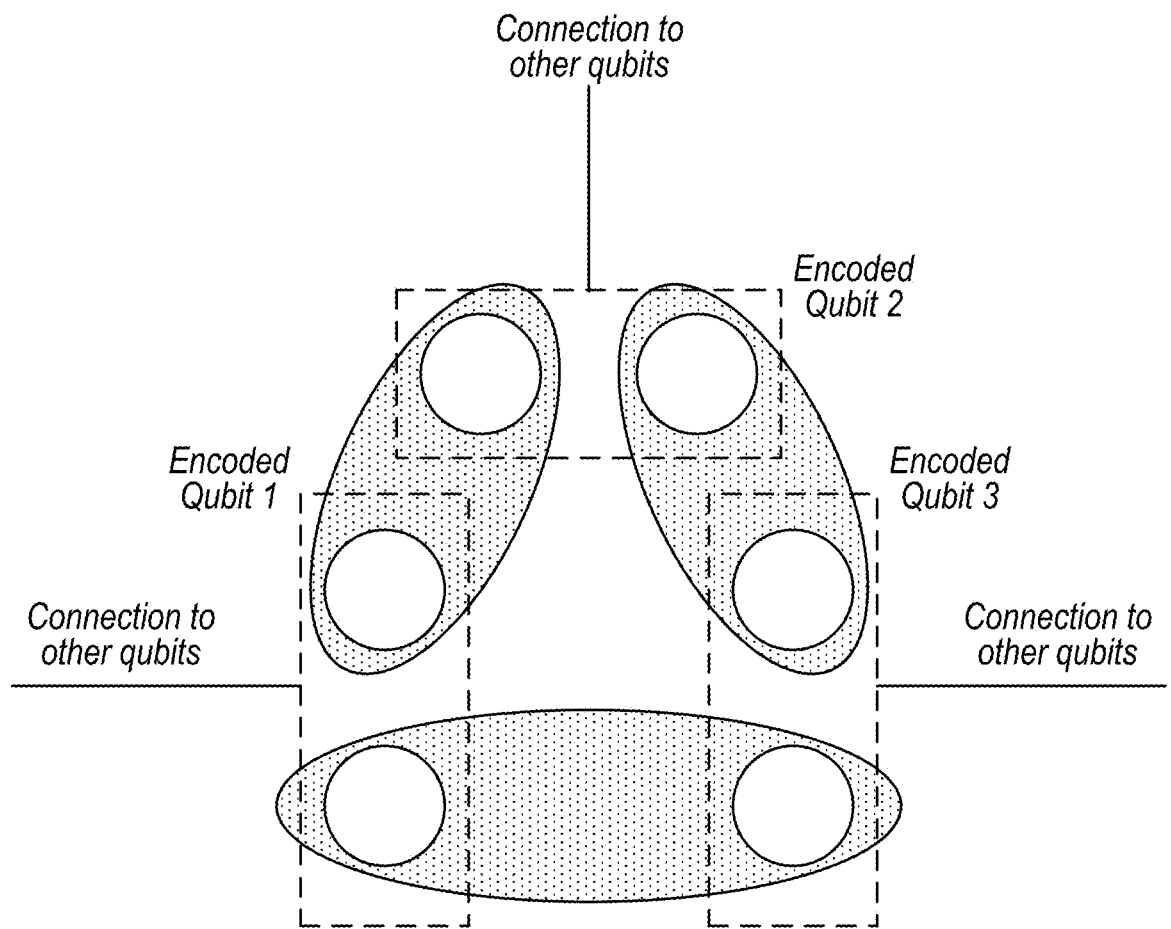
FIG. 28 illustrates a three-way encoded fusion measurement, according to some embodiments.
Figure 29:
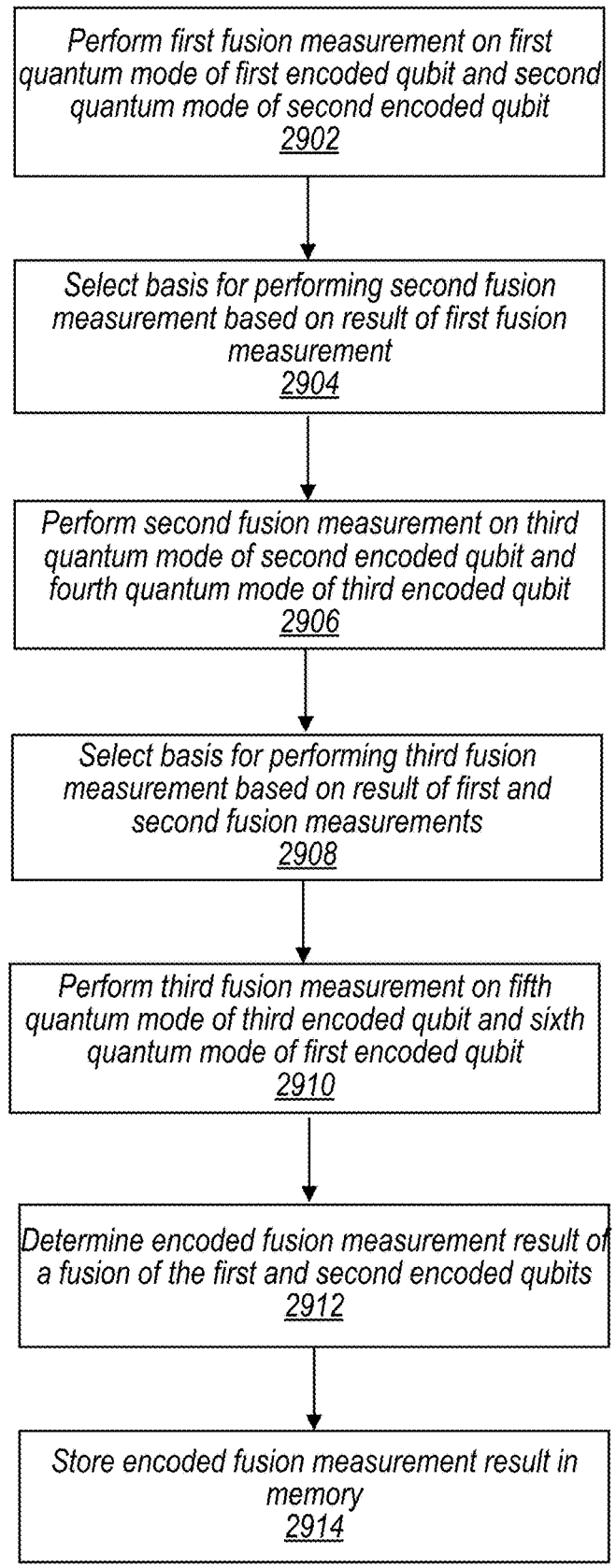
FIG. 29 is a flow chart diagram illustrating a method for performing adaptive basis selection during a three-way encoded fusion measurement, according to some embodiments.

FIGS. 28-29—Encoded 3-Way Fusion

FIG. 28 is a schematic illustration of a 3-way encoded fusion measurement, according to some embodiments. In a 3-way fusion operation, it may be desired to measure the operators $\overline{X_1X_2X_3}$, $\overline{Z_1Z_2}$ and $\overline{Z_2Z_3}$. In some embodiments, methods described herein for adaptive basis selection may be utilized in a 3-way encoded fusion measurement.

FIG. 29 is a flowchart diagram illustrating a method for performing adaptive basis selection during a 3-way encoded fusion measurement such as that illustrated in FIG. 28. The method shown in FIG. 29 and described below may incorporate one or more implementation details as described above in reference to FIG. 26, as appropriate. The method shown in FIG. 29 may be used in conjunction with any of the computer systems or devices shown in the above Figures, among other devices. For example, the method shown in FIG. 29 may be performed by a photonic quantum computing device or system 1001 and/or 1201 as illustrated in FIGS. 10 and 12, respectively. Utilization of the described method may utilize one or more sets of waveguides, one or more sets of beam splitters that couple the respective waveguides to produce a photonic state comprising a plurality of photonic qubits within the one or more sets of waveguides. The quantum computing system may further include a fusion controller (e.g., the fusion controller 1319 and/or 1419 illustrated in FIGS. 13-15) configured to direct the described method steps, and may be include (or be coupled to) a classical computing system 1003/1207 for processing classic information and directing operations of the quantum computing device. In other embodiments, the quantum computing system may utilize a general type of mode structure, rather than optical waveguides, and may further utilize more general forms of mode coupling (i.e., rather than beam splitters). It is to be understood this method may be used by any of a variety of types of photonic quantum computing architectures, and these other types of systems should be considered within the scope of the embodiments described herein.

In various embodiments, some of the elements of the scheme shown may be performed concurrently, in a different order than shown, or may be omitted. Additional and/or alternative elements may also be performed as desired. As shown, the method of FIG. 29 may operate as follows.

At 2902, a first fusion measurement is performed on a first physical qubit of a first encoded qubit and a second physical qubit of a second encoded qubit. A first classical measurement result is obtained of the first fusion measurement.

At 2904, a first basis is selected for performing a second fusion measurement based at least in part on the first classical measurement result.

At 2906, the second fusion measurement is performed on a third physical qubit of the second encoded qubit and a fourth physical qubit of a third encoded qubit according to the first basis. A second classical measurement result of the second fusion measurement is obtained.

At 2908, a second basis is selected for performing a third fusion measurement based at least in part on the first and second classical measurement results.

At 2910, the third fusion measurement is performed on a fifth physical qubit of the third encoded qubit and a sixth physical qubit of the first encoded qubit according to the second basis. A third classical measurement result of the third fusion measurement is obtained.

At 2912, an encoded fusion measurement result is determined of a fusion of the first, second and third encoded qubits based at least in part on the first, second and third classical measurement results.

At 2914, the encoded fusion measurement result is stored in a non-transitory memory medium.

APPENDIX—EXAMPLES OF FUSION GATES

The following paragraphs describe additional detail and examples of implementations of fusion gates (and/or fusion circuits) for photonic qubits that may be used according to some embodiments that utilize Type II fusion measurements. For example, the gates and circuits illustrated herein may be utilized to implement adaptive basis selection to generate an error-corrected logical qubit for fusion-based quantum computing, in some embodiments. It should be understood that these examples are illustrative and not limiting.

A Type II fusion circuit (or gate), in the polarization encoding, may take two input modes, mix them at a polarization beam splitter (PBS), and then rotate each of them by 45° before measuring them in the computational basis. FIG. 30 shows an example. In the path encoding, a Type II fusion circuit takes four modes, swaps the second and fourth, applies a 50:50 beam-splitter between the two pairs of adjacent modes and then detects them all. FIG. 31 shows an example.

Fusion gates may be used in the construction of larger entangled states by making use of the so-called "redundant encoding" of qubits. This may consist in a single qubit being represented by multiple photons, i.e.:

$$\alpha|0\rangle + \beta|1\rangle \rightarrow \alpha|0\rangle^{\otimes n} + \beta|0\rangle^{\otimes n},$$

so that the logical qubit is encoded in n individual qubits. This may be achieved by measuring adjacent qubits in the X basis.

This encoding, denoted graphically as n qubits with no edges between them, has the advantage that a Pauli measurement on the redundant qubits does not split the cluster, but rather removes the photon measured from the redundant encoding and combines the adjacent qubits into one single qubit that inherits the bonds of the input qubits (potentially adding a phase). In addition, another advantage of this type of fusion is that it is loss tolerant. Both modes are measured, so there is no way to obtain the detection patterns that herald success if one of the photons is lost. Finally, Type II fusion does not require the discrimination between different photon numbers, as two detectors need to click for the heralding of successful fusion and this can only happen if the photon count at each detector is 1.

The fusion succeeds with probability 50%, when a single photon is detected at each detector in the polarization encoding. In this case, it effectively performs a Bell state measurement on the qubits that are sent through it, projecting the pair of logical qubits into a maximally entangled state. When the gate fails (as heralded by zero or two photons at one of the detectors), it performs a measurement in the computational basis on each of the photons, removing them from the redundant encoding, but not destroying the logical qubit. The effect of the fusion in the generation of the cluster is depicted in FIGS. 32A-D, where (A) shows the measurement of a qubit in the linear cluster in the X basis to join it with its neighbor into a single logical qubit at (B), and (C) and (D) show the effect that success and failure of the gate have on the structure of the cluster. It can be seen that a successful fusion allows building of two-dimensional clusters.

A correspondence may be retrieved between the detection patterns and the Kraus operators implemented by the gate on the state. In this case, since both qubits are detected, these are the projectors:

$$h_1 h_2, v_1 v_2 \rightarrow \frac{h_1 h_2 + v_1 v_2}{\sqrt{2}}$$

$$h_1 v_2, v_1 h_2 \rightarrow \frac{h_1 h_2 - v_1 v_2}{\sqrt{2}}$$

$$h_1^2, v_1^2 \rightarrow \pm h_1 v_2$$

$$h_2^2, v_2^2 \rightarrow \pm v_1 h_2,$$

where the first two lines correspond to 'success' outcomes, projecting the two qubits into a Bell state, and the bottom two to 'failure' outcomes, in which case the two qubits are projected into a product state. A third outcome, 'loss', would result if either qubit escapes.

In some embodiments, the success probability of Type II fusion can be increased by utilizing a process called "boosting", whereby ancillary Bell pairs or pairs of single photons are used. Employing a single ancilla Bell pair or two pairs of single photons may boost the success probability to 75%. As described in greater detail above, adaptive boosting may be employed to adaptively determine when to apply boosting for a fusion measurement, based on results of previous fusion measurements.

One technique used to boost the fusion gate comes from the realization that, when the fusion gate succeeds, it is equivalent to a Bell state measurement on the input qubits. Therefore, increasing the success probability of the fusion gate corresponds to increasing that of the Bell state measurement it implements. Two different techniques to improve the probability of discriminating Bell states have been developed by Grice (using a Bell pair) and Ewert & van Loock (using single photons).

The former showed that an ancillary Bell pair allows achieving a success probability of 75%, and the procedure may be iterated, using increasingly complex interferometers and larger entangled states, to reach arbitrary success probability (in theory). However, the complexity of the circuit and the size of the entangled states necessary may make this impractical, in some implementations.

The second technique makes use of four single photons, input in two modes in pairs with opposite polarization, to boost the probability of success to 75%. It has also been shown numerically that the procedure may be iterated a second time to obtain a probability of 78.125%, but it has not been shown whether this scheme is iterable to increase the success rate arbitrarily.

Figure 33:
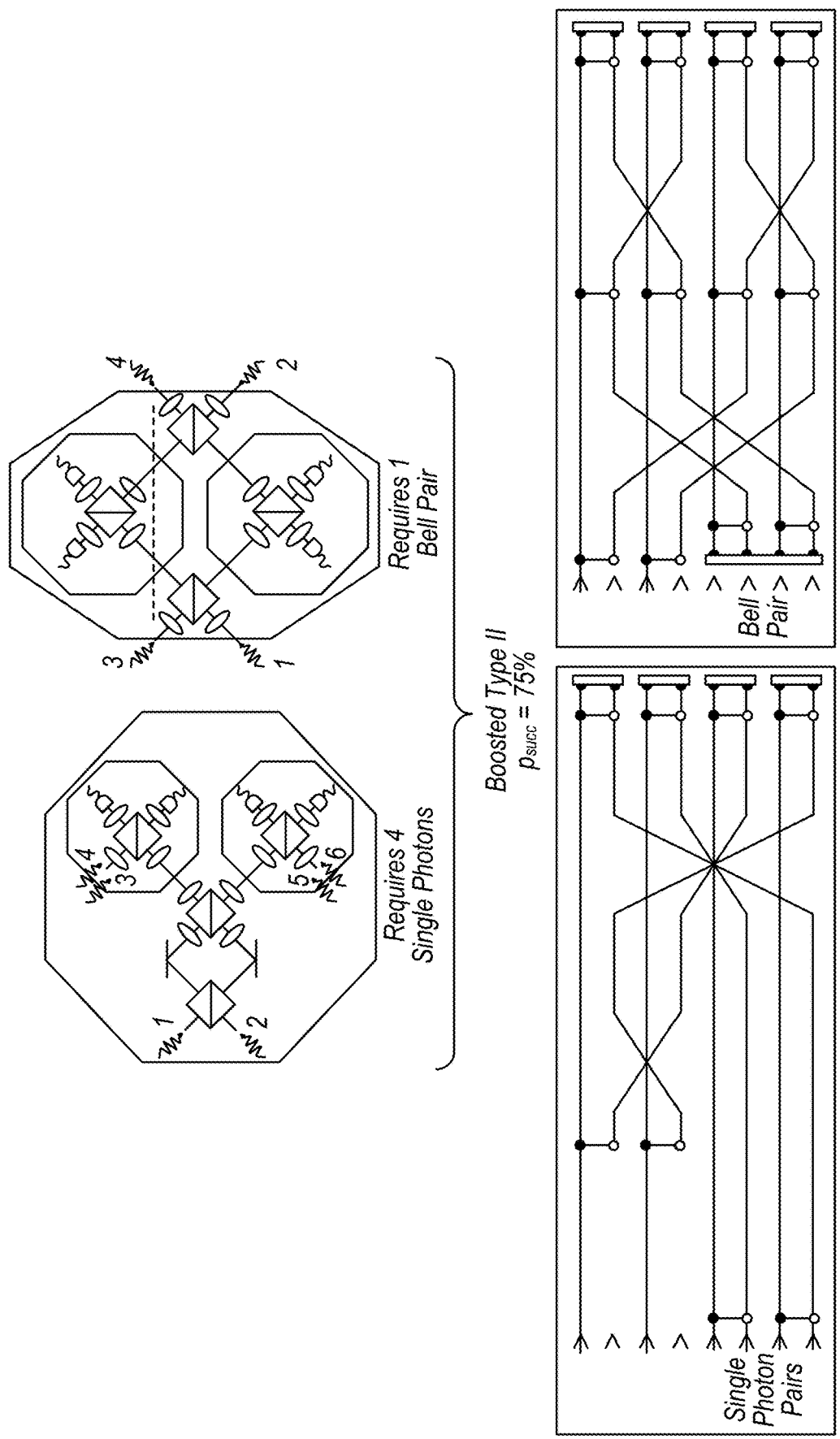
FIG. 33 shows examples of Type II fusion gates boosted once in polarization and path encodings, according to some embodiments.

FIG. 33 shows the Type II fusion gate boosted once using these two techniques, both in polarization and path encoding. The success probability of both circuits is 75%. The detection patterns that herald success of the fusion measurement are described below for the two types of circuit.

When a Bell state is used to boost the fusion, the logic behind the 'success' detection patterns is best understood by considering the detectors in two pairs: the group corresponding to the input photon modes (modes 1 and 2 in polarization and the top 4 modes in path-encoding) and that corresponding to the Bell pair input modes (modes 3 and 4 in polarization and the bottom 4 modes in path-encoding). These may be referred to as the 'main' and 'ancilla' pairs, respectively. In these embodiments, a successful fusion is heralded whenever: (a) 4 photons are detected in total; and (b) fewer than 4 photons are detected in each group of detectors.

When 4 single photons are used as ancillary resources, success of the gate is heralded whenever: (a) 6 photons are detected overall; and (b) fewer than 4 photons are detected at each detector.

When the gates succeed, the two input qubits are projected onto one of the four Bell pairs, as these may be all discriminated from each other thanks to the use of the ancillary resources. The specific projection depends on the detection pattern obtained, as before.

Both of the boosted Type II fusion circuits, designed to take one Bell pair and four single photons as ancillae, respectively, may be used to perform Type II fusion with variable success probabilities if the ancillae are not present or if only some of them are present (e.g., in the case of the four single photon ancillae). This may be useful because it allows the employment of the same circuits to perform fusion in a flexible way, depending on the resources available. If the ancillae are present, they may be input in the gates to boost the probability of success of the fusion. If they are not, the gates may still be used to perform fusion with a lower but non-zero success probability.

As far as the fusion gate boosted using one Bell pair is concerned, a case to be considered is that of the ancilla being absent. In this case, the logic of the detection patterns heralding success may be understood by considering the detectors in the pairs described above again. The fusion is still successful when: (a) 2 photons are detected at different detectors; and (b) 1 photon is detected in the 'principal' pair and 1 photon is detected in the 'ancilla' pair of detectors.

In the case of the circuit boosted using four single photons, multiple modifications may be possible, removing all or part of the ancillae. This is analogous to the boosted Bell State Generator (BSG), which is based on the same principle.

First consider the case of no ancillae being present at all. As expected, the fusion is successful with probability 50%, which is the success rate of the non-boosted fusion. In this case, the fusion is successful whenever 2 photons are detected at any two distinct detectors.

As for the boosted BSG, the presence of an odd number of ancillae turns out to be detrimental to the success probability of the gate: if 1 photon is present, the gate only succeeds 32.5% of the time, whereas if 3 photons are present, the success probability is 50%, like the non-boosted case.

If only two of the four ancillae are present, two effects are possible. If they are input in different modes in the polarization encoding, i.e. different adjacent pairs of ancillary modes in the path encoding, the probability of success is lowered to 25%. However, if the two ancillae are input in the same polarization mode, i.e. in the same pair of adjacent modes in the path encoding, the success probability is boosted up to 62.5%. In this case, the patterns that herald success may be understood again by grouping the detectors in two pairs: the pair in the branch of the circuit where the ancillae are input (group 1) and the pair in the other branch (group 2). This distinction is particularly clear in the polarization-encoded diagram. Considering these groups, the fusion if successful when: (a) 4 photons are detected overall; (b) fewer than 4 photons are detected at each detector in group 1; and (c) fewer than 2 photons are detected at each detector in group 2.

In these examples, the fusion gates work by projecting the input qubits into a maximally entangled state when successful. The basis the state is encoded in may be changed by introducing local rotations of the input qubits before they enter the gate, i.e. before they are mixed at the PBS in the polarization encoding. Changing the polarization rotation of the photons before they interfere at the PBS yields different subspaces onto which the state of the photons is projected, resulting in different fusion operations on the cluster states. In the path encoding, this corresponds to applying local beam-splitters or combinations of beam-splitters and phase shifts corresponding to the desired rotation between the pairs of modes that constitute a qubit (e.g., neighboring pairs in FIGS. 31 and 33). This may be useful to implement different types of cluster operations, both in the success and the failure cases, which may improve efficiency of construction of a large cluster state from small entangled states.

FIG. 34 is a table illustrating the effects of several rotated variations of the Type II fusion gate used to fuse two small entangled states. The diagram of the gate in the polarization encoding, the effective projection performed, and the final effect on the cluster state are shown.

Figure 35:
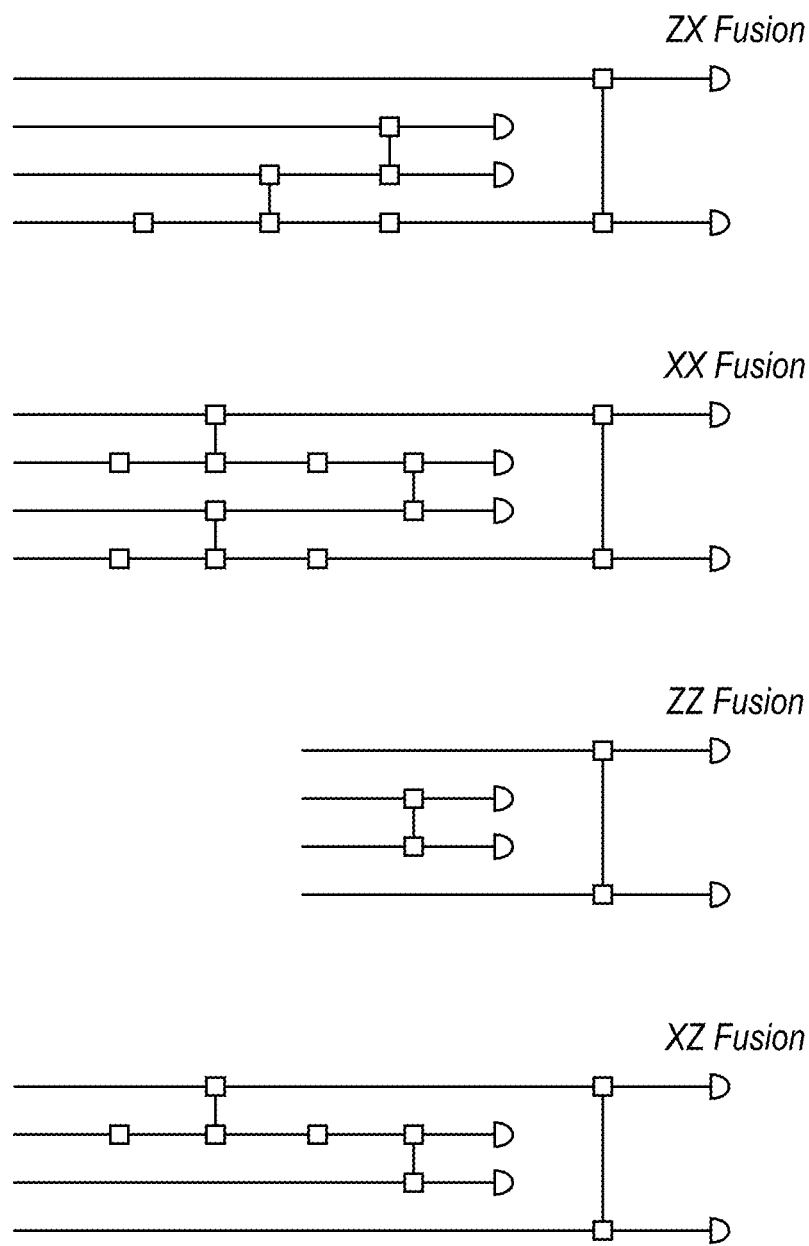
FIG. 35 shows examples of Type II fusion gate implementations for a path encoding, according to some embodiments.

Rotation to different basis states is further illustrated in FIG. 35, which shows examples of Type II fusion gate implementations for a path encoding. Shown are fusion gates for ZX fusion, XX fusion, ZZ fusion, and XZ fusion. In each instance a combination of beam splitters and phase shifters (e.g., as described above) may be used, according to various embodiments.

Encoded 6-Ring Entangled Resource State

Figure 36A:
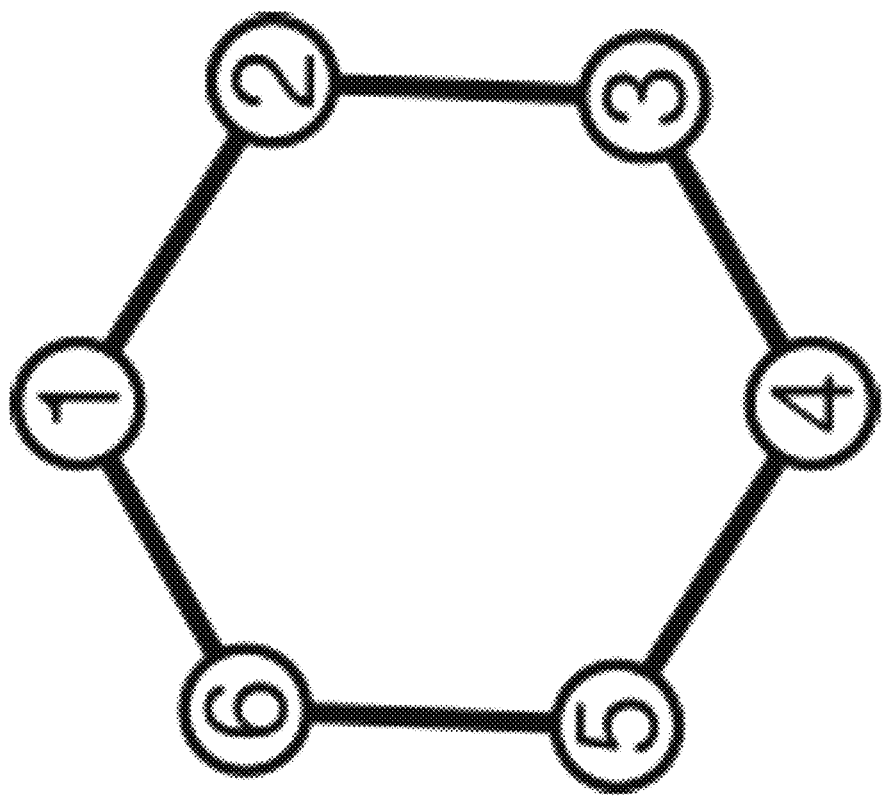
FIG. 36A is a diagram illustrating a 6-qubit ring resource state, according to some embodiments.
Figure 36B:
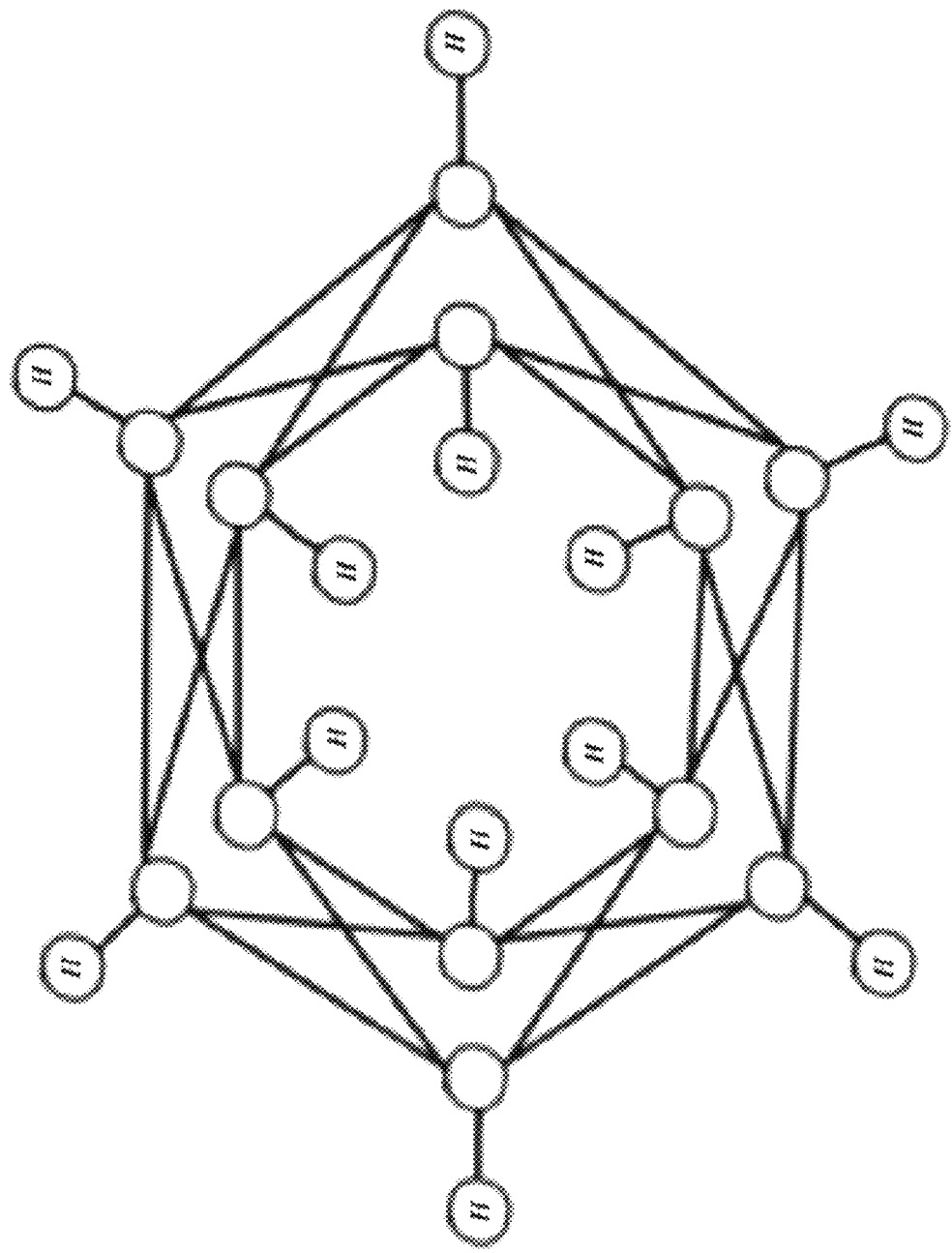
FIG. 36B is a diagram illustrated a 24 qubit encoded qubit resource state corresponding to the 6-qubit ring resource state of FIG. 36A.

The following paragraphs describe a specific example of a 6-ring graph state that may be implemented as encoded qubits, according to some embodiments. FIG. 36A is an illustration of the 6-ring graph state, which includes 6 numbered qubits. It may be shown that the illustrated 6-ring graph state has six stabilizer measurements, which are $X_1Z_2Z_6, Z_1X_2Z_3, Z_2X_3Z_4, Z_3X_4Z_5, Z_4X_5Z_6$, and $Z_5X_6Z_1$. In general, a graph state with nodes i and j has stabilizers that may be derived as $X_i\Pi_{j \in \partial i} Z_j$, where $\partial i$ is the set of nodes adjacent to i on the graph. In practice, it may be desirable to implement a resource state that is more resilient to photon loss and fusion failure than the 6-ring illustrated in FIG. 36A. In some embodiments, each of the 6 qubits of FIG. 36A may be encoded by a set of 4 physical qubits in an error correcting code, resulting in a 24 encoded qubit resource state as shown in FIG. 36B. As illustrated, each of the 6 encoded qubits of FIG. 36B is encoded as 2 pairs of entangled physical qubits, resulting in 24 total physical qubits. Each of the encoded qubits is similar to the encoded qubits illustrated in FIG. 24B. The solid lines that connect physical qubits in FIG. 36B indicate entanglement between qubits. The qubits marked with an "H" have a Hadamard gate applied to them.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that, although the terms first, second, etc., are, in some instances, used herein to describe various elements, these elements should not be limited by these terms. These terms are only used to distinguish one element from another. For example, a first switch could be termed a second switch, and, similarly, a second switch could be termed a first switch, without departing from the scope of the various described embodiments. The first switch and the second switch are both switches, but they are not the same switch unless explicitly stated as such.

As used herein, the term "if" is, optionally, construed to mean "when" or "upon" or "in response to determining" or "in response to detecting" or "in accordance with a determination that," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method for performing quantum computing, the method comprising:
   performing a first fusion measurement on a first physical qubit of a first encoded qubit and a second physical qubit of a second encoded qubit;
   obtaining a first classical measurement result of the first fusion measurement;
   selecting a basis for performing a second fusion measurement based at least in part on the first classical measurement result, wherein the selected basis determines a failure basis for the second fusion measurement based at least in part on whether the first classical measurement result comprises a success, failure or loss outcome;
   performing the second fusion measurement on a third physical qubit of the first encoded qubit and a fourth physical qubit of the second encoded qubit according to the selected basis;
   obtaining a second classical measurement result of the second fusion measurement;
   determining an encoded fusion measurement result of a fusion of the first encoded qubit and the second encoded qubit based at least in part on the first and second classical measurement results; and
   storing the encoded fusion measurement result in a non-transitory memory medium, wherein selecting the basis for performing the second fusion measurement based at least in part on the first classical measurement result comprises:
      determining that, when the second fusion measurement fails in a first basis, the encoded qubit measurement result may still be determined based at least in part on the first and the second classical measurement results; and
      selecting the first basis as the selected basis for performing the second fusion measurement based at least in part on determining that, when the second fusion measurement fails in the first basis, the encoded qubit measurement result may still be determined based at least in part on the first and second classical measurement results.

2. The method of claim 1,
   wherein selecting the basis for performing the second fusion measurement comprises:
      determining, based on stabilizers of the first and second encoded qubits, a plurality of effective measurement results that correspond to the encoded fusion measurement result;
      determining that a first effective measurement result of the plurality of effective measurement results comprises the first classical measurement result and the second classical measurement result when the second fusion measurement fails in the selected basis.

3. The method of claim 1, the method further comprising:
   determining, based at least in part on the first classical measurement result, whether to employ boosting for the second fusion measurement.

4. The method of claim 3,
wherein determining whether to employ boosting comprises:
  determining whether the encoded fusion measurement result is determinable when the second fusion measurement fails in the selected basis, wherein it is determined not to employ boosting when the encoded fusion measurement result is determinable when the second fusion measurement fails in the selected basis.

5. The method of claim 3,
wherein determining whether to employ boosting comprises:
  determining a photon loss rate of the second fusion measurement;
  determining loss probabilities for performing the second fusion measurement with and without boosting based on the photon loss rate;
  determining success probabilities for performing the second fusion measurement with and without boosting based on the loss probabilities and based on failure probabilities for performing the second fusion measurement with and without boosting; and
  determining whether to employ boosting based on a comparison of the success probabilities for performing the second fusion measurement with and without boosting.

6. The method of claim 1,
wherein selecting the basis for performing the second fusion measurement comprises determining whether to apply a Hadamard gate at a fusion site while performing the second fusion measurement.

7. The method of claim 1, the method further comprising:
computing an output of a quantum computational algorithm based at least in part on the encoded fusion measurement result; and
storing the output in the non-transitory memory medium.

8. A system, comprising:
a non-transitory computer-readable memory medium;
a first encoded qubit comprising a first plurality of physical qubits;
a second encoded qubit comprising a second plurality of physical qubits;
a fusion controller; and
a plurality of fusion sites coupled to the fusion controller,
wherein the system is configured to:
  perform a first fusion measurement at a first fusion site of the plurality of fusion sites on a first physical qubit of the first plurality of physical qubits and a second physical qubit of the second plurality of physical qubits;
  obtain a first classical measurement result of the first fusion measurement;
  select a basis for performing a second fusion measurement based at least in part on the first classical measurement result, wherein the selected basis determines a failure basis for the second fusion measurement based at least in part on whether the first classical measurement result comprises a success, failure or loss outcome;
  perform the second fusion measurement at a second fusion site of the plurality of fusion sites on a third physical qubit of the first plurality of physical qubits and a fourth physical qubit of the second plurality of physical qubits according to the selected basis;
  obtain a second classical measurement result of the second fusion measurement;
  determine an encoded fusion measurement result of a fusion of the first encoded qubit and the second encoded qubit based at least in part on the first and second classical measurement results; and
  store the encoded fusion measurement result in a non-transitory memory medium,
wherein, in selecting the basis for performing the second fusion measurement based at least in part on the first classical measurement result, the system is further configured to:
  determine that, when the second fusion measurement fails in a first basis, the encoded qubit measurement result may still be determined based at least in part on the first and the second classical measurement results; and
  select the first basis as the selected basis for performing the second fusion measurement based at least in part on determining that, when the second fusion measurement fails in the first basis, the encoded qubit measurement result may still be determined based at least in part on the first and second classical measurement results.

9. The system of claim 8, wherein the system is further configured to:
  select one or more bases for performing one or more subsequent fusion measurements on physical qubits from the first and second plurality of physical qubits, wherein the one or more bases are selected based at least in part on classical measurement results of previous fusion measurements;
  perform the one or more subsequent fusion measurements; and
  obtain one or more subsequent classical measurement results,
wherein determining the encoded fusion measurement result is performed further based at least in part on the one or more subsequent classical measurement results.

10. The system of claim 8,
wherein, in selecting the basis for performing the second fusion measurement based at least in part on the first classical measurement result, the system is further configured to:
  determine, based on stabilizers of the first and second encoded qubits, a plurality of effective measurement results that correspond to the encoded fusion measurement result;
  determine that a first effective measurement result of the plurality of effective measurement results comprises the first classical measurement result and the second classical measurement result when the second fusion measurement fails in the selected basis.

11. The system of claim 8, wherein the system is further configured to:
  determine whether the encoded fusion measurement result is determinable when the second fusion measurement fails in the selected basis;
  employ boosting for the second fusion measurement when the encoded fusion measurement result is not determinable when the second fusion measurement fails in the selected basis; and
  refrain from employing boosting for the second fusion measurement when the encoded fusion measurement result is determinable when the second fusion measurement fails in the selected basis.

12. The system of claim 8,
wherein selecting the basis for performing the second fusion measurement comprises determining whether to apply a Hadamard gate at the second fusion site while performing the second fusion measurement.

13. The system of claim 8, wherein the system is further configured to:
compute an output of a quantum computational algorithm based at least in part on the encoded fusion measurement result; and
store the output in the non-transitory computer-readable memory medium.

14. The system of claim 8, wherein the system is further configured to:
determine, based at least in part on the first classical measurement result, whether to employ boosting for the second fusion measurement, wherein in determining whether to employ boosting, the system is configured to:
determine a photon loss rate of the second fusion measurement;
determine loss probabilities for performing the second fusion measurement with and without boosting based on the photon loss rate;
determine success probabilities for performing the second fusion measurement with and without boosting based on the loss probabilities and based on failure probabilities for performing the second fusion measurement with and without boosting; and
determine whether to employ boosting based on a comparison of the success probabilities for performing the second fusion measurement with and without boosting.

15. A non-transitory computer-readable memory medium storing program instructions which, when executed by a processor, cause a fusion controller to:
perform a first fusion measurement on a first physical qubit of a first encoded qubit and a second physical qubit of a second encoded qubit;
obtain a first classical measurement result of the first fusion measurement;
select a first basis for performing a second fusion measurement based at least in part on the first classical measurement result, wherein the selected basis determines a failure basis for the second fusion measurement based at least in part on whether the first classical measurement result comprises a success, failure or loss outcome;
perform the second fusion measurement on a third physical qubit of the second encoded qubit and a fourth physical qubit of a third encoded qubit according to the first basis;
obtain a second classical measurement result of the second fusion measurement;
select a second basis for performing a third fusion measurement based at least in part on the first and second classical measurement results;
perform the third fusion measurement on a fifth physical qubit of the third encoded qubit and a sixth physical qubit of the first encoded qubit according to the second basis;
obtain a third classical measurement result of the third fusion measurement;
determine an encoded fusion measurement result of a fusion of the first, second and third encoded qubits based at least in part on the first, second and third classical measurement results; and
store the encoded fusion measurement result in the non-transitory computer-readable memory medium, wherein, in selecting the first basis for performing the second fusion measurement based at least in part on the first classical measurement result, the program instructions are further executable to cause the fusion controller to:
determine that, when the second fusion measurement fails in the first basis, the encoded qubit measurement result may still be determined based at least in part on the first and the second classical measurement results.

16. The non-transitory computer-readable memory medium of claim 15,
wherein, in selecting the second basis for performing the third fusion measurement based at least in part on the first and second classical measurement results, the program instructions are further executable to cause the fusion controller to:
determine that, when the third fusion measurement fails in the second basis, the encoded qubit measurement result may still be determined based at least in part on the first, second and third classical measurement results.

17. The non-transitory computer-readable memory medium of claim 15, wherein the program instructions are further executable to cause the fusion controller to:
determine whether the encoded fusion measurement result is determinable when the second fusion measurement fails in the first basis;
employ boosting for the second fusion measurement when the encoded fusion measurement result is not determinable when the second fusion measurement fails in the first basis; and
refrain from employing boosting for the second fusion measurement when the encoded fusion measurement result is determinable when the second fusion measurement fails in the first basis.

18. The non-transitory computer-readable memory medium of claim 15,
wherein selecting the first basis for performing the second fusion measurement comprises determining whether to apply a first Hadamard gate while performing the second fusion measurement, and
wherein selecting the second basis for performing the third fusion measurement comprises determining whether to apply a second Hadamard gate while performing the third fusion measurement.

19. The non-transitory computer-readable memory medium of claim 15, wherein the program instructions are further executable to cause the fusion controller to:
compute an output of a quantum computational algorithm based at least in part on the encoded fusion measurement result; and
store the output in the non-transitory computer-readable memory medium.

20. The non-transitory computer-readable memory medium of claim 15, wherein the program instructions are further executable to cause the fusion controller to:
determine, based at least in part on the first classical measurement result, whether to employ boosting for the second fusion measurement, wherein in determining whether to employ boosting, the program instructions are further executable to cause the fusion controller to:
determine a photon loss rate of the second fusion measurement;

determine loss probabilities for performing the second fusion measurement with and without boosting based on the photon loss rate;

determine success probabilities for performing the second fusion measurement with and without boosting based on the loss probabilities and based on failure probabilities for performing the second fusion measurement with and without boosting; and determine whether to employ boosting based on a comparison of the success probabilities for performing the second fusion measurement with and without boosting.

\* \* \* \* \*